United States Patent
Choi et al.

(10) Patent No.: US 7,928,785 B2
(45) Date of Patent: Apr. 19, 2011

(54) LOOP FILTER, PHASE-LOCKED LOOP, AND METHOD OF OPERATING THE LOOP FILTER

(75) Inventors: Young-don Choi, Seoul (KR); Hoon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 83 days.

(21) Appl. No.: 12/267,116

(22) Filed: Nov. 7, 2008

(65) Prior Publication Data
US 2009/0115473 A1 May 7, 2009

(30) Foreign Application Priority Data

Nov. 7, 2007 (KR) .................. 10-2007-0113184
Nov. 7, 2007 (KR) .................. 10-2007-0113185
Nov. 7, 2007 (KR) .................. 10-2007-0113186
Nov. 7, 2007 (KR) .................. 10-2007-0113187

(51) Int. Cl.
H03K 3/017 (2006.01)
H03K 5/04 (2006.01)
H03K 7/08 (2006.01)

(52) U.S. Cl. ........ 327/175; 327/156; 327/158; 327/161; 327/172

(58) Field of Classification Search .................. 327/156, 327/157, 161, 175
See application file for complete search history.

(56) References Cited

U.S. PATENT DOCUMENTS

| 5,675,291 | A | 10/1997 | Sudjian |
| 6,420,917 | B1* | 7/2002 | Klemmer ............... 327/156 |
| 6,433,596 | B1 | 8/2002 | Bossard |
| 6,504,437 | B1 | 1/2003 | Nelson et al. |

FOREIGN PATENT DOCUMENTS

| JP | 10-107622 | | 4/1998 |
| JP | 2002-050962 | A | 2/2002 |
| JP | 2006-129399 | A | 5/2006 |
| KR | 10-2000-0041072 | A | 7/2000 |
| KR | 10-2001-0111155 | A | 12/2001 |
| KR | 10-2002-0066925 | A | 8/2002 |
| KR | 10-2005-0007821 | A | 1/2005 |
| KR | 10-2006-0093540 | A | 8/2006 |

* cited by examiner

*Primary Examiner* — Lincoln Donovan
*Assistant Examiner* — John W Poos
(74) *Attorney, Agent, or Firm* — Myers Bigel Sibley & Sajovec

(57) ABSTRACT

A loop filter capable of controlling a charge sharing point in time, a phase locked loop, and a method of operating the loop filter are provided. The loop filter includes a duty control unit and a variable capacitor unit. The duty control unit generates a duty control clock signal of which an activation section is shorter than an inactivation section, by controlling a duty of an input clock signal. The variable capacitor unit is charged by an input current and has a capacitance that varies according to the duty control clock signal. The variable capacitor unit may include a switch, a first capacitor, and a second capacitor. The switch is turned on or off in response to the duty control clock signal. The first capacitor is serially connected to the switch and charged by the input current when the switch is turned on. The second capacitor is connected in parallel to the switch and the first capacitor and charged by the input current.

14 Claims, 33 Drawing Sheets

US 7,928,785 B2

LOOP FILTER, PHASE-LOCKED LOOP, AND METHOD OF OPERATING THE LOOP FILTER

CROSS-REFERENCE TO RELATED APPLICATIONS

This application claims the benefits of Korean Patent Application No. 10-2007-0113184, filed on Nov. 7, 2007, Korean Patent Application No. 10-2007-0113185, filed on Nov. 7, 2007, Korean Patent Application No. 10-2007-0113186, filed on Nov. 7, 2007, and Korean Patent Application No. 10-2007-0113187, filed on Nov. 7, 2007, in the Korean Intellectual Property Office, the disclosures of which are incorporated herein in its entirety by reference.

BACKGROUND

The present invention relates to phase-locked loops and, more particularly, to loop filters.

When a phase locked loop (PLL) or the like generates a clock signal, ripples may be generated. These ripples may cause a reference spur. The generated clock signal may have a high frequency peak. In this case, bandwidth may be decreased.

SUMMARY

Some embodiments of the present invention provide a loop filter that may control a charge sharing time point by using a duty control clock signal of which duty cycle can be controlled.

Some embodiments of the present invention also provide a loop filter capable of reducing reference spur and a phase locked loop (PLL) including the loop filter.

Some embodiments of the present invention also provide a loop filter which randomly determines an amplitude of a control voltage.

Some embodiments of the present invention also provide a loop filter which randomly controls a charge sharing time point.

According to some embodiments of the present invention, a loop filter includes a duty control circuit configured to generate a duty control clock signal with an asymmetric duty cycle. A switch is configured to operate responsive to the duty control clock signal and a first capacitor is connected to an output of a charge pump in series with the switch. A second capacitor is connected in parallel with the switch and the first capacitor.

Further embodiments of the present invention provide a phase locked loop including a phase-frequency detector configured to compare a phase and/or a frequency of a reference clock signal with a phase and/or a frequency of a feedback clock signal and a charge pump configured to generate a charge pump current responsive to the comparison. A loop filter is configured to generate a control voltage responsive to the charge pump current and a voltage-controlled oscillator (VCO) is configured to generate the feedback clock signal responsive to the control voltage. The loop filter includes a duty control circuit generate a duty control signal responsive to the reference clock signal, a duty of the duty control signal varying responsive to a frequency of the reference clock signal and/or the feedback clock signal and a variable capacitor circuit configured to receive the charge pump current and having a capacitance that varies responsive to a duty cycle of the duty control clock signal.

BRIEF DESCRIPTION OF THE DRAWINGS

Exemplary embodiments of the present invention will be more clearly understood from the following detailed description taken in conjunction with the accompanying drawings in which.

DETAILED DESCRIPTION

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being on, connected to and/or coupled to another element, the element may be directly on, connected and/or coupled to the other element, or intervening elements may be present. In contrast, when an element is referred to as being directly on, directly connected to and/or directly coupled to another element, no intervening elements are present. As used herein, the term "and/or" includes any and all combinations of one or more of the associated listed items.

It will also be understood that, although the terms first, second, etc., may be used herein to describe various elements, components and/or portions, these elements, components and/or portions should not be limited by these terms. Rather, these terms are used merely as a convenience to distinguish one element, component and/or portion from another element, component and/or portion. For example, a first element, component and/or portion could be termed a second element, component, region, layer and/or portion without departing from the teachings of the present invention.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprise," "comprising," includes, including, "have", "having" and variants thereof specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Figure 1:
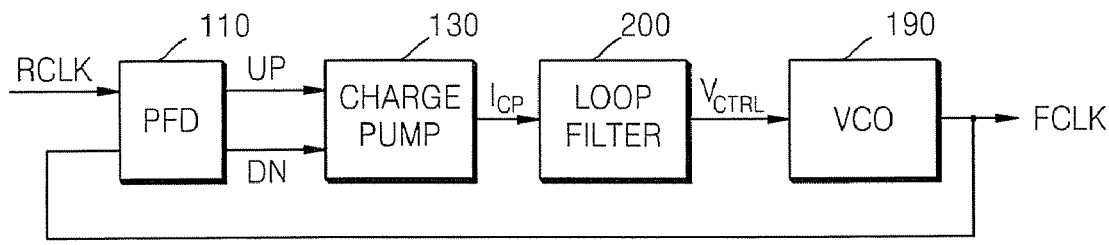
FIG. 1 is a block diagram of a phase locked loop (PLL)

FIG. 1 is a block diagram of a phase locked loop (PLL).

Referring to FIG. 1, the PLL includes a phase-frequency detector (PFD) 110, a charge pump 130, a loop filter 200, and a voltage-controlled oscillator 190.

The PFD 110 compares phases or frequencies of a reference clock signal RCLK and a feedback clock signal FCLK with each other and outputs a result of the comparison. For example, if the phase of the reference clock signal RCLK is sooner than that of the feedback clock signal FCLK, the PFD 110 may output an up signal UP. If the phase of the reference clock signal RCLK is later than that of the feedback clock signal FCLK, the PFD 110 may output a down signal DN. Alternatively, if the phase of the reference clock signal RCLK is sooner than that of the feedback clock signal FCLK, the PFD 110 may output the down signal DN. If the phase of the reference clock signal RCLK is later than that of the feedback clock signal FCLK, the PFD 110 may output the up signal UP. The charge pump 130 outputs a charge pump current $I_{CP}$ corresponding to a result of the comparison, namely, to the up or down signal UP or DN. For example, if the charge pump 130 receives the up signal UP, the charge pump 130 may provide the charge pump current $I_{CP}$ to the loop filter 200. If the charge pump 130 receives the down signal DN, the charge pump 130 may make the loop filter 200 flow out the charge pump current $I_{CP}$. The loop filter 200 changes a control voltage $V_{CTRL}$ according to the charge pump current $I_{CP}$. The voltage-controlled oscillator 190 generates the feedback clock signal FCLK corresponding to the control voltage $V_{CTRL}$. The feedback clock signal FCLK is fed back to the PFD 110. Through this process, the PLL makes the phases or frequencies of the feedback clock signal FCLK and the reference clock signal RCLK consistent with each other.

Figure 2A:
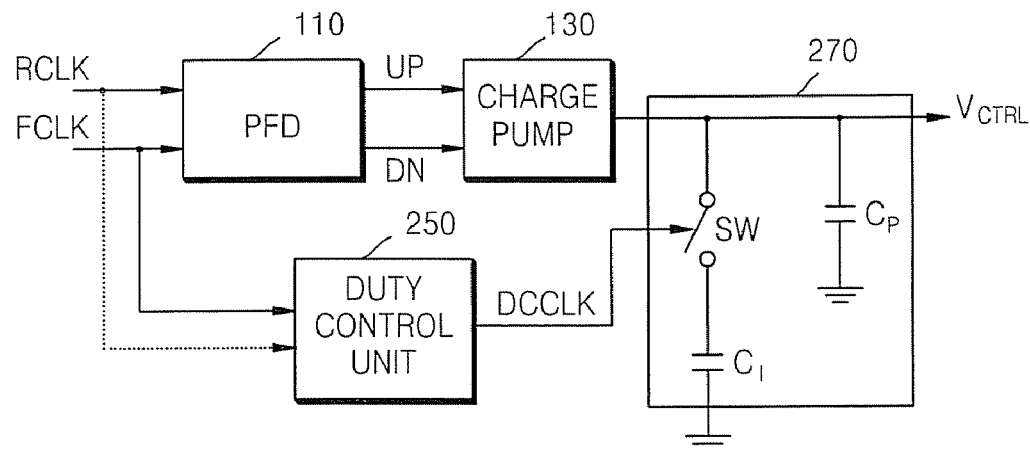
FIG. 2A illustrates a loop filter according to some embodiments of the present invention.

FIG. 2A illustrates a loop filter according to some embodiments of the present invention.

Although it will be hereinafter illustrated that the loop filter of FIG. 2A is the loop filter 200 included in the PLL of FIG. 1, the loop filter of FIG. 2A may not only be used as the loop filter 200 of FIG. 1 but also used as loop filters included in other circuits.

Referring to FIG. 2A, the loop filter includes a duty control circuit 250 and a variable capacitor circuit 270. For convenience of explanation, the PFD 110 and the charge pump 130 are also shown in FIG. 2A.

The variable capacitor circuit 270 is charged or discharged by the charge pump current $I_{CP}$. When the up signal UP is received and the charge pump current $I_{CP}$ flows from the charge pump 130 to the variable capacitor circuit 270, the variable capacitor circuit 270 is charged, and thus the amount of charge of the variable capacitor circuit 270 increases. When the down signal DN is received and the charge pump current $I_{CP}$ flows from the variable capacitor circuit 270 to the charge pump 130, the variable capacitor circuit 270 is discharged, and thus the amount of charge of the variable capacitor circuit 270 decreases.

The amount of charge filled in the variable capacitor circuit 270 during a unit time and the amount of charge released from the variable capacitor circuit 270 during the unit time are determined according to the magnitude of the charge pump current $I_{CP}$. When the magnitude of the charge pump current $I_{CP}$ increases, the amounts of charge filled in and released from the variable capacitor circuit 270 during the unit time increase. When the magnitude of the charge pump current $I_{CP}$ decreases, the amounts of charge filled in and released from the variable capacitor circuit 270 during the unit time decrease. The amounts of charge filled in and released from the variable capacitor circuit 270 during the unit time may also be determined according to the time during which the charge pump current $I_{CP}$ flows in or out of the variable capacitor circuit 270. As the time during which the charge pump current $I_{CP}$ flows in or out of the variable capacitor circuit 270 increases, the amounts of charge filled in and released from the variable capacitor circuit 270 during the unit time increase. As the time during which the charge pump current $I_{CP}$ flows in or out of the variable capacitor circuit 270 decreases, the amounts of charge filled in and released from the variable capacitor circuit 270 during the unit time decrease.

In FIG. 2A, it is illustrated that the loop filter is included in a PLL and that the variable capacitor circuit 270 receives and transmits the charge pump current $I_{CP}$ from and to the charge pump 130. However, the loop filter according to some embodiments of the present invention of FIG. 2A may be included in devices other than a PLL. In this case, the variable capacitor circuit 270 may receive and transmit current to a component other than the charge pump 130.

The control voltage $V_{CTRL}$ is determined according to the amount of charge of the variable capacitor circuit 270. When the amount of charge of the variable capacitor circuit 270 increases, the control voltage $V_{CTRL}$ increases. When the amount of charge of the variable capacitor circuit 270 decreases, the control voltage $V_{CTRL}$ decreases. As described above, the amount of charge of the variable capacitor circuit 270 varies according to whether the charge pump current $I_{CP}$ flows in or out of the variable capacitor circuit 270, the magnitude of the charge pump current $I_{CP}$, and the time during which the charge pump current $I_{CP}$ flows in or out of the variable capacitor circuit 270. Thus, the control voltage $V_{CTRL}$ also varies according to these factors. For example, when the up signal UP is received and the charge pump current $I_{CP}$ flows into the variable capacitor circuit 270, the control voltage $V_{CTRL}$ increases. When the down signal DN is received and the charge pump current $I_{CP}$ flows out of the variable capacitor circuit 270, the control voltage $V_{CTRL}$ decreases. In this way, the loop filter may control the magnitude of the control voltage $V_{CTRL}$ by controlling the amount of charge of the variable capacitor circuit 270.

Figure 2B:
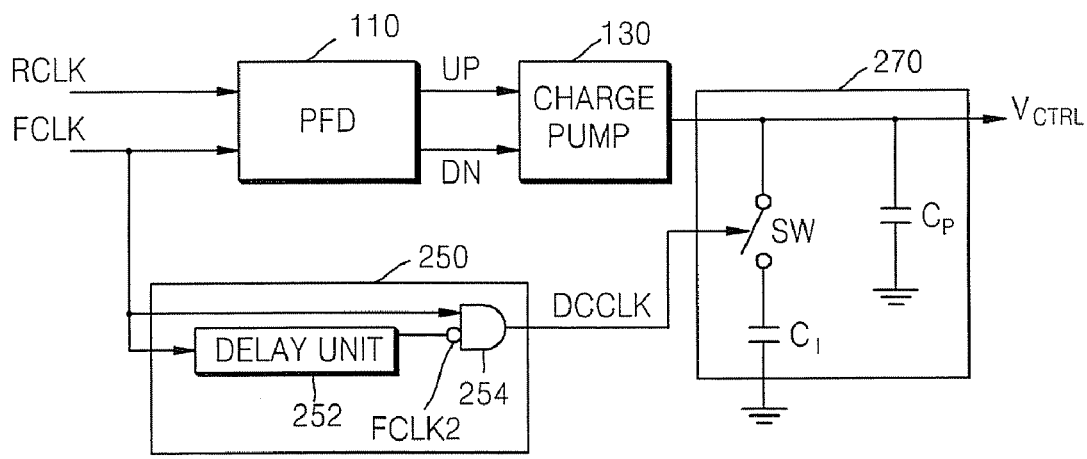
FIG. 2B illustrates a duty control circuit included in the loop filter illustrated in FIG. 2A.

In the loop filter of FIGS. 2A and 2B, the capacitance of the variable capacitor circuit 270 may vary. When the capacitance of the variable capacitor circuit 270 varies, the magnitude of a voltage applied to the variable capacitor circuit 270 varies regardless of inflow or outflow of the charge pump current $I_{CP}$ (that is, even without a variation in the amount of charge of the variable capacitor circuit 270). Since the voltage applied to the variable capacitor circuit 270 is the control voltage $V_{CTRL}$, when the capacitance of the variable capacitor circuit 270 is changed, the magnitude of the control voltage $V_{CTRL}$ is also changed. For example, when the charge pump current $I_{CP}$ neither flows in nor out of the variable capacitor circuit 270, if the capacitance of the variable capacitor circuit 270 transitions from a low level to a high level, the control voltage $V_{CTRL}$ is decreased. If the capacitance of the variable capacitor circuit 270 transitions from the high level to the low level, the control voltage $V_{CTRL}$ is increased. If the capacitance of the variable capacitor circuit 270 keeps the low level for a predetermined period of time and then transitions from the low level to the high level, the control voltage $V_{CTRL}$ keeps a high level while the capacitance of the variable capacitor circuit 270 is being in the low level. However, when the capacitance of the variable capacitor circuit 270 transitions from the low level to the high level, the high level of the control voltage $V_{CTRL}$ is decreased. This logic is also applied to a case where the capacitance of the variable capacitor circuit 270 keeps a high level and transitions from the high level to a low level. In this case, the control voltage $V_{CTRL}$ keeps a low level and is then changed from the low level to a high level.

In the loop filter of FIGS. 2A and 2B, a timing when the capacitance of the variable capacitor circuit 270 is changed may be controlled. For example, a timing when the capacitance of the variable capacitor circuit 270 in a low level transitions to a high level may be controlled. In other words, a period of time during which the capacitance of the variable capacitor circuit 270 is maintained at the low level may be controlled. If the timing when the capacitance of the variable capacitor circuit 270 transitions from the low level to the high level is delayed (that is, if the period of time during which the capacitance of the variable capacitor circuit 270 is maintained at the low level is increased), a timing when the level of the control voltage $V_{CTRL}$ is decreased is delayed. In other words, a period of time during which the level of the control voltage $V_{CTRL}$ is maintained high is increased. Accordingly, a reference spur level of the loop filter of FIGS. 2A and 2B may be decreased.

In the loop filter of FIGS. 2A and 2B, due to the control of the timing when the capacitance of the variable capacitor circuit 270 is changed, the period of time during which the capacitance of the variable capacitor circuit 270 is maintained at the low level may be controlled to be longer than the period of time during which the capacitance of the variable capacitor circuit 270 is maintained at the high level. In this case, the period of time during which the level of the control voltage $V_{CTRL}$ is maintained high is longer than the period of time during which the level of the control voltage $V_{CTRL}$ is maintained low.

In the loop filter of FIGS. 2A and 2B, due to the control of the timing when the capacitance of the variable capacitor circuit 270 is changed, the capacitance of the variable capacitor circuit 270 may be controlled to be changed after inflow or outflow of the charge pump current $I_{CP}$ is stopped. While the charge pump current $I_{CP}$ is flowing in or flowing out of the variable capacitor circuit 270, the variable capacitor circuit 270 is charged or discharged, and thus the level of the control voltage $V_{CTRL}$ changes. When the capacitance of the variable capacitor circuit 270 is changed, the level of the control voltage $V_{CTRL}$ is changed. If the capacitance of the variable capacitor circuit 270 is changed before inflow or outflow of the charge pump current $I_{CP}$ is stopped, while the variable capacitor circuit 270 is being charged or discharged, that is, while the level of the control voltage $V_{CTRL}$ is changing, the level of the control voltage $V_{CTRL}$ is affected by the change of the capacitance of the variable capacitor circuit 270. In this case, the change in the level of the control voltage $V_{CTRL}$ due to the inflow or outflow of the charge pump current $I_{CP}$ concurs with the change in the level of the control voltage $V_{CTRL}$ due to the change of the capacitance of the variable capacitor circuit 270. Thus, the inflow or outflow of the charge pump current $I_{CP}$ cannot be accurately reflected in the control voltage $V_{CTRL}$. However, in the loop filter of FIGS. 2A and 2B, since the capacitance of the variable capacitor circuit 270 may be changed after the inflow or outflow of the charge pump current $I_{CP}$ is stopped, the inflow or outflow of the charge pump current $I_{CP}$ may be accurately reflected in the control voltage $V_{CTRL}$.

A duration of inflow or outflow of the charge pump current $I_{CP}$ is typically short. Thus, in the loop filter of FIGS. 2A and 2B, the timing when the capacitance of the variable capacitor circuit 270 is changed may be fixed so that a period of time during which the charge pump current $I_{CP}$ is flowing in or flowing out of the variable capacitor circuit 270 is slightly longer than the typical duration of inflow or outflow of the charge pump current $I_{CP}$.

The duty control circuit 250 generates a duty control clock signal DCCLK having an asymmetric duty cycle, e.g., an active section of the period of the duty control signal DCCLK may be shorter than an inactive section. The duty control circuit 250 may generate the duty control clock signal DCCLK by using the feedback clock signal FCLK or the reference clock signal RCLK. More specifically, the duty control circuit 250 may control the duty cycle of the duty control clock signal DCCLK responsive to the feedback clock signal FCLK and/or the reference clock signal RCLK. In this case, a cycle of the duty control clock signal DCCLK may be the same as a cycle of the feedback clock signal FCLK (or a cycle of the reference clock signal RCLK). In other words, the duty control clock signal DCCLK may be generated from the feedback clock signal FCLK (or the reference clock signal RCLK) while keeping the cycle of the feedback clock signal FCLK (or the cycle of the reference clock signal RCLK) without changes.

The capacitance of the variable capacitor circuit 270 may vary according to a logic state of the duty control clock signal DCCLK. The capacitance of the variable capacitor circuit 270 may be high in the active section (for example, a logic HIGH section) of the duty control clock signal DCCLK. The capacitance of the variable capacitor circuit 270 may be low in the inactive section (for example, a logic LOW section) of the duty control clock signal DCCLK. In this case, although there is no inflow or outflow of the charge pump current $I_{CP}$, the control voltage $V_{CTRL}$ may be decreased in the active section of the duty control clock signal DCCLK and increased in the inactive section of the duty control clock signal DCCLK.

By controlling a timing when the logic state of the duty control clock signal DCCLK transitions, the timing when the capacitance of the variable capacitor circuit 270 is changed may be controlled, and the period of time during which the capacitance of the variable capacitor circuit 270 is maintained may be also controlled. For example, the period of time during which the capacitance of the variable capacitor circuit 270 is maintained at a low level may be controlled. Furthermore, the period of time during which the capacitance of the variable capacitor circuit 270 is maintained at a low level may be increased. The control voltage $V_{CTRL}$ has a level opposite to the level of the capacitance of the variable capacitor circuit 270. Thus, by delaying the timing when the logic state of the duty control clock signal DCCLK transitions, the period of time during which the level of the control voltage $V_{CTRL}$ is maintained high may be prolonged, and thus the reference spur level of the loop filter of FIGS. 2A and 2B may be decreased.

Although it has been described above that the capacitance of the variable capacitor circuit 270 is high in the active section of the duty control clock signal DCCLK, the capacitance of the variable capacitor circuit 270 may be low in the active section of the duty control clock signal DCCLK. Although it has been described above that the capacitance of the variable capacitor circuit 270 varies according to a logic state of the duty control clock signal DCCLK, the capacitance of the variable capacitor circuit 270 may be changed according to other factors, and the time when the variable capacitor circuit 270 is changed may also be changed according to the other factors. For example, according to an external control signal, the capacitance of the variable capacitor circuit 270 may be changed, or the timing when the capacitance of the variable capacitor circuit 270 is changed may be controlled.

The variable capacitor circuit 270 may include a switch SW, a first capacitor $C_I$, and a second capacitor $C_P$.

The switch SW is turned on or off according to the duty control clock signal DCCLK. For example, the switch SW may be turned on in the active section of the duty control clock signal DCCLK and turned off in the inactive section of the duty control clock signal DCCLK. Of course, the switch SW may be turned off in the active section of the duty control clock signal DCCLK and turned on in the inactive section of the duty control clock signal DCCLK.

According to whether the switch SW is turned on or off, an overall capacitance of the variable capacitor circuit 270 is changed. More specifically, when the switch SW is turned on, the first capacitor $C_I$ and the second capacitor $C_P$ are connected to each other in parallel. Accordingly, the overall capacitance of the variable capacitor circuit 270 is a sum of the capacitances of the first capacitor $C_I$ and the second capacitor $C_P$. When the switch SW is turned off, the first capacitor $C_I$ is connected to neither the charge pump 130 nor a node where the control voltage $V_{CTRL}$ is generated. In other words, when the switch SW is turned off, an effect where the variable capacitor circuit 270 only includes the second capacitor $C_P$ is generated. Thus, the overall capacitance of the variable capacitor circuit 270 is the same as the capacitance of the second capacitor $C_P$. In other words, when the switch SW is turned on, the overall capacitance of the variable capacitor circuit 270 is increased. When the switch SW is turned off, the overall capacitance of the variable capacitor circuit 270 is decreased.

Figure 3:
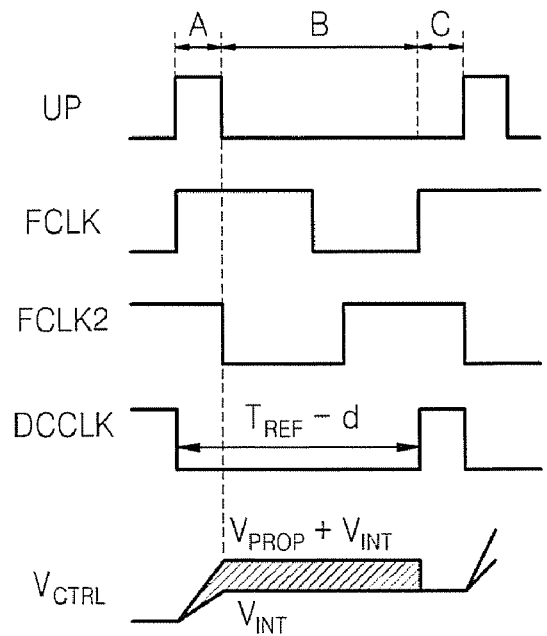
FIG. 3 is a timing diagram illustrating operations of the loop filter illustrated in FIGS. 2A and 2B.

FIG. 3 is a timing diagram illustrating operations of the loop filter illustrated in FIGS. 2A and 2B.

Referring to FIGS. 2A, 2B, and 3, a section (that is, section A) where the up signal UP is received will now be described. While the up signal UP is being received, the charge pump current $I_{CP}$ is flowed from the charge pump 130 into the loop filter of FIGS. 2A and 2B. When the logic level of the duty control clock signal DCCLK transitions to logic LOW in section A, that is, when the duty control clock signal DCCLK is inactivated, the switch SW is turned off. Thus, in section A, the second capacitor $C_P$ is charged by the charge pump current $I_{CP}$, and the first capacitor $C_I$ is not charged. Accordingly, the control voltage $V_{CTRL}$ is increased earlier than when both the first capacitor $C_I$ and the second capacitor $C_P$ are charged.

Next, a section (that is, section B) where the up signal UP is not applied and the duty control clock signal DCCLK remains logic LOW will be described. In section B, the charge pump 130 does not supply the charge pump current $I_{CP}$ to the loop filter of FIGS. 2A and 2B. The duty control clock signal DCCLK is still logic LOW, that is, is still inactivated, and thus the switch SW remains in the off state. Thus, neither the first capacitor $C_I$ nor the second capacitor $C_P$ are charged. Accordingly, the level of the control voltage $V_{CTRL}$ is maintained. FIG. 3 illustrates an example where the control voltage $V_{CTRL}$ remains at a voltage level of $V_{PROP}+V_{INT}$.

Next, a section (that is, section C) after the time when the duty control clock signal DCCLK transitions from logic LOW to logic HIGH will be described. In section C, the up signal UP is not applied, and thus the state where the charge pump 130 does not supply the charge pump current $I_{CP}$ to the loop filter of FIGS. 2A and 2B is maintained. At the starting point of section C, the duty control clock signal DCCLK transitions from logic LOW to logic HIGH, and thus the switch SW is turned on at the starting point of section C. Thus, the first capacitor $C_I$ and the second capacitor $C_P$ are connected in parallel to the node where the control voltage $V_{CTRL}$ is generated. As such, when the first capacitor $C_I$ and the second capacitor $C_P$ are connected in parallel while the charge pump current $I_{CP}$ is not being supplied, some charges of the second capacitor $C_P$ are distributed to the first capacitor $C_I$. In other words, charge sharing between the first capacitor $C_I$ and the second capacitor $C_P$ occurs at the starting point of section C. In this case, the control voltage $V_{CTRL}$ is decreased. FIG. 3 illustrates an example where the level of the control voltage $V_{CTRL}$ is decreased from the level $V_{PROP}+V_{INT}$ to a level $V_{INT}$. During section C excluding the starting point, the decreased control voltage $V_{CTRL}$ is maintained without changes. FIG. 3 illustrates a case where the level of the control voltage $V_{CTRL}$ is maintained at the level $V_{INT}$.

According to this process, in the loop filter of FIGS. 2A and 2B, the amount of charge provided by the charge pump current $I_{CP}$ flowing in according to the up signal UP is maintained over the inactive section of the duty control clock signal DCCLK. A dashed portion of FIG. 3 indicates the charging that occurs over the inactive section of the duty control clock signal DCCLK. The active section of the duty control clock signal DCCLK may be shorter than the inactive section of the duty control clock signal DCCLK. In this case, a time section corresponding to the dashed portion of FIG. 3 is increased, and thus the reference spur level of the loop filter of FIGS. 2A and 2B may be decreased. In order to perform this process, the loop filter of FIGS. 2A and 2B may include only the variable capacitor circuit 270. Therefore, the loop filter of FIGS. 2A and 2B may effectively reduce the reference spur level even without having a complicate circuit structure.

Although the variable capacitor circuit 270 includes the switch SW, the first capacitor $C_I$, and the second capacitor $C_P$ in FIGS. 2A and 2B, the variable capacitor circuit 270 may have other structures. In other words, the variable capacitor circuit 270 may be configured in other ways so long as the capacitance of the variable capacitor circuit 270 can vary according to the logic state of the duty control clock signal DCCLK.

In this case, in a section where the up signal UP is received, the variable capacitor circuit 270 is charged, and thus the control voltage $V_{CTRL}$ increases. In a section where the up signal UP is not received, the charging of the variable capacitor circuit 270 is stopped, and thus the level of the control voltage $V_{CTRL}$ is maintained without changes. When the duty control clock signal DCCLK transitions from logic LOW to logic HIGH, the capacitance of the variable capacitor circuit 270 is greater than the capacitance of the variable capacitor circuit 270 when the duty control clock signal DCCLK is logic LOW. Thus, even when the charge pump current $I_{CP}$ does not flow in the variable capacitor circuit 270, that is, the amount of charge of the variable capacitor circuit 270 does not change, the control voltage $V_{CTRL}$ is decreased.

A case where the charge pump 130 does not receive the down signal DN and only receives the up signal UP has been described above. However, an operation of the loop filter of FIGS. 2A and 2B when the down signal DN is received is symmetrical to the above-described operation of the loop filter of FIGS. 2A and 2B when the up signal UP is received. For example, when the charge pump 130 receives the down signal DN, the charge pump current $I_{CP}$ flows from the loop filter of FIGS. 2A and 2B to the charge pump 130, and thus the variable capacitor circuit 270 is discharged. When the charge pump 130 receives the up signal UP, the charge pump current $I_{CP}$ flows from the charge pump 130 to the loop filter of FIGS. 2A and 2B, and thus the variable capacitor circuit 270 is charged. Based on this symmetry between when the charge pump 130 receives the down signal DN and when the charge pump 130 receives the up signal UP, the operation of the loop filter of FIGS. 2A and 2B with respect to the down signal DN may be easily understood by referring to the above-described operation regarding the up signal UP. Thus, a detailed description of the loop filter of FIGS. 2A and 2B with respect to the down signal DN will be omitted.

Some embodiments of the present invention may also be applied to a case where the charge pump 130 receives both the up signal UP and the down signal DN. For example, some embodiments of the present invention may be applied to a case where the up signal UP is received and then the down signal DN is received. In this case, while the up signal UP is received, the charge pump current $I_{CP}$ flows in the loop filter of FIGS. 2A and 2B. While the down signal DN is received, the charge pump current $I_{CP}$ flows out of the loop filter of FIGS. 2A and 2B. Thus, the variable capacitor circuit 270 is first charged and then discharged. In this case, it will be understood by one of ordinary skill in the art that the amounts of charges filled in and released from the variable capacitor circuit 270 vary according to the time during which the up signal UP is received and the time during which the down signal DN is received, and thus the level of the control voltage $V_{CTRL}$ varies. Thus, a detailed description thereof will be omitted.

FIG. 2B illustrates, in greater detail, the duty control circuit 250 included in the loop filter illustrated in FIG. 2A.

Referring to FIG. 2B, the duty control circuit 250 includes a delayer 252 and a logic operation circuit 254. The delayer 252 delays the input clock signal FCLK and outputs a delayed clock signal FCLK2. The logic operation circuit 254 performs a logic operation on the input clock signal FCLK and the delayed clock signal FCLK2 and controls a duty of the input clock signal FCLK. An amount by which the delayer 252 delays the input clock signal FCLK may be fixed or vary. Although the use of the feedback clock signal FCLK as an input clock signal is illustrated in FIG. 2B, the reference clock signal RCLK may be used as the input clock signal. Thus, although an operation of the duty control circuit 250 when only the feedback clock signal FCLK is used as the input clock signal will be described below, embodiments of the present invention is not limited thereto.

The operation of the duty control circuit 250 will now be described by referring to FIGS. 2B and 3. When the logic operation circuit 254 performs an AND operation on the feedback clock signal FCLK and the delayed clock signal FCLK2 obtained by delaying the feedback clock signal FCLK, the logic operation circuit 254 may generate the duty control clock signal DCCLK shown in FIG. 3. Of course, it will be understood by one of ordinary skill in the art that the AND logic operation is just an example and the duty control clock signal DCCLK shown in FIG. 3 may also be generated by other types of logic operations. Thus, it will also be understood by one of ordinary skill in the art that embodiments of the present invention is not limited to the AND logic operation illustrated in FIG. 2B.

Figure 4:
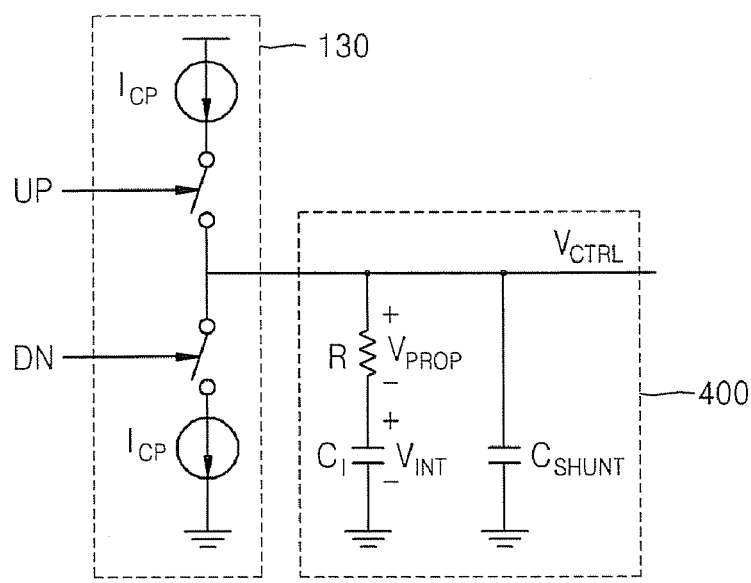
FIG. 4 is a circuit diagram of a loop filter according to some embodiments of the present invention.

FIG. 4 is a circuit diagram of a loop filter 400 according to some embodiments of the present invention, For convenience of explanation, the charge pump 130 is also illustrated in FIG. 4.

Referring to FIG. 4, the loop filter 400 includes a resistor R and two capacitors $C_I$ and $C_{SHUNT}$. Compared with the loop filter of FIGS. 2A and 2B, the loop filter 400 according to some embodiments of the present invention of FIG. 4 includes the resistor R instead of the switch SW, and capacitance does not vary.

Figure 5A:
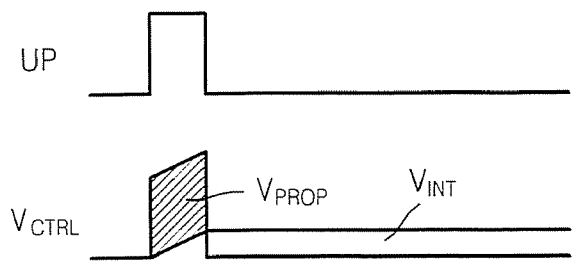
FIG. 5A is a timing diagram illustrating operations of the loop filter illustrated in FIG. 4.

FIG. 5A is a timing diagram illustrating operations of the loop filter 400 of FIG. 4.

Referring to FIG. 5A, while the up signal UP is being received, the charge pump current $I_{CP}$ flows into the loop filter 400. The charge pump current $I_{CP}$ allows a voltage $V_{PROP}$ to be applied to the resistor R and allows the capacitor $C_I$ to be charged. Thus, while the up signal UP is being received, the level of the control voltage $V_{CTRL}$ is a sum of the voltage $V_{PROP}$ applied to the resistor R and a voltage $V_{INT}$ of the capacitor $C_I$. While the up signal UP is being received, the voltage of the capacitor $C_I$ increases in proportion to the capacitance of the capacitor $C_I$. Next, when the reception of the up signal UP is stopped, no more voltage is applied to the resistor R, and the charge of the capacitor $C_I$ is maintained without any increase or decrease. Thus, the control voltage $V_{CTRL}$ is the voltage $V_{INT}$ of the capacitor $C_I$.

As described above, in the loop filter 400 of FIG. 4, while the up signal UP is being received, a high voltage, namely, the voltage $V_{PROP}$, is applied to the resistor R. This phenomenon is referred to as reference spur. However, referring to FIG. 3, in the loop filter of FIGS. 2A and 2B, charges provided by the charge pump current $I_{CP}$ are spread over the inactive section of the duty control clock signal DCCLK. Thus, a voltage applied to the loop filter of FIGS. 2A and 2B is less than a voltage applied to the loop filter 400 of FIG. 4. As a result, the loop filter of FIGS. 2A and 2B can reduce reference spur.

Figure 5B:
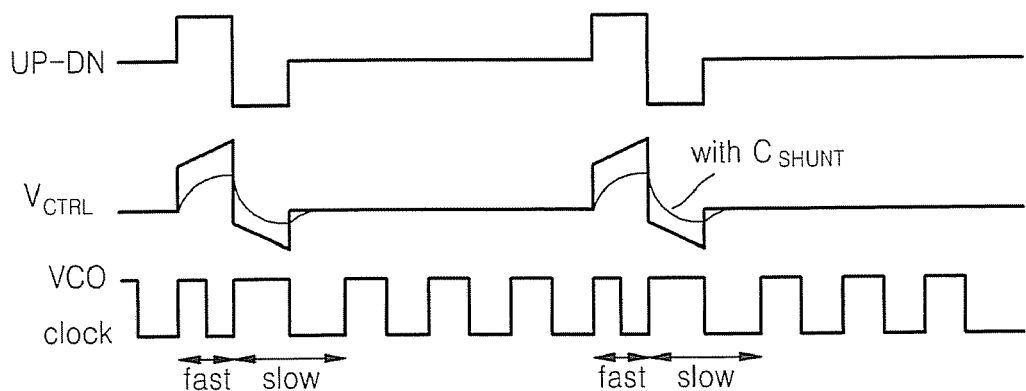
FIG. 5B is another timing diagram illustrating operations of the loop filter illustrated in FIG. 4.
Figure 5C:
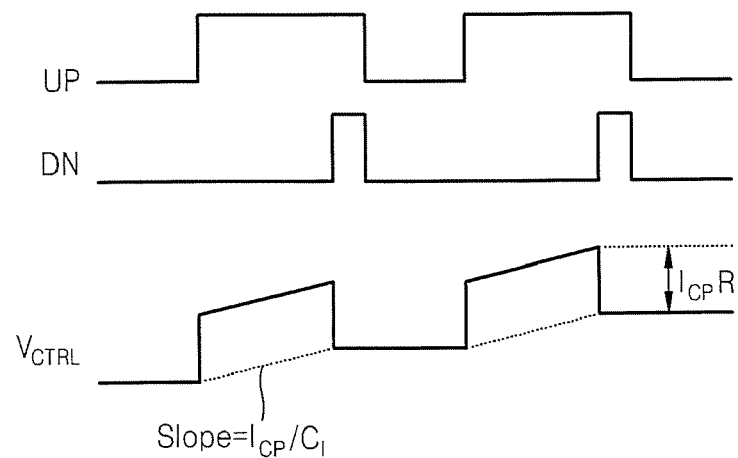
FIG. 5C is another timing diagram illustrating operations of the loop filter illustrated in FIG. 4.

FIG. 5B is another timing diagram illustrating operations of the loop filter 400 of FIG. 4.

Referring to FIG. 5B, when the loop filter 400 receives both the up signal UP and the down signal DN, an operation in which the control voltage $V_{CTRL}$ increases and then decreases is repeated. A straight line of a second waveform of FIG. 5B indicates a variation in the control voltage $V_{CTRL}$ when the loop filter 400 includes only the first capacitor $C_I$, and a curved line of the second waveform indicates a variation in the control voltage $V_{CTRL}$ when the loop filter 400 includes both the first capacitor $C_I$ and the second capacitor $C_{SHUNT}$. If the loop filter 400 includes the second capacitor $C_{SHUNT}$, the number of ripples of the control voltage $V_{CTRL}$ decreases. However, in this case, reference spur in which a relatively high voltage is applied to the resistor R still exists.

Figure 6A:
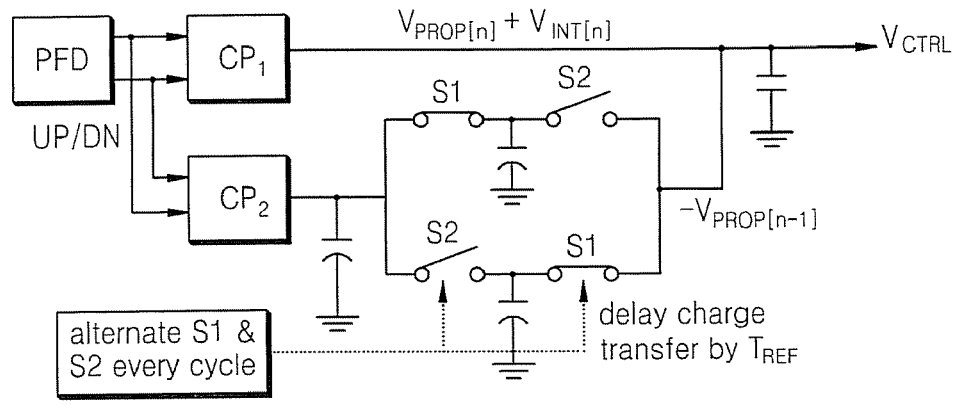
FIGS. 6A through 6C are circuit diagrams of a loop filter according to further embodiments of the present invention.
Figure 6B:
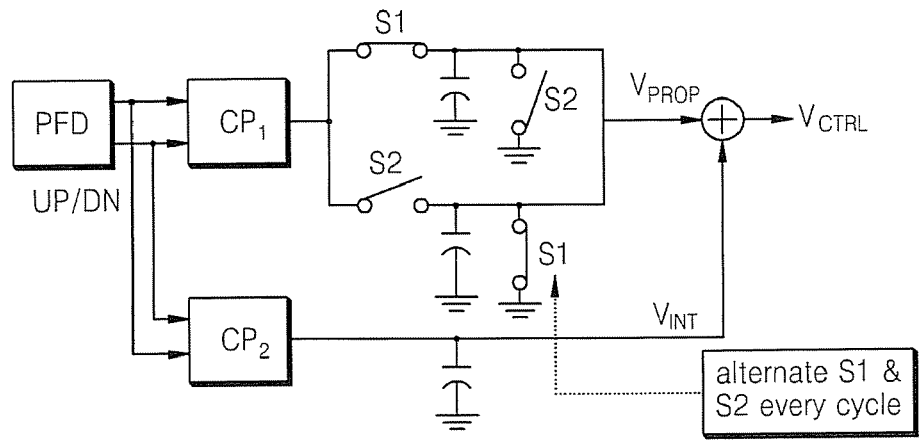
Figure 6C:
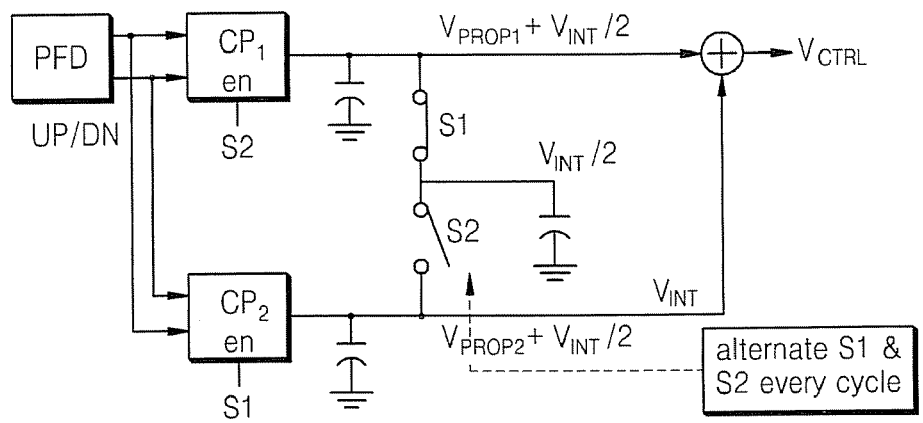

FIGS. 6A through 6C are circuit diagrams of a loop filter according to further embodiments of the present invention. For convenience of explanation, a PFD and charge pumps $CP_1$ and $CP_2$ are shown in FIGS. 6A through 6C.

Figure 7:
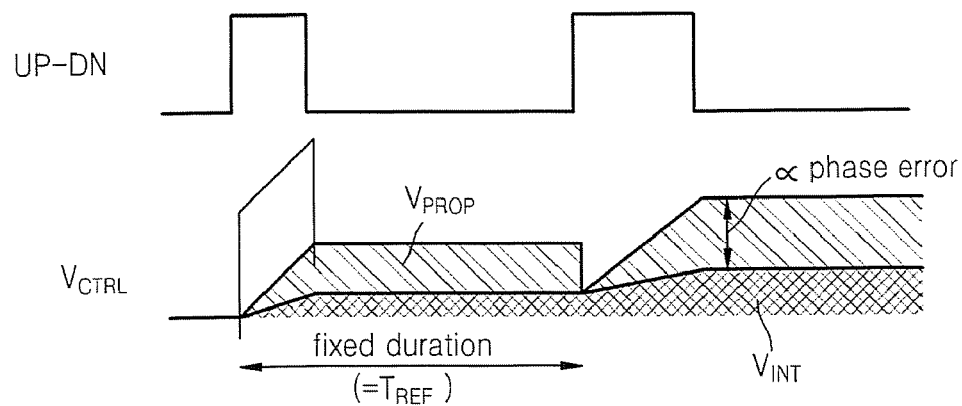
FIG. 7 is a timing diagram illustrating operations of the loop filter illustrated in FIGS. 6A through 6C.

FIG. 7 is a timing diagram illustrating operations of the loop filter illustrated in FIGS. 6A through 6C.

Referring to FIG. 7, in the loop filter of FIGS. 6A through 6C, charges provided by the charge pump current $I_{CP}$ flowing in according to the up signal UP are divided in a section where the up signal UP is not received. Thus, similar to the loop filter of FIGS. 2A and 2B, the loop filter according to some embodiments of the present invention of FIGS. 6A through 6C may reduce reference spur. However, to reduce the reference spur, as illustrated in FIGS. 6A through 6C, the loop filter according to the current comparative example need to include complicate circuits. However, the loop filter according to some embodiments of the present invention of FIGS. 2A and 2B may reduce reference spur while including only the variable capacitor circuit 270. Thus, compared with the loop filter of FIGS. 6A through 6C, the loop filter according to some embodiments of the present invention of FIGS. 2A and 2B may effectively reduce reference spur even without including a complicate circuit structure.

Figure 8:
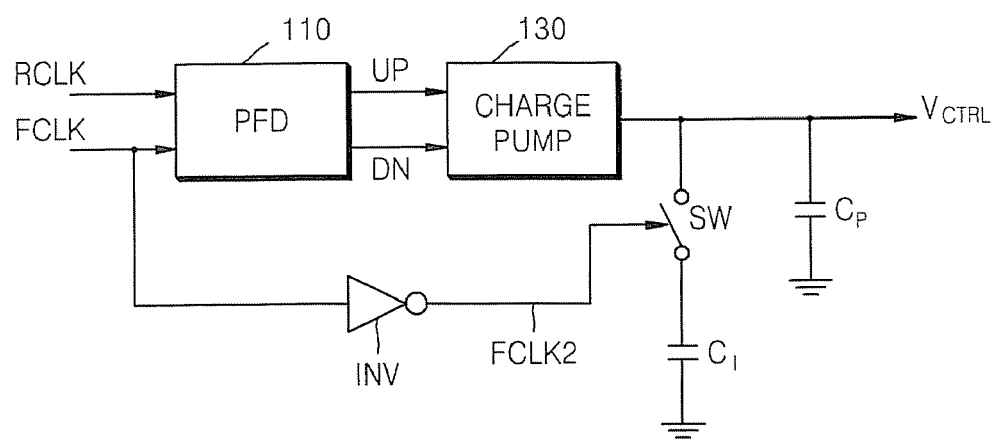
FIG. 8 is a circuit diagram of a loop filter according to further embodiments of the present invention.

FIG. 8 is a circuit diagram of a loop filter according to further embodiments of the present invention. For convenience of explanation, the PFD 110 and the charge pump 130 are also shown in FIG. 8.

Referring to FIG. 8, the loop filter according to further embodiments of the present invention inverts the feedback clock signal FCLK to generate a delayed clock signal FCLK2 for controlling a turn on-off moment of the switch SW. Thus, a duty cycle of the delayed clock signal FCLK2 is the same as a duty cycle of the feedback clock signal FCLK.

Figure 9A:
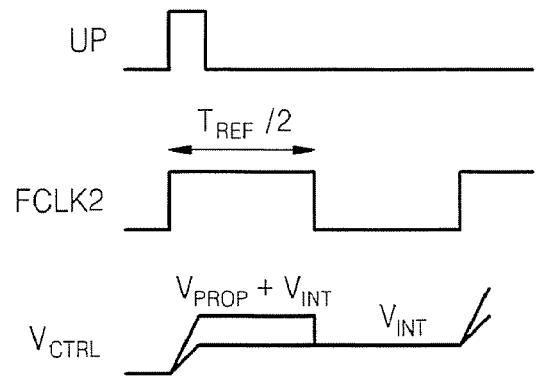
FIG. 9A is a timing diagram illustrating operations of the loop filter illustrated in FIG. 8.

FIG. 9A is a timing diagram illustrating operations of the loop filter illustrated in FIG. 8.

Referring to FIG. 9A, each of an inactive section and an active section of the delayed clock signal FCLK2 is half the cycle of the delayed clock signal FCLK2. In other words, the inactive section and the active section of the delayed clock signal FCLK2 has the same length. Thus, in the loop filter of FIG. 8, the amount of charge provided by the charge pump current flowing in according to the up signal UP is distributed to the first capacitor $C_I$ and the second capacitor $C_P$ during a half of the cycle of the delayed clock signal FCLK2. However, in the loop filter according to some embodiments of the present invention of FIGS. 2A and 2B, charges provided by the charge pump current are distributed to and stored in the first and second capacitors $C_I$ and $C_P$ over the inactive section of the duty control clock signal DCCLK. Here, the inactive section of the duty control clock signal DCCLK is controlled to be longer than the active section thereof.

Thus, the time during which charges provided by the charge pump current in the loop filter of FIG. 8 are distributed and stored is longer than the time during which charges provided by the charge pump current in the loop filter according to some embodiments of the present invention of FIGS. 2A and 2B are distributed and stored. Accordingly, the loop filter according to some embodiments of the present invention of FIGS. 2A and 2B may reduce reference spur as compared with the loop filter according to some embodiments of the present invention of FIG. 8.

Figure 9B:
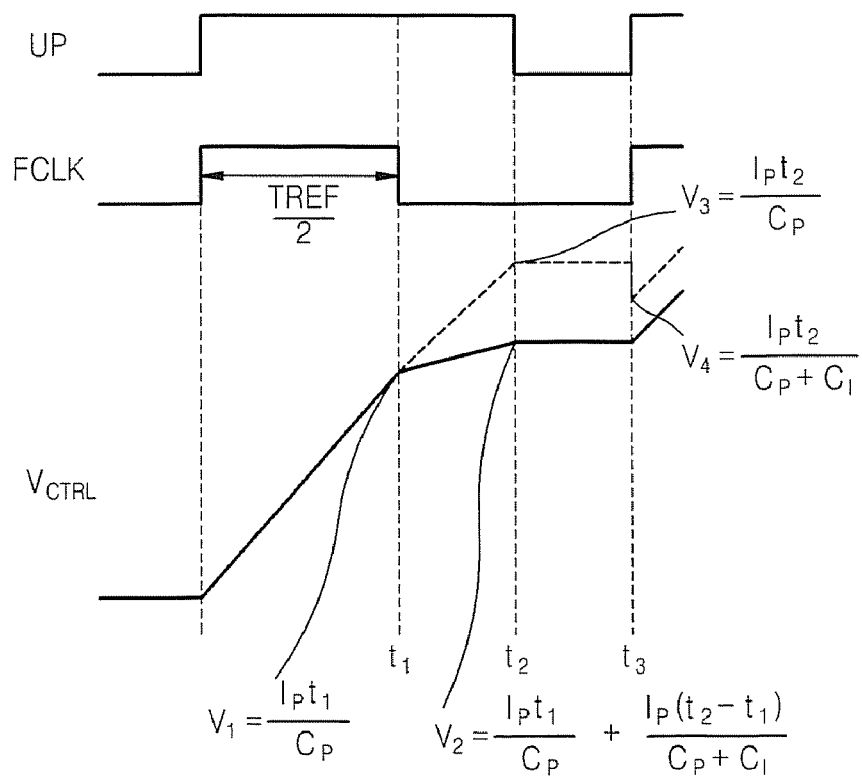
FIG. 9B is another timing diagram illustrating operations of the loop filter illustrated in FIG. 8.

FIG. 9B is another timing diagram illustrating operations of the loop filter illustrated in FIG. 8.

FIG. 9B illustrates a situation where the up signal UP is supplied for a period of time longer than half the cycle of the feedback clock signal FCLK. In this case, even after the feedback clock signal FCLK is inactivated, the up signal UP is continuously supplied. In a section between time points t1 and t2, charges provided by the charge pump current are distributed to and stored in the first and second capacitors $C_I$ and $C_P$, and thus an increasing rate of the control voltage $V_{CTRL}$ slows down. A dotted line of FIG. 9B indicates a case where charges provided by the charge pump current are filled in only the second capacitor $C_P$, and a solid line of FIG. 9B indicates a case where charges provided by the charge pump current are distributed to and stored in the first and second capacitors $C_I$ and $C_P$. As illustrated in the dotted line of FIG. 9B, when the increasing rate of the control voltage $V_{CTRL}$ slows down, the control voltage $V_{CTRL}$ is proportional to a period of time during which the up signal UP is supplied, and thus the control voltage $V_{CTRL}$ fails to properly express the up signal UP. However, the loop filter according to some embodiments of the present invention of FIGS. 2A and 2B may delay a point in time when the duty control clock signal DCCLK is activated to a point in time after the supply of the up signal UP is stopped. In the loop filter according to some embodiments of the present invention of FIGS. 2A and 2B, charges are filled in only the second capacitor $C_P$ before the duty control clock signal DCCLK is activated, and charges filled in the second capacitor $C_P$ are shared by the first and second capacitors $C_I$ and $C_P$ after the duty control clock signal DCCLK is activated. Thus, while the up signal UP is being supplied, the loop filter according to some embodiments of the present invention of FIGS. 2A and 2B increases the control voltage $V_{CTRL}$ in proportion to the duration of the supply of the up signal UP. When the supply of the up signal UP is stopped, the loop filter according to some embodiments of the present invention of FIGS. 2A and 2B activates the duty control clock signal DCCLK and reduces the control voltage $V_{CTRL}$.

Figure 10A:
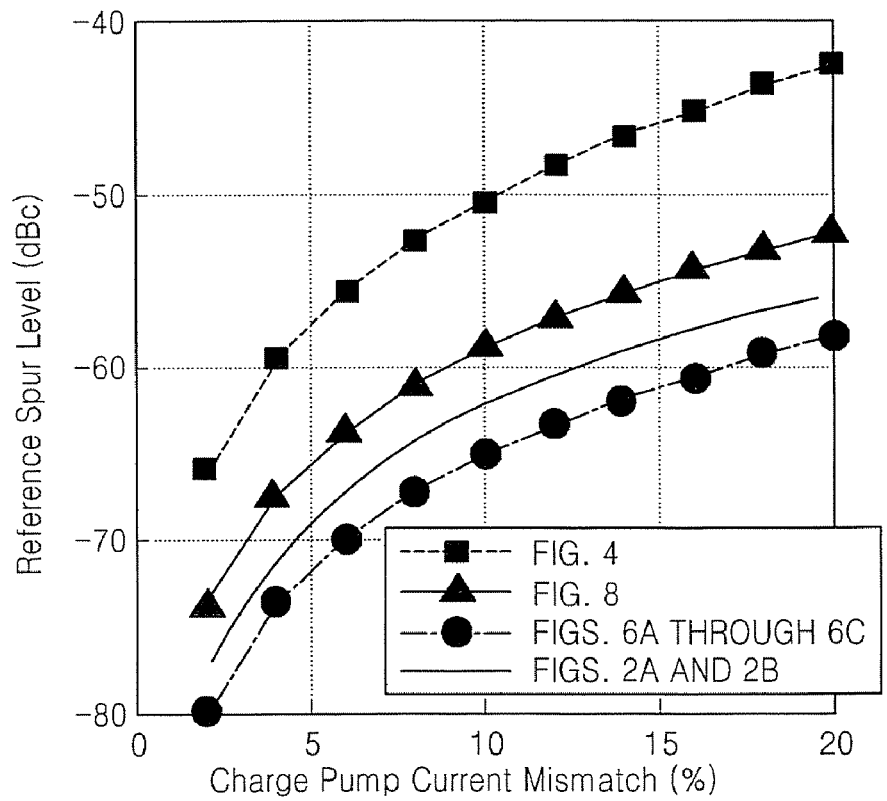
FIG. 10A is a graph illustrating a reference spur level of the loop filter according to some embodiments of the present invention illustrated in FIGS. 2A and 2B and reference spur levels of the loop filters according to the three comparative examples illustrated in FIGS. 4, 6A-6C, and 8.

FIG. 10A is a graph illustrating a reference spur level of the loop filter according to some embodiments of the present invention illustrated in FIGS. 2A and 2B and reference spur levels of the loop filters according to the three comparative examples illustrated in FIGS. 4, 6A-6C, and 8.

Referring to FIG. 10A, the reference spur level of the loop filter according to some embodiments of the present invention illustrated in FIGS. 2A and 2B is lower than the reference spur levels of the loop filters according to some embodiments of the present inventions illustrated in FIGS. 4 and 8. The reference spur level of the loop filter according to some embodiments of the present invention illustrated in FIGS. 2A and 2B is higher than that of the loop filter according to some embodiments of the present invention illustrated in FIGS. 6A-6C. However, as described above, the loop filter according to some embodiments of the present invention illustrated in FIGS. 2A and 2B has a greatly simpler structure than that of the loop filter according to some embodiments of the present inventions illustrated in FIGS. 6A-6C. Thus, the loop filter according to some embodiments of the present invention illustrated in FIGS. 2A and 2B may effectively reduce the reference spur level even while having a small size.

Figure 10B:
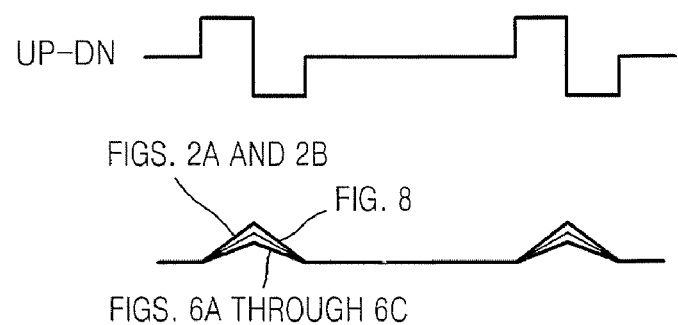
FIG. 10B illustrates a frequency peak of the loop filter according to some embodiments of the present invention illustrated in FIGS. 2A and 2B and frequency peaks of the loop filters according to the three comparative examples illustrated in FIGS. 4, 6A-6C, and 8.

FIG. 10B illustrates a frequency peak of the loop filter according to some embodiments of the present invention illustrated in FIGS. 2A and 2B and frequency peaks of the loop filters according to the three comparative examples illustrated in FIGS. 4, 6A-6C, and 8.

FIG. 10B illustrates a case where the up signal UP is first applied and the down signal DN is then applied. In this case, the frequency peak of the loop filter according to some embodiments of the present invention illustrated in FIGS. 2A and 2B is lower than that of the loop filter according to some embodiments of the present inventions illustrated in FIG. 8. The frequency peak of the loop filter according to some embodiments of the present invention illustrated in FIGS. 2A and 2B is higher than that of the loop filter according to some embodiments of the present inventions illustrated in FIG. 6A-6C. However, as described above, the loop filter according to some embodiments of the present invention illustrated in FIGS. 2A and 2B has a greatly simpler structure than that of the loop filter according to some embodiments of the present inventions illustrated in FIGS. 6A-6C. Thus, the loop filter according to some embodiments of the present invention illustrated in FIGS. 2A and 2B may effectively reduce the frequency peak even while having a small size.

Methods of operating a loop filter according to some embodiments of the present invention is methods of operating a loop filter including a first capacitor and a second capacitor. Methods of operating the loop filter according to some embodiments of the present invention includes the operations of charging the second capacitor by supplying input current; and sharing charges between the first capacitor and the second capacitor. In methods of operating the loop filter according to some embodiments of the present invention, a point in time when the charge sharing occurs may be controlled.

The operation of sharing the charges may be performed after inflow of the input current is stopped. In other words, while the input current is flowing in, only the second capacitor is charged. After the inflow of the input current is stopped, some charges of the second capacitor are distributed to the first capacitor.

Methods of operating the loop filter according to some embodiments of the present invention may further include an operation of generating a duty control clock signal of which an active section is longer than an inactive section. In this case, in the operation of charging the second capacitor, the second capacitor is charged by the input current in the inactive section of the duty control clock signal. In the operation of sharing the charges, charge sharing between the first and second capacitors occurs at the moment when the duty control clock signal is activated.

The loop filter may be included in a PLL. In this case, the duty cycle of the duty control clock signal may be generated from a reference clock signal and/or a feedback clock signal of the PLL.

Figure 11A:
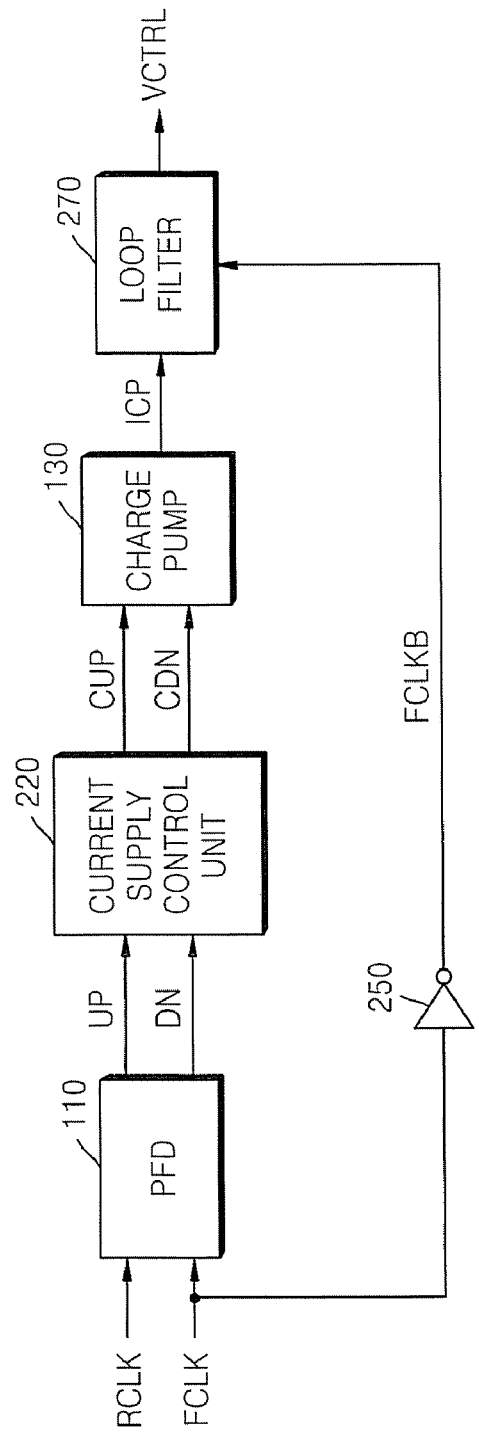
FIG. 11A is a block diagram of a semiconductor circuit according to some embodiments of the present invention.

FIG. 11A is a block diagram of a semiconductor circuit according to some embodiments of the present invention.

Although it will be hereinafter described that the semiconductor circuit of FIG. 11A is included in the PLL of FIG. 1, the semiconductor circuit of FIG. 11A may be included in other circuits.

Referring to FIG. 11A, the semiconductor circuit includes a loop filter 270 and a current supply control circuit 210. For convenience of explanation, the PFD 110 and the charge pump 130 are also shown in FIG. 11A.

The loop filter 270 receives the charge pump current $I_{CP}$ and generates the control voltage $V_{CTRL}$. The current supply control circuit 210 supplies the charge pump current $I_{CP}$ to the loop filter 270 or blocks the supply of the charge pump current $I_{CP}$. The current supply control circuit 210 randomly determines whether to supply or block the charge pump current $I_{CP}$.

The current supply control circuit 210 may randomly and individually control the charge pump current $I_{CP}$ to be supplied to the loop filter 270 or blocked and the charge pump current $I_{CP}$ to flow out of the loop filter 270 or be blocked.

The current supply control circuit 210 may include a current supply control signal generation circuit 220 and a current source 130. The current supply control signal generation circuit 220 generates current supply control signals CUP and CDN that indicate supply and blockage of the charge pump current $I_{CP}$, respectively. The current source 130 supplies the charge pump current $I_{CP}$ to the loop filter 270 or flows the charge pump current $I_{CP}$ out of the loop filter 270 according to the current supply control signals CUP and CDN.

Although the current source 130 is the charge pump 130 in FIG. 11A, embodiments of the present invention is not limited thereto. Although the current supply control signal generation circuit 220 is arranged in front of the current source (or charge pump) 130 in FIG. 11A, the current supply control signal generation circuit 220 may be arranged at rear of the current source (or charge pump) 130.

In the semiconductor circuit according to some embodiments of the present invention of FIG. 11A, it is randomly determined whether the charge pump current $I_{CP}$ is to be supplied to the loop filter 270 or not. More specifically, although the PFD 110 generates the up signal UP instructing inflow of the charge pump current $I_{CP}$ or the down signal DN instructing outflow of the charge pump current $I_{CP}$, the current supply control circuit 210 randomly determines whether to supply or block the charge pump current $I_{CP}$ instead of always supplying the charge pump current $I_{CP}$ to the loop filter 270.

In this case, when the up signal UP or the down signal DN is generated, it is randomly determined whether the control voltage $V_{CTRL}$ is to be changed or not, in response to the up signal UP or the down signal DN. In sections P1 and P4 of FIG. 12, the control voltage $V_{CTRL}$ changes according to the up signal UP and the down signal DN. In sections P2 and P3 of FIG. 12, the control voltage $V_{CTRL}$ does not change according to the up signal UP and the down signal DN. As such, although the up signal UP or the down signal DN is generated, if it is randomly determined whether the control voltage $V_{CTRL}$ is to be changed or not, reference spur can be divided into several frequency bands of a frequency domain. Thus, the reference spur level of the semiconductor circuit can be reduced.

If the control voltage $V_{CTRL}$ is always changed when the up signal UP or the down signal DN is generated, a reference spur level is not reduced.

In the semiconductor circuit according to some embodiments of the present invention of FIG. 11A, supply or blockage of the charge pump current $I_{CP}$ to the loop filter 270 may be randomly determined according to the value of a random number. For example, if the random number is '1', the control voltage $V_{CTRL}$ may be changed in response to the up signal UP or the down signal DN. If the random number is '0', the control voltage $V_{CTRL}$ may not be changed in response to the up signal UP or the down signal DN. The random number may be generated by a random number generator included in the semiconductor circuit or received from an external source.

Figure 12:
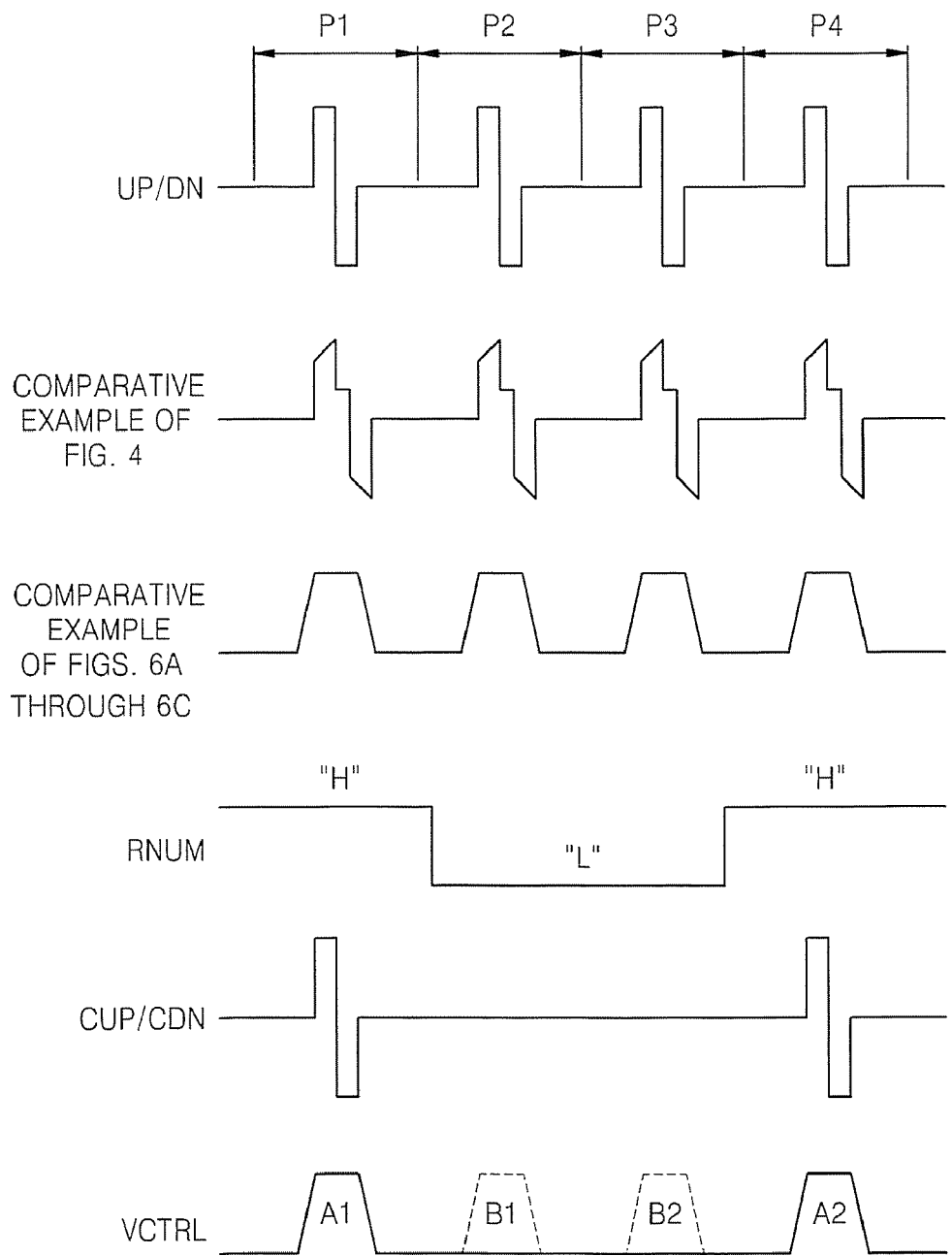
FIG. 12 is a timing diagram illustrating operations of the semiconductor circuit illustrated in FIG. 11A.

FIG. 12 is a timing diagram illustrating operations of the semiconductor circuit illustrated in FIG. 11A.

Referring to FIGS. 11A and 12, in section P1, the up signal UP is received and then the down signal DN is received. While the up signal UP is being received, the charge pump current $I_{CP}$ flows from the charge pump 130 to the loop filter 270. While the down signal DN is being received, the charge pump current $I_{CP}$ flows out of the loop filter 270 and enters the charge pump 130. In section P1, the logic states of the current supply control signal CUP, namely, a control up signal, and the current supply control signal CDN, namely, a control down signal, are the same as the logic states of the up signal UP and the down signal DN, respectively. Thus, in response to the control up signal CUP and the control down signal CDN, the charge pump 130 flows the charge pump current $I_{CP}$ to the loop filter 270 or flows the charge pump current $I_{CP}$ out of the loop filter 270. The loop filter 270 generates a control voltage $V_{CTRL}$ with an A1 shape in response to the charge pump current $I_{CP}$.

In section P2 of FIG. 12, the logic states of the control up signal CUP and the control down signal CDN are maintained regardless of the logic states of the up signal UP and the down signal DN. Accordingly, the charge pump 130 neither supplies the charge pump current $I_{CP}$ to the loop filter 270 nor allows the charge pump current $I_{CP}$ to flow out of the loop filter 270, and the loop filter 270 does not generate the control voltage $V_{CTRL}$.

Although the amplitudes of the up signal UP and the down signal DN are the same as each other in FIG. 12, they may be different, and periods of time during which the up signal UP and the down signal DN are applied may also be different. Although it has been described above that the semiconductor circuit of FIG. 11A receives both the up signal UP and the down signal DN, some embodiments of the present invention may also be applied to a case where the semiconductor circuit of FIG. 11A receives only the up signal UP and a case where the semiconductor circuit of FIG. 11A receives only the down signal DN.

In the semiconductor circuit according to some embodiments of the present invention of FIG. 11A, a section in which the control voltage $V_{CTRL}$ is changed and a section in which the control voltage $V_{CTRL}$ is not changed may be controlled to randomly appear. Thus, the reference spur of the semiconductor circuit of FIG. 11A can be reduced. To achieve this process, the semiconductor circuit of FIG. 11A may only have to include a current supply control signal generation circuit. Thus, the semiconductor circuit of FIG. 11A can effectively reduce reference spur without including a complicate circuit structure.

Figure 11B:
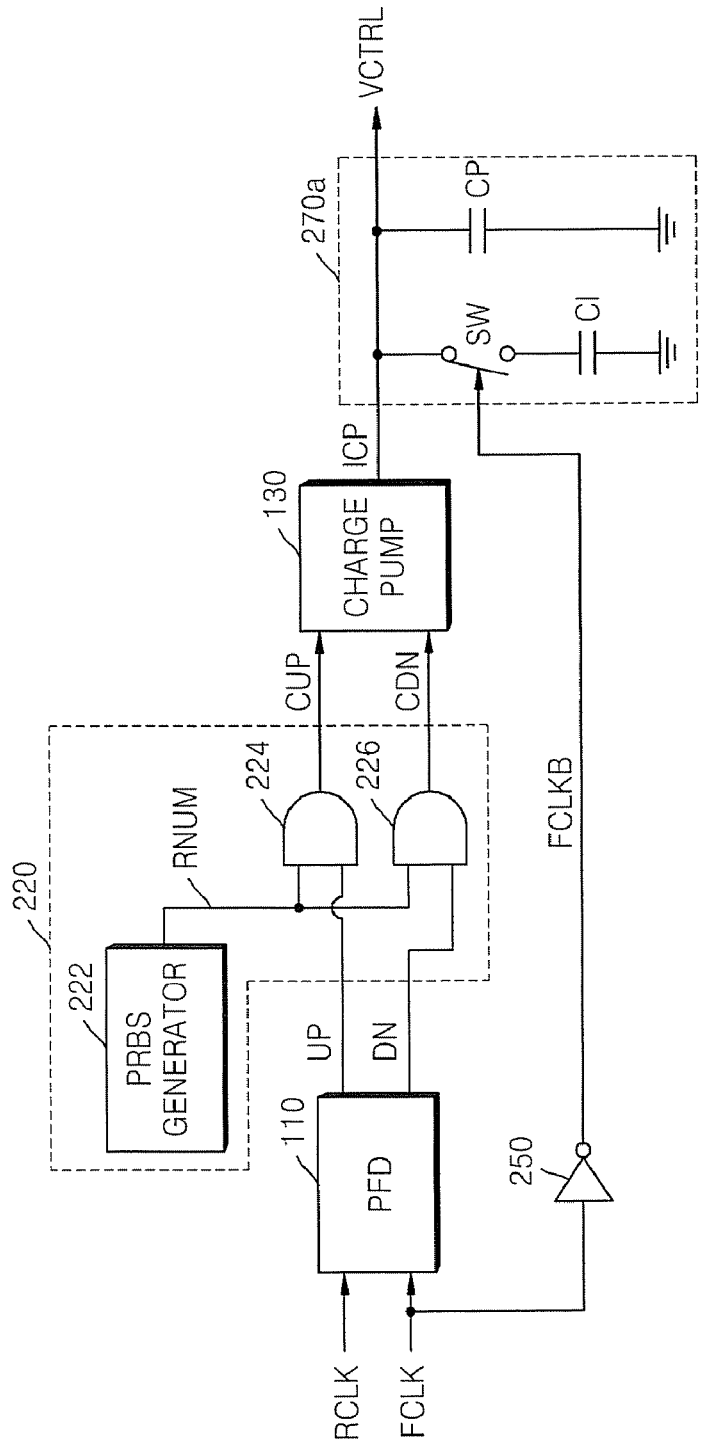
FIG. 11B illustrates an example of the semiconductor circuit illustrated in FIG. 11A.

FIG. 11B illustrates an example of the semiconductor circuit illustrated in FIG. 11A. Referring to FIG. 11B, the current supply control signal generation circuit 220 may include a random number generator 222, a first logic operation circuit 224, and a second logic operation circuit 226.

The random number generator 222 generates a random number signal RNUM. The random number generator 222 may be a pseudo random bit sequence (PRBS) generator 222.

The first logic operation circuit 224 performs a logic operation on the logic state of the up signal UP and the logic state of the random number signal RNUM to generate the control up signal CUP. The second logic operation circuit 226 performs a logic operation on the logic state of the down signal DN and the logic state of the random number signal RNUM to generate the control down signal CDN. According to the logic state of the random number signal RNUM, the control up signal CUP has the same logic state as that of the up signal UP or has a logic state fixed regardless of the logic state of the up signal UP. In other words, according to the logic state of the random number signal RNUM, it is randomly determined whether the up signal UP is to be passed or not. This logic is also applied to the control down signal CDN. For example, the first logic operation circuit 224 and the second logic operation circuit 226 may perform an AND operation on the up signal UP and the random number signal RNUM and an AND operation on the down signal DN and the random number signal RNUM, respectively, to generate the control up signal CUP and the control down signal CDN, respectively. Of course, the AND logic operation is just an example, and the control up signal CUP and the control down signal CDN may be generated by other types of logic operations.

Although the random number generator 222 includes the current supply control signal generation circuit 220 in FIG. 11B, the random number generator 222 may be installed outside the current supply control signal generation circuit 220.

In the semiconductor circuit of FIG. 11B, the loop filter 270 is implemented into a variable capacitor circuit 270a.

The variable capacitor circuit 270a is charged or discharged by the charge pump current $I_{CP}$. When the up signal UP is received and the charge pump current $I_{CP}$ flows from the charge pump 130 to the variable capacitor circuit 270a, the variable capacitor circuit 270a is charged, and thus the amount of charge of the variable capacitor circuit 270a increases. When the down signal DN is received and the charge pump current $I_{CP}$ flows from the variable capacitor circuit 270a to the charge pump 130, the variable capacitor circuit 270a is discharged, and thus the amount of charge of the variable capacitor circuit 270a decreases.

The amount of charge filled in the variable capacitor circuit 270a during a unit time and the amount of charge released from the variable capacitor circuit 270a during the unit time are determined according to the magnitude of the charge pump current $I_{CP}$. When the magnitude of the charge pump current $I_{CP}$ increases, the amounts of charge filled in and released from the variable capacitor circuit 270a during the unit time increase. When the magnitude of the charge pump current $I_{CP}$ decreases, the amounts of charge filled in and released from the variable capacitor circuit 270a during the unit time decrease. The amounts of charge filled in and released from the variable capacitor circuit 270a during the unit time may also be determined according to the time during which the charge pump current $I_{CP}$ flows in or out of the variable capacitor circuit 270a. As the time during which the charge pump current $I_{CP}$ flows in or out of the variable capacitor circuit 270a increases, the amounts of charge filled in and released from the variable capacitor circuit 270a during the unit time increase. As the time during which the charge pump current $I_{CP}$ flows in or out of the variable capacitor circuit 270a decreases, the amounts of charge filled in and released from the variable capacitor circuit 270a during the unit time decrease.

It has been described above that the semiconductor circuit of FIG. 11A is included in a PLL and that the variable capacitor circuit 270a receives and transmits the charge pump current $I_{CP}$ from and to the charge pump 130. However, the semiconductor circuit of FIG. 11A may be included in devices other than a PLL. In this case, the variable capacitor circuit 270a may receive and transmit current to a component other than the charge pump 130.

The control voltage $V_{CTRL}$ is determined according to the amount of charge of the variable capacitor circuit 270a. When the amount of charge of the variable capacitor circuit 270a increases, the control voltage $V_{CTRL}$ increases. When the amount of charge of the variable capacitor circuit 270a decreases, the control voltage $V_{CTRL}$ decreases. As described above, the amount of charge of the variable capacitor circuit 270a varies according to whether the charge pump current $I_{CP}$ flows in or out of the variable capacitor circuit 270a, the magnitude of the charge pump current $I_{CP}$, and the time during which the charge pump current $I_{CP}$ flows in or out of the variable capacitor circuit 270a. Thus, the control voltage $V_{CTRL}$ also varies according to these factors. For example, when the up signal UP is received and the charge pump current $I_{CP}$ flows into the variable capacitor circuit 270a, the control voltage $V_{CTRL}$ increases. When the down signal DN is received and the charge pump current $I_{CP}$ flows out of the variable capacitor circuit 270a, the control voltage $V_{CTRL}$ decreases. In this way, the loop filter may control the magnitude of the control voltage $V_{CTRL}$ by controlling the amount of charge of the variable capacitor circuit 270a.

The capacitance of the variable capacitor circuit 270a may vary. When the capacitance of the variable capacitor circuit 270a varies, the magnitude of a voltage applied to the variable capacitor circuit 270a varies regardless of inflow or outflow of the charge pump current $I_{CP}$ (that is, even without a variation in the amount of charge of the variable capacitor circuit 270a). Since the voltage applied to the variable capacitor circuit 270a is the control voltage $V_{CTRL}$, when the capacitance of the variable capacitor circuit 270a is changed, the magnitude of the control voltage $V_{CTRL}$ is also changed. For example, when the charge pump current $I_{CP}$ neither flows in nor out of the variable capacitor circuit 270a, if the capacitance of the variable capacitor circuit 270a transitions from a low level to a high level, the control voltage $V_{CTRL}$ is decreased. If the capacitance of the variable capacitor circuit 270a transitions from the high level to the low level, the control voltage $V_{CTRL}$ is increased.

The variable capacitor circuit 270a may include a switch SW, a first capacitor $C_I$, and a second capacitor $C_P$.

The switch SW is turned on or off according to the duty control clock signal DCCLK. For example, the switch SW may be turned on in the active section of an inverted feedback clock signal FCLKB and turned off in the inactive section of the inverted feedback clock signal FCLKB. Of course, the switch SW may be turned off in the active section of the inverted feedback clock signal FCLKB and turned on in the inactive section of the inverted feedback clock signal FCLKB.

According to whether the switch SW is turned on or off, an overall capacitance of the variable capacitor circuit 270a is changed. More specifically, when the switch SW is turned on, the first capacitor $C_I$ and the second capacitor $C_P$ are connected to each other in parallel. Accordingly, the overall capacitance of the variable capacitor circuit 270a is a sum of the capacitances of the first capacitor $C_I$ and the second capacitor $C_P$. When the switch SW is turned off, the first capacitor $C_I$ is connected to neither the charge pump 130 nor a node where the control voltage $V_{CTRL}$ is generated. In other words, when the switch SW is turned off, an effect where the variable capacitor circuit 270a only includes the second capacitor $C_P$ is generated. Thus, the overall capacitance of the variable capacitor circuit 270a is the same as the capacitance of the second capacitor $C_P$. In other words, when the switch SW is turned on, the overall capacitance of the variable capacitor circuit 270a is increased. When the switch SW is turned off, the overall capacitance of the variable capacitor circuit 270a is decreased.

Although the variable capacitor circuit 270 includes the switch SW, the first capacitor $C_I$, and the second capacitor $C_P$ in FIG. 11B, the variable capacitor circuit 270 may have other structures. In other words, the variable capacitor circuit 270 may be configured in other ways so long as the capacitance of the variable capacitor circuit 270 can vary according to the logic state of the inverted feedback clock signal FCLKB.

Figure 11C:
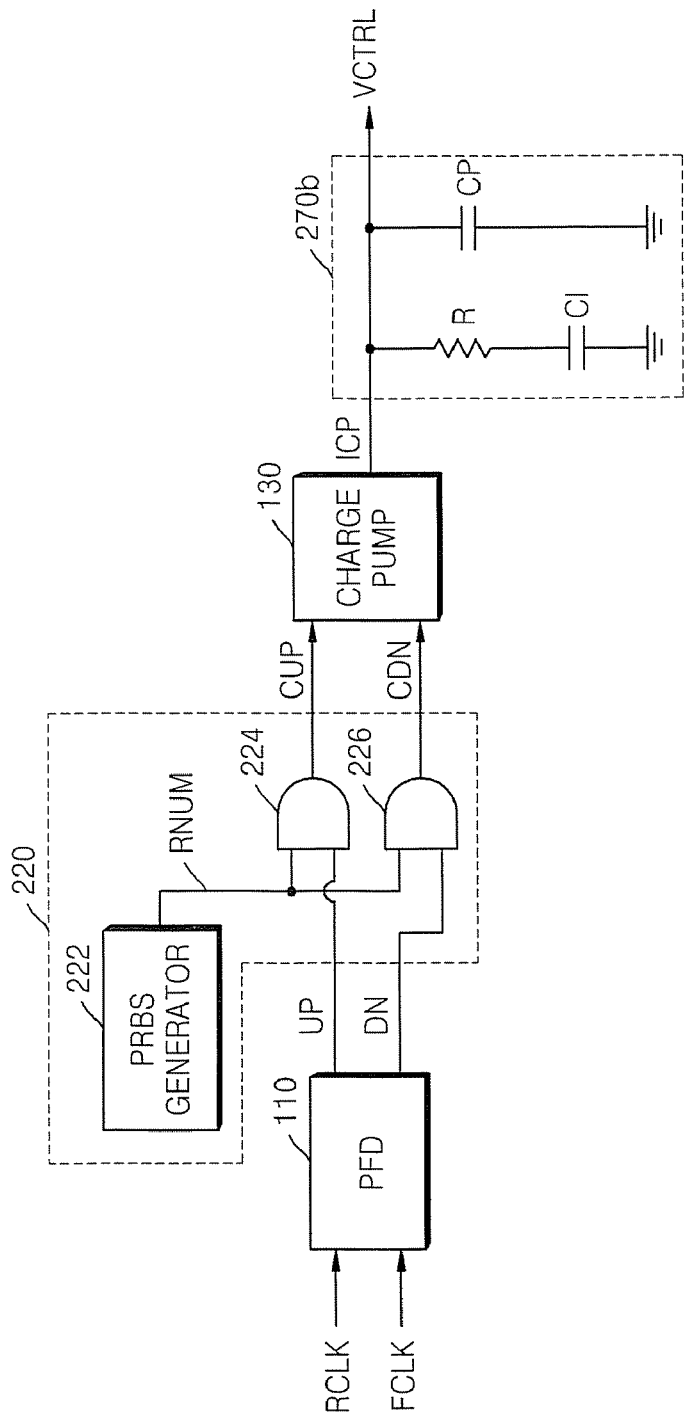
FIG. 11C illustrates another example of the semiconductor circuit illustrated in FIG. 11A.

FIG. 11C illustrates another example of the semiconductor circuit illustrated in FIG. 11A.

In the semiconductor circuit of FIG. 11B, the loop filter 270 is implemented into the variable capacitor circuit 270a. However, in the semiconductor circuit of FIG. 11C, the loop filter 270 is implemented into an RC filter 270b.

Similar to the semiconductor circuit of FIG. 11B, in the semiconductor circuit of FIG. 11C, it is randomly determined whether the up signal UP or the down signal DN is to be passed or not passed, according to the logic state of the random number signal RNUM. Thus, it is randomly determined whether the charge pump current $I_{CP}$ is to flow in (or out of) the RC filter 270b or inflow (or outflow) of the charge pump current $I_{CP}$ is to be blocked. Thus, according to the up signal UP or the down signal DN, it is randomly determined whether the control voltage $V_{CTRL}$ is to be changed.

Although the examples where the loop filter 270 is implemented into the variable capacitor circuit 270a and the RC filter 270b are illustrated in FIGS. 11B and 11C, embodiments of the present invention is not limited to these examples.

Figure 13:
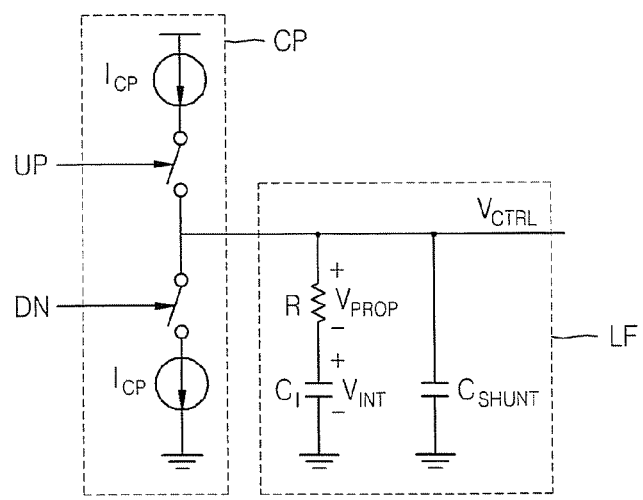
FIG. 13 is a circuit diagram of a loop filter according to some embodiments of the present invention.

FIG. 13 is a circuit diagram of a loop filter according to some embodiments of the present invention. For convenience of explanation, the charge pump 130 is also illustrated in FIG. 13.

Referring to FIG. 13, the loop filter 400 according to some embodiments of the present invention includes a resistor R and two capacitors $C_I$ and $C_{SHUNT}$. Compared with the loop filters of FIGS. 11A through 11C, the loop filter 400 according to some embodiments of the present invention of FIG. 13 includes the resistor R instead of the switch SW, and capacitance does not vary.

Figure 14A:
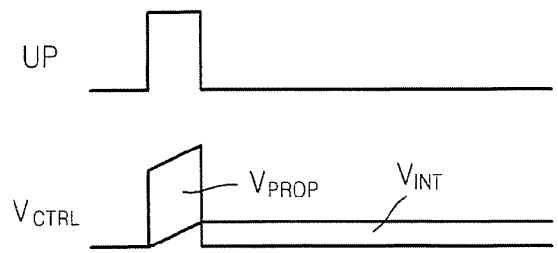
FIG. 14A is a timing diagram illustrating operations of the loop filter illustrated in FIG. 13.

FIG. 14A is a timing diagram illustrating operations of the loop filter 400 according to some embodiments of the present invention of FIG. 13.

Referring to FIG. 14A, while the up signal UP is being received, the charge pump current $I_{CP}$ flows into the loop filter 400. The charge pump current $I_{CP}$ allows a voltage $V_{PROP}$ to be applied to the resistor R and allows the capacitor $C_I$ to be charged. Thus, while the up signal UP is being received, the level of the control voltage $V_{CTRL}$ is a sum of the voltage $V_{PROP}$ applied to the resistor R and a voltage $V_{INT}$ of the capacitor $C_I$. While the up signal UP is being received, the voltage of the capacitor $C_I$ increases in proportion to the capacitance of the capacitor $C_I$. Next, when the reception of the up signal UP is stopped, no more voltage is applied to the resistor R, and the charge of the capacitor $C_I$ is maintained without any increase or decrease. Thus, the control voltage $V_{CTRL}$ is the voltage $V_{INT}$ of the capacitor $C_I$.

As described above, in the loop filter 400 according to some embodiments of the present invention of FIG. 13, while the up signal UP is being received, a high voltage, namely, the voltage $V_{PROP}$, is applied to the resistor R. This phenomenon is referred to as reference spur. However, referring to FIG. 12, in the loop filters according to the embodiments of the present invention of FIGS. 11B and 11C, charges provided by the charge pump current $I_{CP}$ are spread over the inactive section of a timing control clock signal DCCLK. Thus, a voltage applied to the loop filters according to the embodiments of the present invention of FIGS. 11B and 11C is less than a voltage applied to the loop filter 400 according to some embodiments of the present invention of FIG. 13. As a result, the loop filters according to the embodiments of the present invention of FIGS. 11B and 11C can reduce reference spur.

Figure 14B:
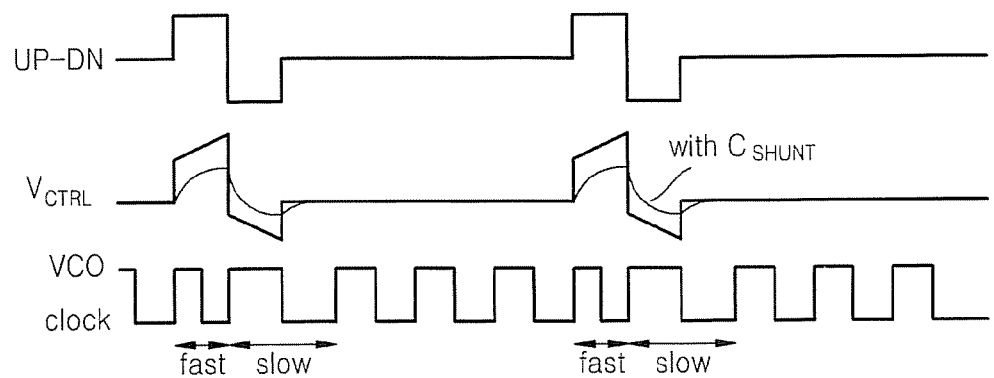
FIG. 14B is another timing diagram illustrating operations of the loop filter illustrated in FIG. 13.
Figure 14C:
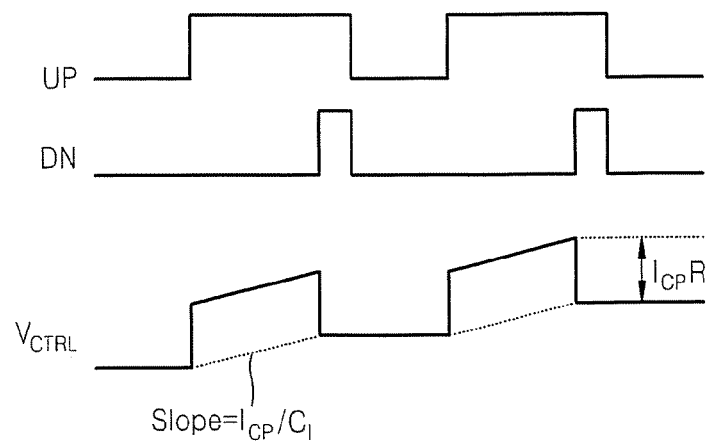
FIG. 14C is another timing diagram illustrating operations of the loop filter illustrated in FIG. 13.

FIG. 14B is another timing diagram illustrating operations of the loop filter 400 according to some embodiments of the present invention of FIG. 4.

Referring to FIG. 14B, when the loop filter 400 receives both the up signal UP and the down signal DN, an operation in which the control voltage $V_{CTRL}$ increases and then decreases is repeated. A straight line of a second waveform of FIG. 14B indicates a variation in the control voltage $V_{CTRL}$ when the loop filter 400 of FIG. 13 includes only the first capacitor $C_I$, and a curved line of the second waveform indicates a variation in the control voltage $V_{CTRL}$ when the loop filter 400 of FIG. 13 includes both the first capacitor $C_I$ and the second capacitor $C_{SHUNT}$. If the loop filter 400 of FIG. 13 includes the second capacitor $C_{SHUNT}$, the number of ripples of the control voltage $V_{CTRL}$ decreases. However, in this case, reference spur in which a relatively high voltage is applied to the resistor R still exists.

Figure 15A:
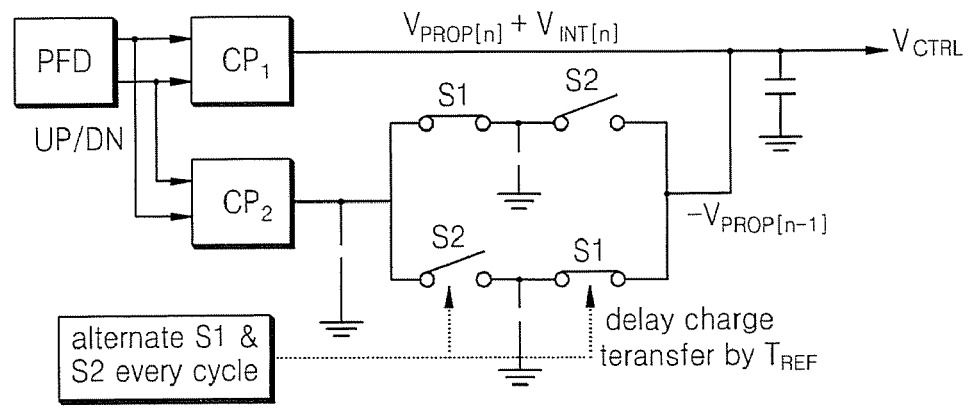
FIGS. 15A through 15C are circuit diagrams of a loop filter according to further embodiments of the present invention.
Figure 15B:
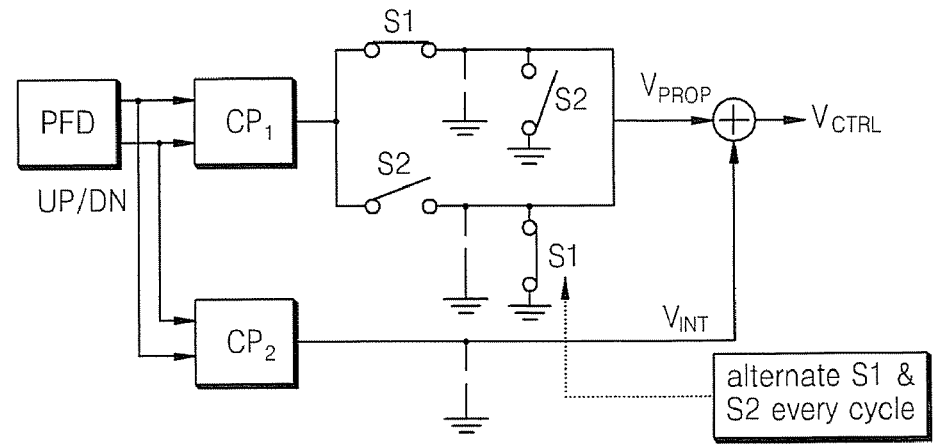
Figure 15C:
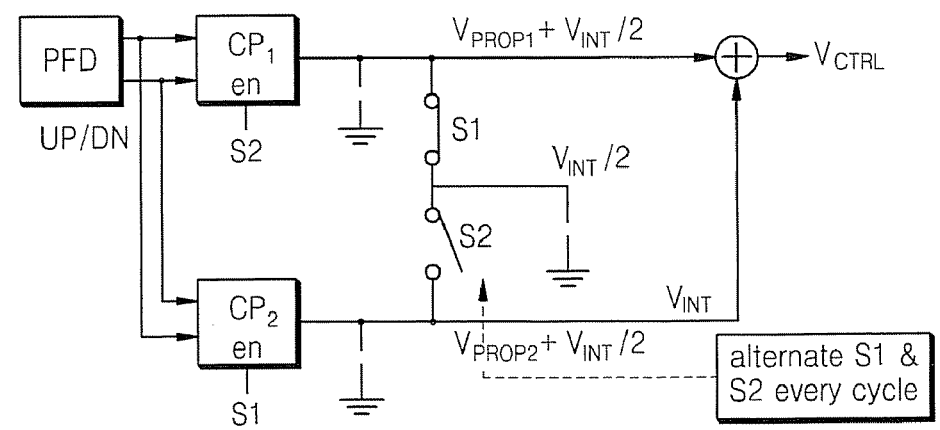

FIGS. 15A through 15C are circuit diagrams of a loop filter according to further embodiments of the present. For convenience of explanation, a PFD and charge pumps $CP_1$ and $CP_2$ are shown in FIGS. 15A through 6C.

Figure 16:
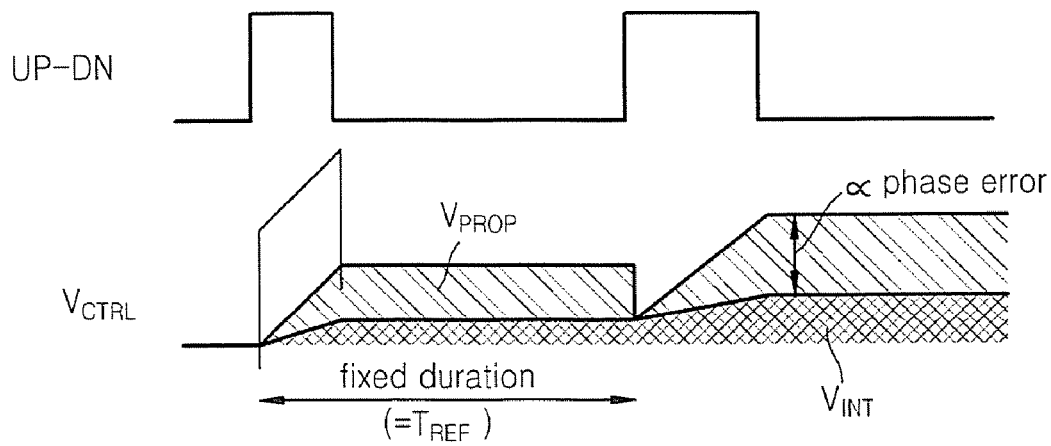
FIG. 16 is a timing diagram illustrating operations of the loop filter illustrated in FIG. 15A through 15C.

FIG. 16 is a timing diagram illustrating operations of the loop filter illustrated in FIGS. 15A through 15C.

Referring to FIG. 16, in the loop filter of FIGS. 15A through 15C, charges provided by the charge pump current $I_{CP}$ flowing in according to the up signal UP are divided in a section where the up signal UP is not received. Thus, similar to the loop filters according to the embodiments of the present invention of FIGS. 11B and 11C, the loop filter according to some embodiments of the present invention of FIGS. 15A through 15C may reduce reference spur. However, to reduce the reference spur, as illustrated in FIGS. 15A through 15C, the loop filter according to the current comparative example need to include complicate circuits. However, the loop filters according to the embodiments of the present invention of FIGS. 11B and 11C may reduce reference spur while including only a variable capacitor circuit. Thus, compared with the loop filter according to some embodiments of the present invention of FIGS. 15A through 15C, the loop filter according to some embodiments of the present invention of FIGS. 11B and 11C may effectively reduce reference spur even without including a complicate circuit structure.

Figure 17:
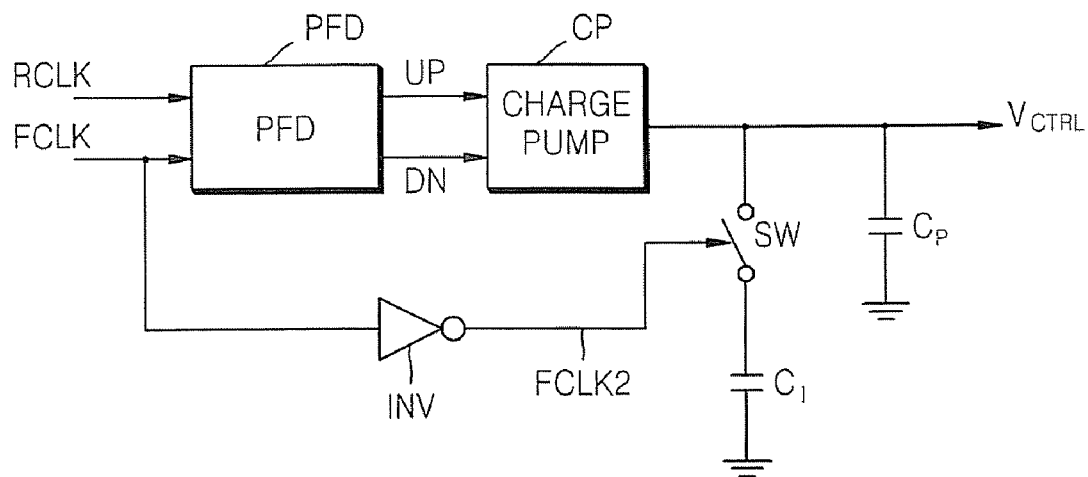
FIG. 17 is a circuit diagram of a loop filter according to further embodiments of the present invention.

FIG. 17 is a circuit diagram of a loop filter according to further embodiments of the present. For convenience of explanation, the PFD 110 and the charge pump 130 are also shown in FIG. 17.

Referring to FIG. 17, the loop filter according to further embodiments of the present invention inverts the feedback clock signal FCLK to generate a delayed clock signal FCLK2 for controlling a turn on-off moment of the switch SW. Thus, a duty cycle of the delayed clock signal FCLK2 is the same as a duty cycle of the feedback clock signal FCLK.

Figure 18A:
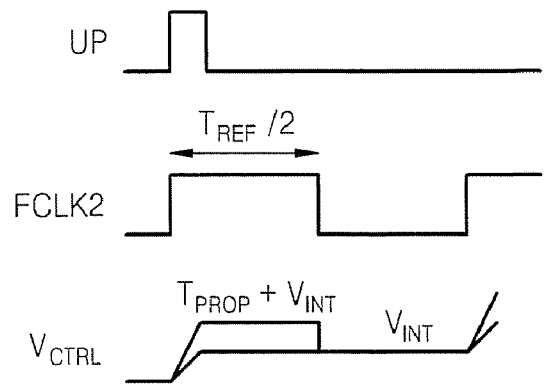
FIG. 18A is a timing diagram illustrating operations of the loop filter illustrated in FIG. 17.

FIG. 18A is a timing diagram illustrating operations of the loop filter according to some embodiments of the present invention illustrated in FIG. 17.

Referring to FIG. 18A, each of an inactive section and an active section of the delayed clock signal FCLK2 is half the cycle of the delayed clock signal FCLK2. In other words, the inactive section and the active section of the delayed clock signal FCLK2 has the same length. Thus, in the loop filter according to some embodiments of the present invention of FIG. 17, the amount of charge provided by the charge pump current flowing in according to the up signal UP is distributed to the first capacitor $C_I$ and the second capacitor $C_P$ during a half of the cycle of the delayed clock signal FCLK2. However, in the loop filters according to the embodiments of the present invention of FIGS. 11B and 11C, charges provided by the charge pump current are distributed to and stored in the first and second capacitors $C_I$ and $C_P$ over the inactive section of the timing control clock signal DCCLK. Here, the inactive section of the timing control clock signal DCCLK is controlled to be longer than the active section thereof.

Thus, the time during which charges provided by the charge pump current in the loop filter according to some embodiments of the present invention of FIG. 17 are distributed and stored is longer than the time during which charges provided by the charge pump current in the loop filters according to the embodiments of the present invention of FIGS. 11B and 11C are distributed and stored. Accordingly, the loop filters according to the embodiments of the present invention of FIGS. 11B and 11C may reduce reference spur as compared with the loop filter according to some embodiments of the present invention of FIG. 17.

Figure 18B:
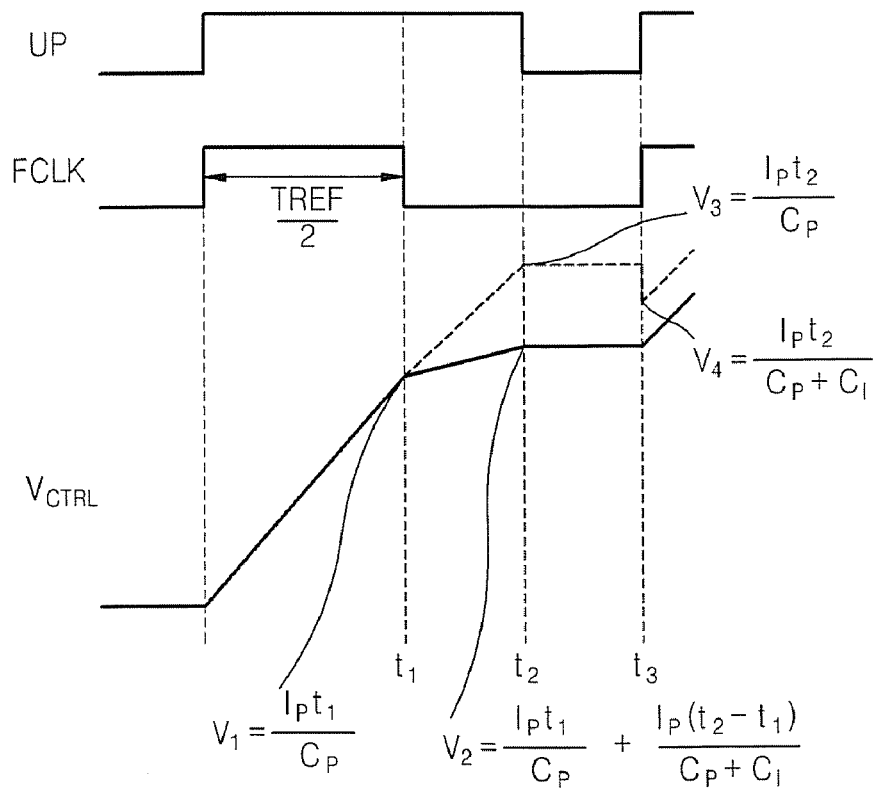
FIG. 18B is another timing diagram illustrating operations of the loop filter illustrated in FIG. 17.

FIG. 18B is another timing diagram illustrating operations of the loop filter according to some embodiments of the present invention illustrated in FIG. 17.

FIG. 18B illustrates a situation where the up signal UP is supplied for a period of time longer than half the cycle of the feedback clock signal FCLK. In this case, even after the feedback clock signal FCLK is inactivated, the up signal UP is continuously supplied. In a section between time points t1 and t2, charges provided by the charge pump current are distributed to and stored in the first and second capacitors $C_I$ and $C_P$, and thus an increasing rate of the control voltage $V_{CTRL}$ slows down. A dotted line of FIG. 18B indicates a case where charges provided by the charge pump current are filled in only the second capacitor $C_P$, and a solid line of FIG. 18B indicates a case where charges provided by the charge pump current are distributed to and stored in the first and second capacitors $C_I$ and $C_P$. As illustrated in the dotted line of FIG. 18B, when the increasing rate of the control voltage $V_{CTRL}$ slows down, the control voltage $V_{CTRL}$ is proportional to a period of time during which the up signal UP is supplied, and thus the control voltage $V_{CTRL}$ fails to properly express the up signal UP. However, the loop filters according to the embodiments of the present invention of FIGS. 11B and 11C may delay a point in time when the timing control clock signal DCCLK is activated to a point in time after the supply of the up signal UP is stopped. In the loop filters according to the embodiments of the present invention of FIGS. 11B and 11C, charges are filled in only the second capacitor $C_P$ before the timing control clock signal DCCLK is activated, and charges filled in the second capacitor $C_P$ are shared by the first and second capacitors $C_I$ and $C_P$ after the timing control clock signal DCCLK is activated. Thus, while the up signal UP is being supplied, the loop filters according to the embodiments of the present invention of FIGS. 11B and 11C increase the control voltage $V_{CTRL}$ in proportion to the duration of the supply of the up signal UP. When the supply of the up signal UP is stopped, the loop filters according to the embodiments of the present invention of FIGS. 11B and 11C activate the timing control clock signal DCCLK and reduce the control voltage $V_{CTRL}$.

Figure 19:
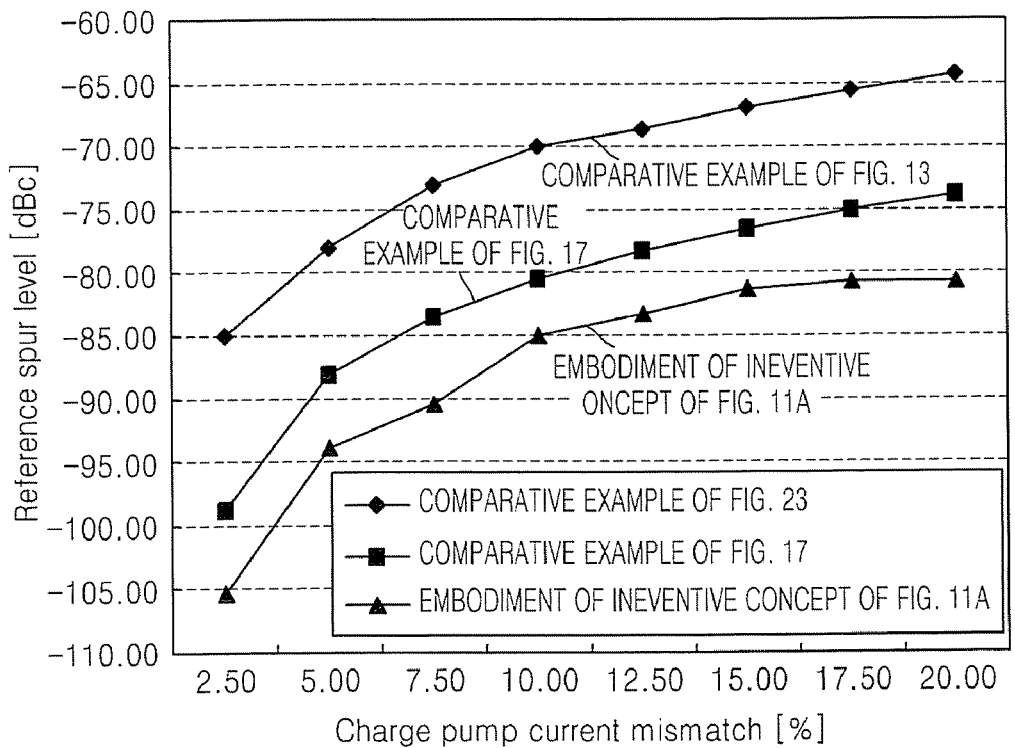
FIG. 19 is a graph illustrating a reference spur level of the loop filter of the semiconductor circuit according to some embodiments of the present invention illustrated in FIG. 11A and reference spur levels of the loop filters according to the three comparative examples illustrated in FIGS. 13, 15A-15C, and 17.

FIG. 19 is a graph illustrating a reference spur level of the loop filters according to the embodiments of the present invention illustrated in FIGS. 11B and 11C and reference spur levels of the loop filters according to some embodiments of the present inventions illustrated in FIGS. 13 and 17.

Figure 20:
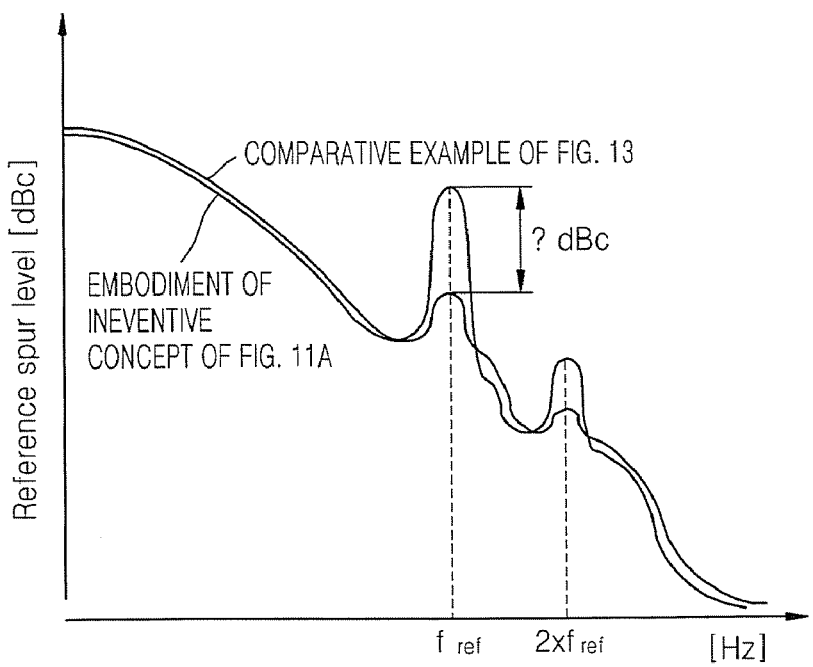
FIG. 20 illustrates a frequency peak of the loop filter of the semiconductor circuit according to some embodiments of the present invention illustrated in FIG. 11A and frequency peaks of the loop filter according to some embodiments of the present invention illustrated in FIG. 13.

FIG. 20 is a graph illustrating a reference spur level of the semiconductor circuit according to some embodiments of the present invention illustrated in FIG. 11A and the reference spur level of the loop filter according to some embodiments of the present invention illustrated in FIG. 13.

Referring to FIGS. 19 and 20, the reference spur level of the loop filters according to the embodiments of the present invention illustrated in FIGS. 11B and 11C is lower than the reference spur levels of the loop filters according to some embodiments of the present inventions illustrated in FIGS. 13 and 17.

Figure 21A:
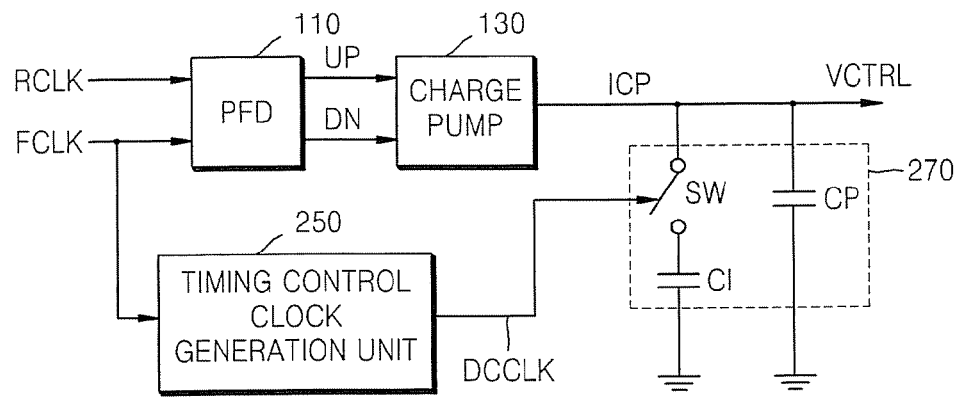
FIG. 21A illustrates a loop filter according to some embodiments of the present invention.

FIG. 21A illustrates a loop filter according to some embodiments of the present invention.

Although it will be hereinafter illustrated that the loop filter of FIG. 21A is as the loop filter 200 included in the PLL of FIG. 1, the loop filter of FIG. 21A may not only be used as the loop filter 200 of FIG. 1 but also used as loop filters included in other circuits.

Referring to FIG. 21A, the loop filter according to some embodiments of the present invention includes a timing control clock generation circuit 250 and a variable capacitor circuit 270. For convenience of explanation, the PFD 110 and the charge pump 130 are also shown in FIG. 21A.

The variable capacitor circuit 270 is charged or discharged by the charge pump current $I_{CP}$. When the up signal UP is received and the charge pump current $I_{CP}$ flows from the charge pump 130 to the variable capacitor circuit 270, the variable capacitor circuit 270 is charged, and thus the amount of charge of the variable capacitor circuit 270 increases. When the down signal DN is received and the charge pump current $I_{CP}$ flows from the variable capacitor circuit 270 to the charge pump 130, the variable capacitor circuit 270 is discharged, and thus the amount of charge of the variable capacitor circuit 270 decreases.

The amount of charge filled in the variable capacitor circuit 270 during a unit time and the amount of charge released from the variable capacitor circuit 270 during the unit time are determined according to the magnitude of the charge pump current $I_{CP}$. When the magnitude of the charge pump current $I_{CP}$ increases, the amounts of charge filled in and released from the variable capacitor circuit 270 during the unit time increase. When the magnitude of the charge pump current $I_{CP}$ decreases, the amounts of charge filled in and released from the variable capacitor circuit 270 during the unit time decrease. The amounts of charge filled in and released from the variable capacitor circuit 270 during the unit time may also be determined according to the time during which the charge pump current $I_{CP}$ flows in or out of the variable capacitor circuit 270. As the time during which the charge pump current $I_{CP}$ flows in or out of the variable capacitor circuit 270 increases, the amounts of charge filled in and released from the variable capacitor circuit 270 during the unit time increase. As the time during which the charge pump current $I_{CP}$ flows in or out of the variable capacitor circuit 270 decreases, the amounts of charge filled in and released from the variable capacitor circuit 270 during the unit time decrease.

In FIG. 21A, it is illustrated that the loop filter is included in a PLL and that the variable capacitor circuit 270 receives and transmits the charge pump current $I_{CP}$ from and to the charge pump 130. However, the loop filter according to some embodiments of the present invention of FIG. 21A may be included in devices other than a PLL. In this case, the variable capacitor circuit 270 may receive and transmit current to a component other than the charge pump 130.

The control voltage $V_{CTRL}$ is determined according to the amount of charge of the variable capacitor circuit 270. When the amount of charge of the variable capacitor circuit 270 increases, the control voltage $V_{CTRL}$ increases. When the amount of charge of the variable capacitor circuit 270 decreases, the control voltage $V_{CTRL}$ decreases. As described above, the amount of charge of the variable capacitor circuit 270 varies according to whether the charge pump current $I_{CP}$ flows in or out of the variable capacitor circuit 270, the magnitude of the charge pump current $I_{CP}$, and the time during which the charge pump current $I_{CP}$ flows in or out of the variable capacitor circuit 270. Thus, the control voltage $V_{CTRL}$ also varies according to these factors. For example, when the up signal UP is received and the charge pump current $I_{CP}$ flows into the variable capacitor circuit 270, the control voltage $V_{CTRL}$ increases. When the down signal DN is received and the charge pump current $I_{CP}$ flows out of the variable capacitor circuit 270, the control voltage $V_{CTRL}$ decreases. In this way, the loop filter may control the magnitude of the control voltage $V_{CTRL}$ by controlling the amount of charge of the variable capacitor circuit 270.

In the loop filter according to some embodiments of the present invention of FIG. 21A, the capacitance of the variable capacitor circuit 270 may vary. When the capacitance of the variable capacitor circuit 270 varies, the magnitude of a voltage applied to the variable capacitor circuit 270 varies regardless of inflow or outflow of the charge pump current $I_{CP}$ (that is, even without a variation in the amount of charge of the variable capacitor circuit 270). Since the voltage applied to the variable capacitor circuit 270 is the control voltage $V_{CTRL}$, when the capacitance of the variable capacitor circuit 270 is changed, the magnitude of the control voltage $V_{CTRL}$ is also changed. For example, when the charge pump current $I_{CP}$ neither flows in nor out of the variable capacitor circuit 270, if the capacitance of the variable capacitor circuit 270 transitions from a low level to a high level, the control voltage $V_{CTRL}$ is decreased. If the capacitance of the variable capacitor circuit 270 transitions from the high level to the low level, the control voltage $V_{CTRL}$ is increased. If the capacitance of the variable capacitor circuit 270 keeps the low level for a predetermined period of time and then transitions from the low level to the high level, the control voltage $V_{CTRL}$ keeps a high level while the capacitance of the variable capacitor circuit 270 is being in the low level. However, when the capacitance of the variable capacitor circuit 270 transitions from the low level to the high level, the high level of the control voltage $V_{CTRL}$ is decreased. This logic is also applied to a case where the capacitance of the variable capacitor circuit 270 keeps a high level and transitions from the high level to a low level. In this case, the control voltage $V_{CTRL}$ keeps a low level and is then changed from the low level to a high level.

In the loop filter according to some embodiments of the present invention of FIG. 21A, it is randomly determined whether the capacitance of the variable capacitor circuit 270 has a high level or a low level. For example, it may be randomly determined whether the capacitance of the variable capacitor circuit 270 is to remain at a high level or transition from the high level to a low level. In other words, a section where the capacitance of the variable capacitor circuit 270 remains at a high level and a section where the capacitance of the variable capacitor circuit 270 remains at a low level may be controlled to randomly appear.

In a section where the capacitance of the variable capacitor circuit 270 is high, the control voltage $V_{CTRL}$ slowly increases. In a section where the capacitance of the variable capacitor circuit 270 is low, the control voltage $V_{CTRL}$ fast increases. Thus, when the sections where the capacitance of the variable capacitor circuit 270 is high and low randomly appear, it is also randomly determined whether the control voltage $V_{CTRL}$ is to be fast or slowly increased. In sections P1 and P4 of FIG. 22, the control voltage $V_{CTRL}$ fast increases, namely, has shapes A1 and A2. In sections P2 and P3, the control voltage $V_{CTRL}$ slowly increases, namely, has shapes B1 and B2. It is randomly determined whether the control voltage $V_{CTRL}$ is to have shapes A1 and A2 or shapes B1 and B2. In other words, in a situation where the same charge pump current $I_{CP}$ flows in or flows out, it is randomly determined whether an amplitude of the control voltage $V_{CTRL}$ is to be high or low. Thus, reference spur may be distributed to several frequency bands of a frequency domain. As a result, the reference spur level of the loop filter according to some embodiments of the present invention of FIG. 21A can be reduced.

If it is assumed that the capacitance of the variable capacitor circuit 270 is constant, the amplitude of the control voltage $V_{CTRL}$ is also constant, and thus the reference spur level of the loop filter according to some embodiments of the present invention of FIG. 21A cannot be reduced.

The timing control clock generation circuit 250 generates a timing control clock signal DCCLK of which appearance or nonappearance of a first logic state (for example, a logic LOW state) is randomly determined. In sections P1 and P4 of FIG. 22, the logic LOW state of the timing control clock signal DCCLK appears. In sections P2 and P3, the logic LOW state of the timing control clock signal DCCLK does not appear. The timing control clock signal DCCLK may be used to vary the capacitance of the variable capacitor circuit 270.

Figure 22:
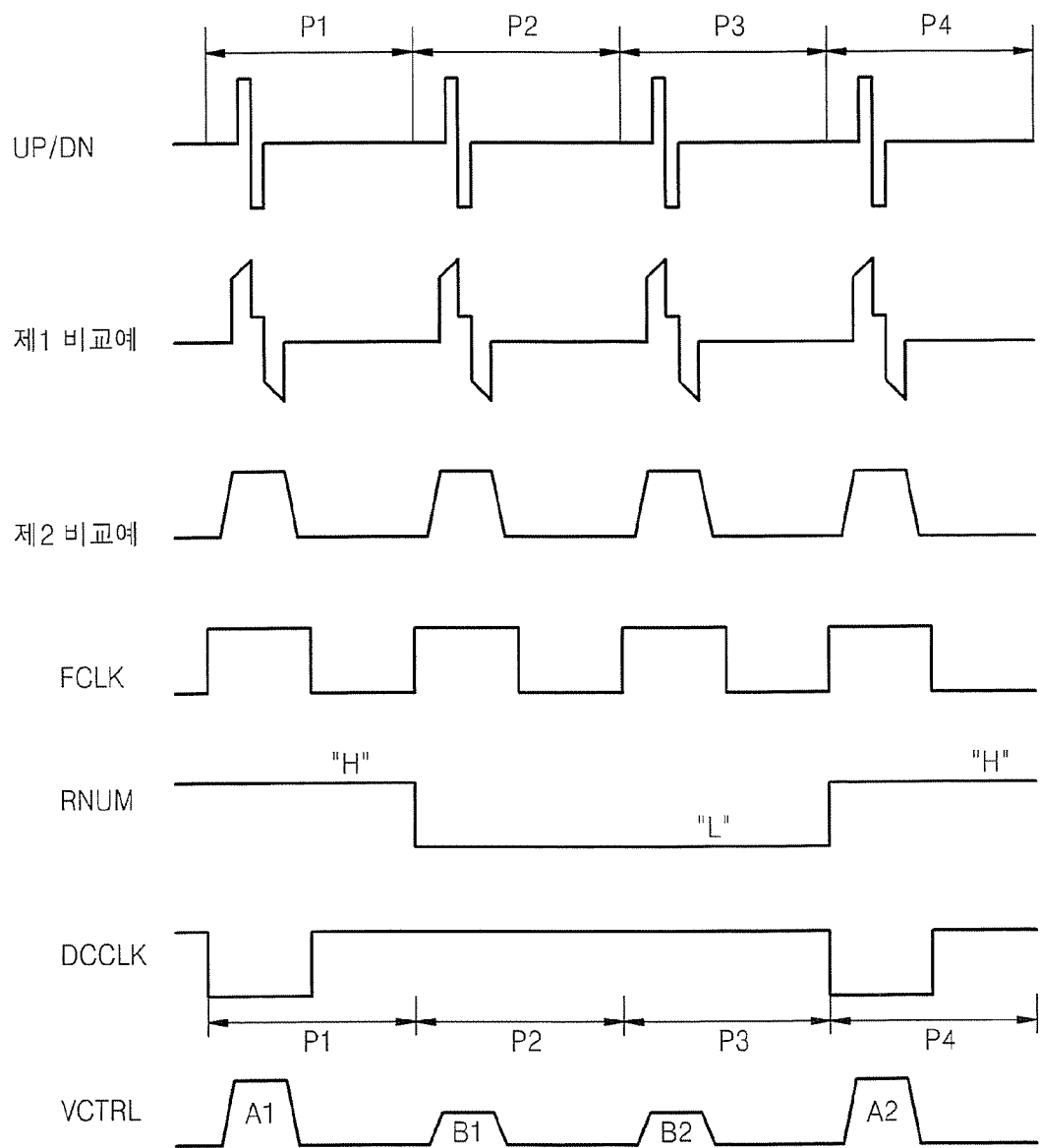
FIG. 22 is a timing diagram illustrating operations of the loop filter illustrated in FIGS. 21A and 21B.

The timing control clock generation circuit 250 may randomly determine whether the first logic state of the timing control clock signal DCCLK is to appear, every cycle of the timing control clock signal DCCLK. For example, the timing control clock generation circuit 250 may randomly determine whether a logic LOW state of the timing control clock signal DCCLK is to appear, every cycle of the timing control clock signal DCCLK. FIG. 22 illustrates an example in which sections P1 and P4 where the timing control clock signal DCCLK has a logic LOW state and sections P2 and P3 where the timing control clock signal DCCLK has a logic HIGH state randomly appear.

The timing control clock generation circuit 250 may generate the timing control clock signal DCCLK by using the feedback clock signal FCLK or the reference clock signal RCLK. For example, referring to FIG. 22, in sections P1 and P4, the timing control clock generation circuit 250 inverts the feedback clock signal FCLK to generate the timing control clock signal DCCLK. In sections P2 and P3, the timing control clock generation circuit 250 generates the timing control clock signal using the feedback clock signal FCLK but does not invert the feedback clock signal FCLK. In other words, a logic HIGH state of the feedback clock signal FCLK appears every cycle, whereas logic LOW states of the timing control clock signal DCCLK that correspond to logic HIGH states of the feedback clock signal FCLK appear only in the sections P1 and P4.

In this case, a cycle of the timing control clock signal DCCLK may be the same as that of the feedback clock signal FCLK (or a cycle of the reference clock signal RCLK). In other words, the timing control clock signal DCCLK may be generated by maintaining the cycle of the feedback clock signal FCLK (or the cycle of the reference clock signal RCLK) and randomly changing the logic state of the feedback clock signal FCLK (or the reference clock signal RCLK).

The capacitance of the variable capacitor circuit 270 may vary according to a logic state of the timing control clock signal DCCLK. The capacitance of the variable capacitor circuit 270 may be high in a second logic state section (for example, a logic HIGH section) of the timing control clock signal DCCLK. The capacitance of the variable capacitor circuit 270 may be low in a first logic state section (for example, a logic LOW section) of the timing control clock signal DCCLK. In this case, the control voltage $V_{CTRL}$ may be gently increased in the second logic state section of the timing control clock signal DCCLK and rapidly increased in the first logic state section of the timing control clock signal DCCLK.

By randomly determining the first logic state section and the second logic state section of the timing control clock signal DCCLK, a section where the capacitance of the variable capacitor circuit 270 is high and a section where the capacitance of the variable capacitor circuit 270 is low may be controlled to randomly appear. Thus, reference spur can be reduced.

Although it has been described above that the capacitance of the variable capacitor circuit 270 is high in the logic HIGH section of the timing control clock signal DCCLK, the capacitance of the variable capacitor circuit 270 may be high in the logic LOW section of the timing control clock signal DCCLK. Although it has been described above that the capacitance of the variable capacitor circuit 270 varies according to the transition of a logic state of the timing control clock signal DCCLK, the capacitance of the variable capacitor circuit 270 may be changed according to other factors. For example, according to an external control signal, the section where the capacitance of the variable capacitor circuit 270 is high and the section where the capacitance of the variable capacitor circuit 270 is low may be controlled to randomly appear. Thus, in some cases, the loop filter according to some embodiments of the present invention of FIG. 21A may not include the timing control clock generation circuit 250.

The variable capacitor circuit 270 may include a switch SW, a first capacitor $C_I$, and a second capacitor $C_P$.

The switch SW is turned on or off according to the timing control clock signal DCCLK. For example, the switch SW may be turned on in the active section of the timing control clock signal DCCLK and turned off in the inactive section of the timing control clock signal DCCLK. Of course, the switch SW may be turned off in the active section of the timing control clock signal DCCLK and turned on in the inactive section of the timing control clock signal DCCLK.

According to whether the switch SW is turned on or off, an overall capacitance of the variable capacitor circuit 270 is changed. More specifically, when the switch SW is turned on, the first capacitor $C_I$ and the second capacitor $C_P$ are connected to each other in parallel. Accordingly, the overall capacitance of the variable capacitor circuit 270 is a sum of the capacitances of the first capacitor $C_I$ and the second capacitor $C_P$. When the switch SW is turned off, the first capacitor $C_I$ is connected to neither the charge pump 130 nor a node where the control voltage $V_{CTRL}$ is generated. In other words, when the switch SW is turned off, an effect where the variable capacitor circuit 270 only includes the second capacitor $C_P$ is generated. Thus, the overall capacitance of the variable capacitor circuit 270 is the same as the capacitance of the second capacitor $C_P$. In other words, when the switch SW is turned on, the overall capacitance of the variable capacitor circuit 270 is increased. When the switch SW is turned off, the overall capacitance of the variable capacitor circuit 270 is decreased.

Figure 21B:
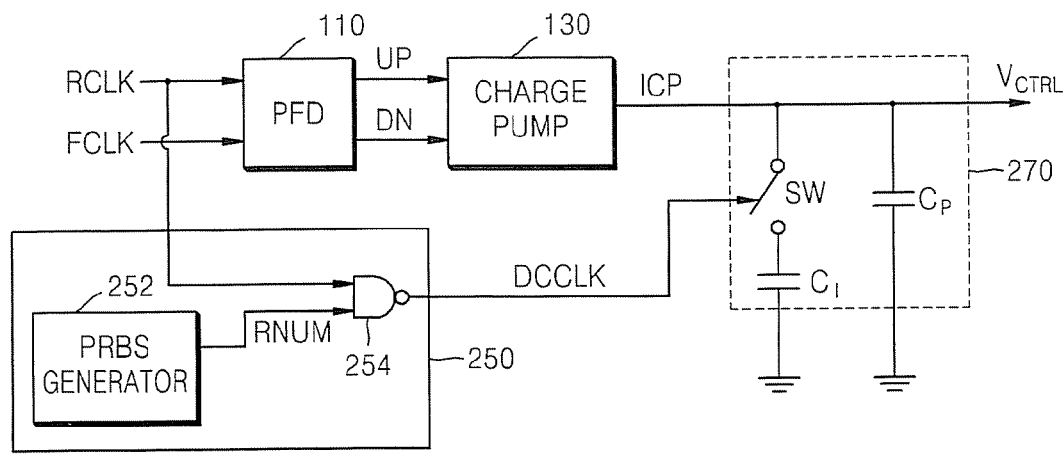
FIG. 21B illustrates, in greater detail, a timing control clock generation circuit of the loop filter illustrated in FIG. 21A.

FIG. 22 is a timing diagram illustrating operations of the loop filter illustrated in FIGS. 21A and 21B.

Referring to FIGS. 21A and 22, in section P1, the up signal UP is received and then the down signal DN is received. While the up signal UP is being received, the charge pump current $I_{CP}$ flows from the charge pump 130 into the loop filter 270. While the down signal DN is being received, the charge pump current $I_{CP}$ flows out of the loop filter 270 and enters the charge pump 130. In section P1, when the timing control clock signal DCCLK transitions to a logic low level (i.e., a first logic level), the switch SW is turned off. Thus, while the up signal UP is being received, the second capacitor $C_P$ is charged by the charge pump current $I_{CP}$. Then, while the down signal DN is being received, the second capacitor $C_P$ is discharged. Meanwhile, in section P1, since the switch SW is turned off, the first capacitor $C_I$ is neither charged nor discharged.

According to the charge pump current $I_{CP}$ flowing in according to the up signal UP, the second capacitor $C_P$ is charged, but the first capacitor $C_I$ is not charged. Thus, the level of the control voltage $V_{CTRL}$ faster increases than a case where the first capacitor $C_I$ and the second capacitor $C_P$ are both charged. According to the charge pump current $I_{CP}$ flowing out according to the down signal DN, the second capacitor $C_P$ is discharged and the first capacitor $C_I$ is not charged. Thus, the level of the control voltage $V_{CTRL}$ faster decreases than a case where the first capacitor $C_I$ and the second capacitor $C_P$ are both discharged. Accordingly, the control voltage $V_{CTRL}$ has an A1 shape of FIG. 22.

In section P2 of FIG. 22, the timing control clock signal DCCLK is logic HIGH (for example, at a second logic level). Thus, the switch SW is turned on. Accordingly, while the up signal UP is being received, the first capacitor $C_I$ and the second capacitor $C_P$ are charged by the charge pump current $I_{CP}$. Thereafter, while the down signal DN is being received, the first capacitor $C_I$ and the second capacitor $C_P$ are discharged.

Since the first capacitor $C_I$ and the second capacitor $C_P$ are both charged by the charge pump current $I_{CP}$ flowing in according to the up signal UP, the level of the control voltage $V_{CTRL}$ slowly increases as compared with a case where only the second capacitor $C_P$ is charged. Since the first capacitor $C_I$ and the second capacitor $C_P$ are both discharged by the charge pump current $I_{CP}$ flowing out according to the down signal DN, the level of the control voltage $V_{CTRL}$ slowly decreases as compared with a case where only the second capacitor $C_P$ is discharged. Accordingly, the control voltage $V_{CTRL}$ has a B1 shape of FIG. 22.

It is illustrated in FIG. 22 that the amplitudes of the up signal UP and the down signal DN are the same. Accordingly, charges filled in the second capacitor $C_P$ in response to the up signal UP are all released therefrom in response to the down signal DN. However, this operation may be changed according to changes in the amplitudes of the up signal UP and the down signal DN and periods of time during which the up signal UP and the down signal DN are applied. Although a case where the loop filter of FIG. 21A receives both the up signal UP and the down signal DN has been described above, some embodiments of the present invention may be applied to a case where the loop filter of FIG. 21A receives only the up signal UP and a case where the loop filter of FIG. 21A receives only the down signal DN.

In the loop filter of FIG. 21A, a section in which the capacitance of the variable capacitor circuit 270 is high and a section in which the capacitance of the variable capacitor circuit 270 is low may be randomly generated by randomly determining a section where the timing control clock signal DCCLK is at the first logic state and a section where the timing control clock signal DCCLK is at the second logic state. Thus, the reference spur of the loop filter of FIG. 21A can be reduced. To achieve this process, the loop filter of FIG. 21A may only have to include a variable capacitor circuit. Thus, the variable capacitor circuit of FIG. 21A can effectively reduce reference spur even without including a complicate circuit structure.

Although the variable capacitor circuit 270 includes the switch SW, the first capacitor $C_I$, and the second capacitor $C_P$ in FIG. 21A, the variable capacitor circuit 270 may have other structures. In other words, the variable capacitor circuit 270 may be configured in other ways so long as the capacitance of the variable capacitor circuit 270 can vary according to the logic state of the timing control clock signal DCCLK.

In this case, in a section where the up signal UP is received, the variable capacitor circuit 270 is charged, and thus the control voltage $V_{CTRL}$ increases. In a section where the up signal UP is not received, the charging of the variable capacitor circuit 270 is stopped, and thus the level of the control voltage $V_{CTRL}$ is maintained. When the timing control clock signal DCCLK transitions from logic LOW to logic HIGH, the capacitance of the variable capacitor circuit 270 is greater than the capacitance of the variable capacitor circuit 270 when the timing control clock signal DCCLK is logic LOW. Thus, even when the charge pump current $I_{CP}$ does not flow in the variable capacitor circuit 270, that is, the amount of charge of the variable capacitor circuit 270 does not change, the control voltage $V_{CTRL}$ is decreased.

FIG. 21B illustrates, in greater detail, the timing control clock generation circuit 250 of the loop filter illustrated in FIG. 21A.

Referring to FIG. 21B, the timing control clock generation circuit 250 may include a random number generator 252 and a logic operation circuit 254. The random number generator 260 generates a random number signal RNUM. The random number generator 260 may be a PRBS generator 260.

The logic operation circuit 254 performs a logic operation on the logic state of the reference clock signal RCLK and the logic state of the random number signal RNUM to generate the timing control clock signal DCCLK. For example, the logic operation circuit 254 may perform a NAND operation on the reference clock signal RCLK and the random number signal RNUM to generate the timing control clock signal DCCLK. Of course, the NAND logic operation is just an example, and the timing control clock signal DCCLK of FIG. 22 may be generated by other types of logic operations.

Although it is illustrated in FIG. 21B that the timing control clock signal DCCLK is generated using the reference clock signal RCLK, the timing control clock signal DCCLK may be generated using the feedback clock signal FCLK.

Although the random number generator 252 includes the timing control clock generation circuit 250 in FIG. 21B, the random number generator 252 may be installed outside the timing control clock generation circuit 250.

Figure 23:
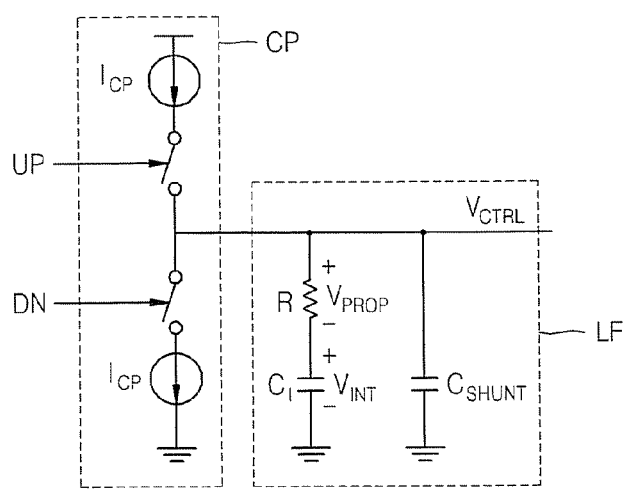
FIG. 23 is a circuit diagram of a loop filter according to some embodiments of the present invention.

FIG. 23 is a circuit diagram of a loop filter according to some embodiments of the present invention. For convenience of explanation, the charge pump 130 is also illustrated in FIG. 23.

Referring to FIG. 23, the loop filter 400 according to some embodiments of the present invention includes a resistor R and two capacitors $C_I$ and $C_{SHUNT}$. Compared with the loop filter of FIGS. 2A and 2B, the loop filter 400 according to some embodiments of the present invention of FIG. 23 includes the resistor R instead of the switch SW, and capacitance does not vary.

Figure 24A:
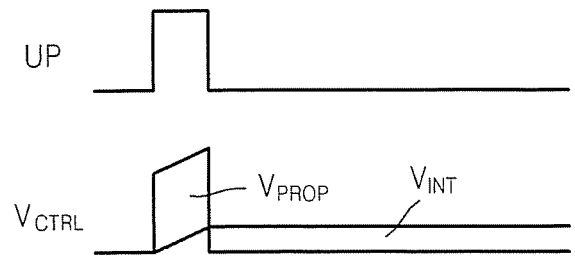
FIG. 24A is a timing diagram illustrating operations of the loop filter illustrated in FIG. 23.

FIG. 24A is a timing diagram illustrating operations of the loop filter 400 according to some embodiments of the present invention of FIG. 23.

Referring to FIG. 24A, while the up signal UP is being received, the charge pump current $I_{CP}$ flows into the loop filter 400. The charge pump current $I_{CP}$ allows a voltage $V_{PROP}$ to be applied to the resistor R and allows the capacitor $C_I$ to be charged. Thus, while the up signal UP is being received, the level of the control voltage $V_{CTRL}$ is a sum of the voltage $V_{PROP}$ applied to the resistor R and a voltage $V_{INT}$ of the capacitor $C_I$. While the up signal UP is being received, the voltage of the capacitor $C_I$ increases in proportion to the capacitance of the capacitor $C_I$. Next, when the reception of the up signal UP is stopped, no more voltage is applied to the resistor R, and the charge of the capacitor $C_I$ is maintained without any increase or decrease. Thus, the control voltage $V_{CTRL}$ is the voltage $V_{INT}$ of the capacitor $C_I$.

As described above, in the loop filter 400 according to some embodiments of the present invention of FIG. 23, while the up signal UP is being received, a high voltage, namely, the voltage $V_{PROP}$, is applied to the resistor R. This phenomenon is referred to as reference spur. However, referring to FIG. 22, in the loop filter according to some embodiments of the present invention of FIGS. 21A and 21B, charges provided by the charge pump current $I_{CP}$ are spread over the inactive section of the timing control clock signal DCCLK. Thus, a voltage applied to the loop filter according to some embodiments of the present invention of FIGS. 21A and 21B is less than a voltage applied to the loop filter 400 according to some embodiments of the present invention of FIG. 23. As a result, the loop filter according to some embodiments of the present invention of FIGS. 21A and 21B can reduce reference spur.

Figure 24B:
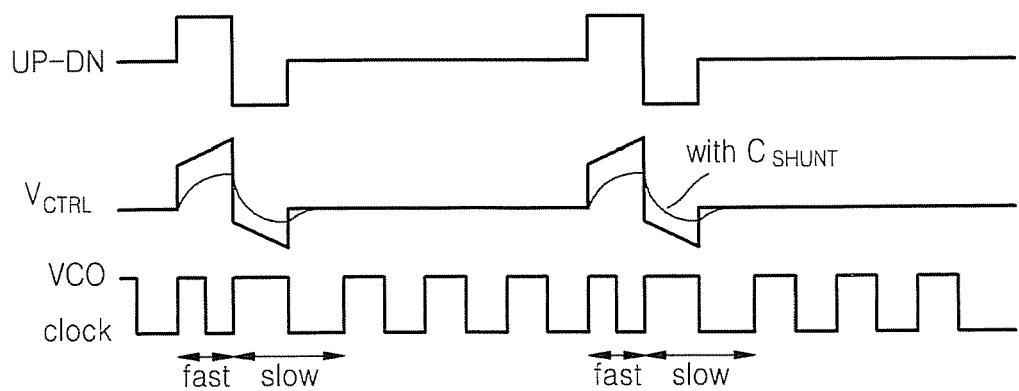
FIG. 24B is another timing diagram illustrating operations of the loop filter illustrated in FIG. 23.
Figure 24C:
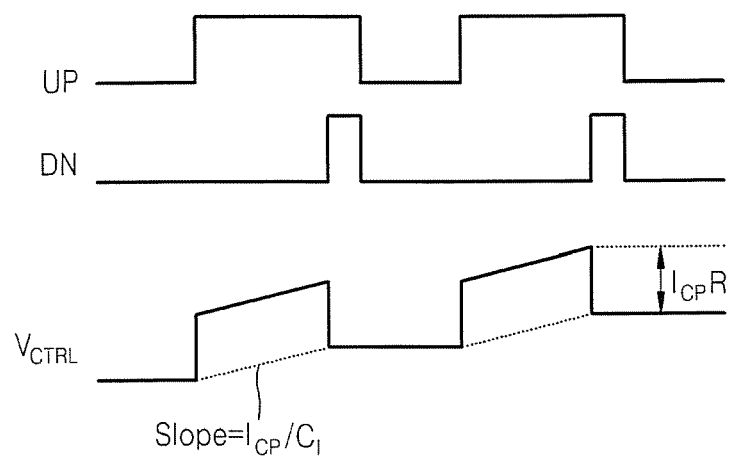
FIG. 24C is another timing diagram illustrating operations of the loop filter illustrated in FIG. 23.

FIG. 24B is another timing diagram illustrating operations of the loop filter 400 according to some embodiments of the present invention of FIG. 23.

Referring to FIG. 24B, when the loop filter 400 receives both the up signal UP and the down signal DN, the loop filter 400 according to some embodiments of the present invention of FIG. 23 repeats an operation in which the control voltage $V_{CTRL}$ increases and then decreases. A straight line of a second waveform of FIG. 24B indicates a variation in the control voltage $V_{CTRL}$ when the loop filter 400 of FIG. 23 includes only the first capacitor $C_I$, and a curved line of the second waveform indicates a variation in the control voltage $V_{CTRL}$ when the loop filter 400 of FIG. 23 includes both the first capacitor $C_I$ and the second capacitor $C_{SHUNT}$. If the loop filter 400 of FIG. 23 includes the second capacitor $C_{SHUNT}$, the number of ripples of the control voltage $V_{CTRL}$ decreases. However, in this case, reference spur in which a relatively high voltage is applied to the resistor R still exists.

Figure 25A:
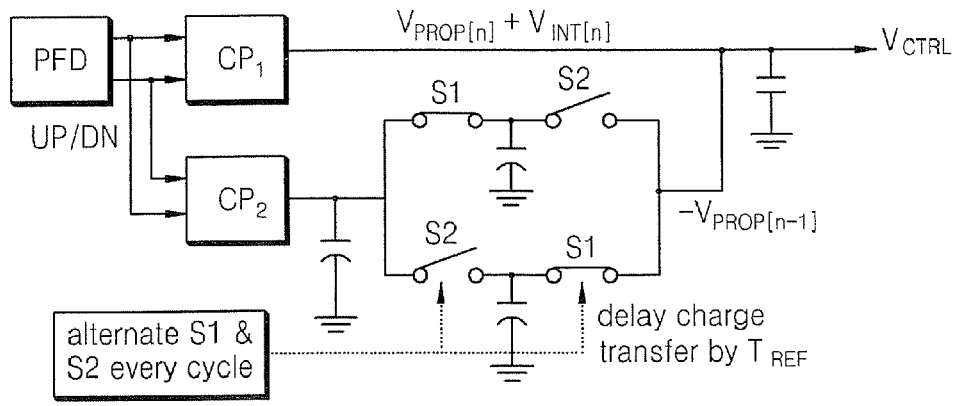
FIGS. 25A through 25C are circuit diagrams of a loop filter according to further embodiments of the present invention.
Figure 25B:
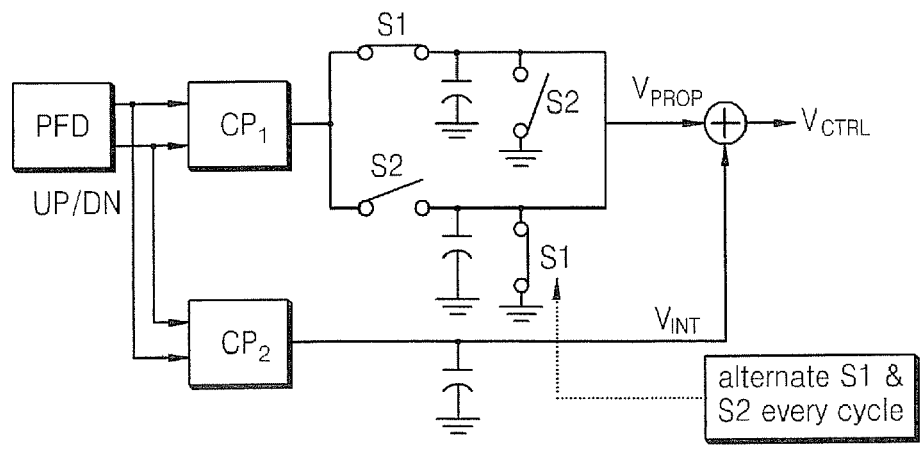
Figure 25C:
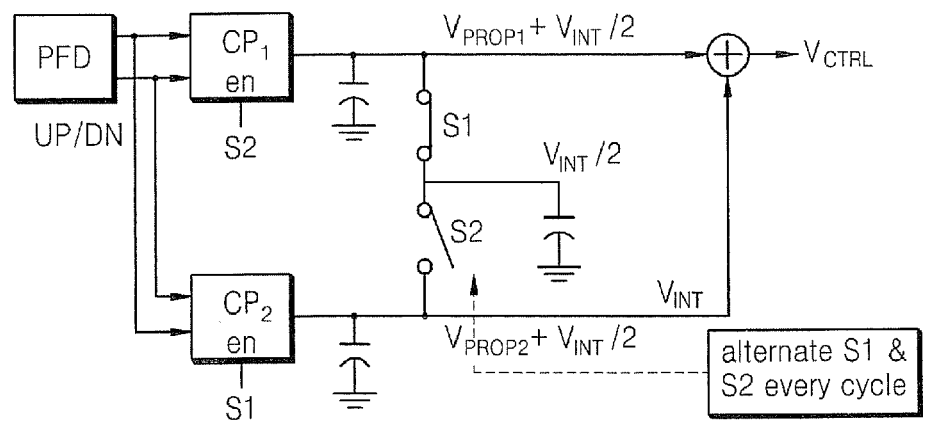

FIGS. 25A through 25C are circuit diagrams of a loop filter according to further embodiments of the present invention. For convenience of explanation, a PFD and charge pumps $CP_1$ and $CP_2$ are shown in FIGS. 25A through 25C.

Figure 26:
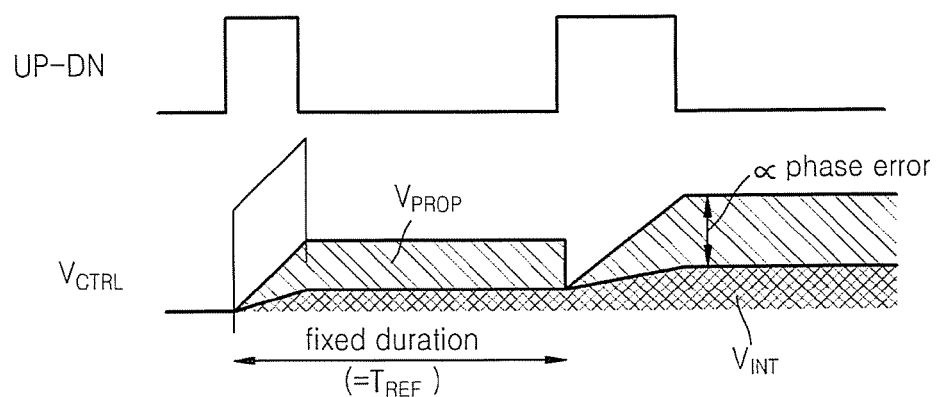
FIG. 26 is a timing diagram illustrating operations of the loop filter illustrated in FIGS. 25A through 25C.

FIG. 26 is a timing diagram illustrating operations of the loop filter illustrated in FIGS. 25A through 25C.

Referring to FIG. 26, in the loop filter of FIGS. 25A through 25C, charges provided by the charge pump current $I_{CP}$ flowing in according to the up signal UP are divided in a section where the up signal UP is not received. Thus, similar to the loop filter according to some embodiments of the present invention of FIGS. 21A and 21B, the loop filter according to some embodiments of the present invention of FIGS. 25A through 25C may reduce reference spur. However, to reduce the reference spur, as illustrated in FIGS. 25A through 25C, the loop filter according to the current comparative example need to include complicate circuits. However, the loop filter according to some embodiments of the present invention of FIGS. 21A and 21B may reduce reference spur while including only a variable capacitor circuit. Thus, compared with the loop filter according to some embodiments of the present invention of FIGS. 25A through 25C, the loop filter according to some embodiments of the present invention of FIGS. 21A and 21B may effectively reduce reference spur even without including a complicate circuit structure.

Figure 27:
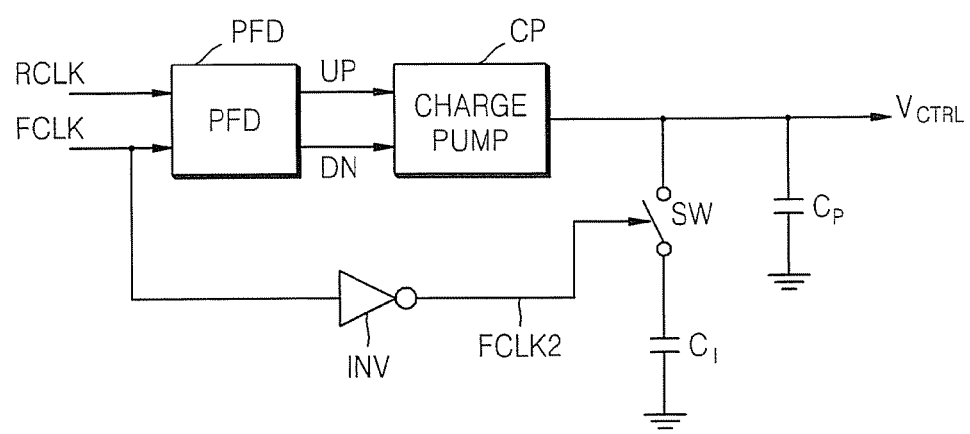
FIG. 27 is a circuit diagram of a loop filter according to further embodiments of the present invention.

FIG. 27 is a circuit diagram of a loop filter according to further embodiments of the present invention. For convenience of explanation, the PFD 110 and the charge pump 130 are also shown in FIG. 27.

Referring to FIG. 27, the loop filter according to further embodiments of the present invention inverts the feedback clock signal FCLK to generate a delayed clock signal FCLK2 for controlling a turn on-off moment of the switch SW. Thus, a duty cycle of the delayed clock signal FCLK2 is the same as a duty cycle of the feedback clock signal FCLK.

Figure 28A:
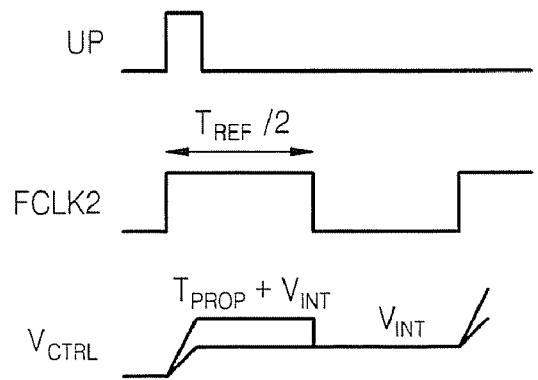
FIG. 28A is a timing diagram illustrating operations of the loop filter illustrated in FIG. 27.

FIG. 28A is a timing diagram illustrating operations of the loop filter according to some embodiments of the present invention illustrated in FIG. 27.

Referring to FIG. 28A, each of an inactive section and an active section of the delayed clock signal FCLK2 is half the cycle of the delayed clock signal FCLK2. In other words, the inactive section and the active section of the delayed clock signal FCLK2 has the same length. Thus, in the loop filter according to some embodiments of the present invention of FIG. 27, the amount of charge provided by the charge pump current flowing in according to the up signal UP is distributed to the first capacitor $C_I$ and the second capacitor $C_P$ during a half of the cycle of the delayed clock signal FCLK2. However, in the loop filter according to some embodiments of the present invention of FIGS. 21A and 21B, charges provided by the charge pump current are distributed to and stored in the first and second capacitors $C_I$ and $C_P$ over the inactive section of the timing control clock signal DCCLK. Here, the inactive section of the timing control clock signal DCCLK is controlled to be longer than the active section thereof.

Thus, the time during which charges provided by the charge pump current in the loop filter according to some embodiments of the present invention of FIG. 27 are distributed and stored is longer than the time during which charges provided by the charge pump current in the loop filter according to some embodiments of the present invention of FIGS. 21A and 21B are distributed and stored. Accordingly, the loop filter according to some embodiments of the present invention of FIGS. 21A and 21B may reduce reference spur as compared with the loop filter according to some embodiments of the present invention of FIG. 27.

Figure 28B:
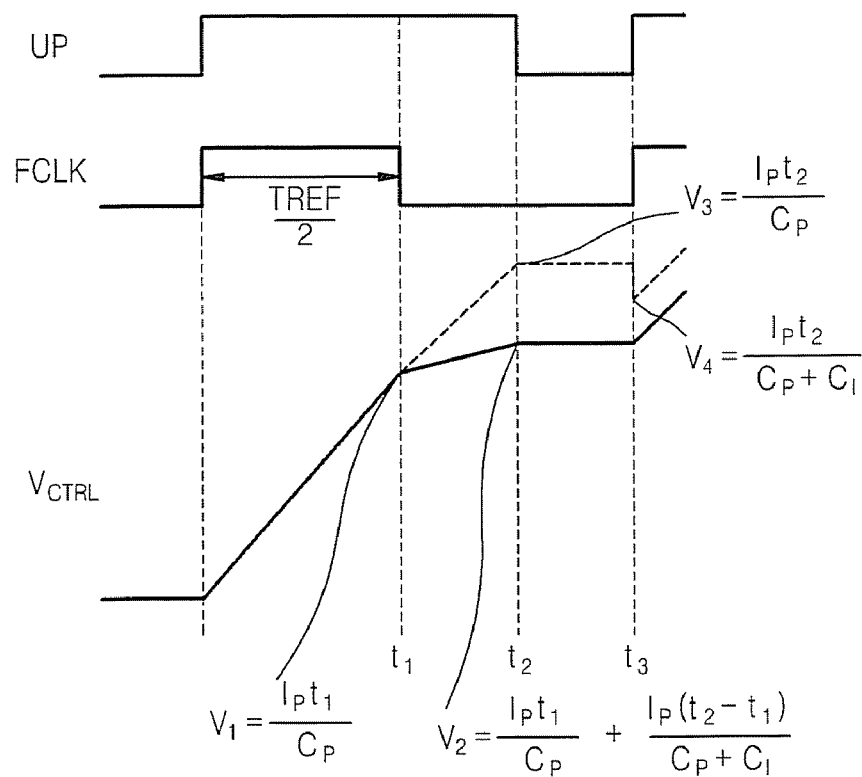
FIG. 28B is another timing diagram illustrating operations of the loop filter illustrated in FIG. 27.

FIG. 28B is another timing diagram illustrating operations of the loop filter according to some embodiments of the present invention illustrated in FIG. 27.

FIG. 28B illustrates a situation where the up signal UP is supplied for a period of time longer than half the cycle of the feedback clock signal FCLK. In this case, even after the feedback clock signal FCLK is inactivated, the up signal UP is continuously supplied. In a section between time points t1 and t2, charges provided by the charge pump current are distributed to and stored in the first and second capacitors $C_I$ and $C_P$, and thus an increasing rate of the control voltage $V_{CTRL}$ slows down. A dotted line of FIG. 28B indicates a case where charges provided by the charge pump current are filled in only the second capacitor $C_P$, and a solid line of FIG. 28B indicates a case where charges provided by the charge pump current are distributed to and stored in the first and second capacitors $C_I$ and $C_P$. As illustrated in the dotted line of FIG. 28B, when the increasing rate of the control voltage $V_{CTRL}$ slows down, the control voltage $V_{CTRL}$ is proportional to a period of time during which the up signal UP is supplied, and thus the control voltage $V_{CTRL}$ fails to properly express the up signal UP. However, the loop filter according to some embodiments of the present invention of FIGS. 21A and 21B may delay a point in time when the timing control clock signal DCCLK is activated to a point in time after the supply of the up signal UP is stopped. In the loop filter according to some embodiments of the present invention of FIGS. 21A and 21B, charges are filled in only the second capacitor $C_P$ before the timing control clock signal DCCLK is activated, and charges filled in the second capacitor $C_P$ are shared by the first and second capacitors $C_I$ and $C_P$ after the timing control clock signal DCCLK is activated. Thus, while the up signal UP is being supplied, the loop filter according to some embodiments of the present invention of FIGS. 21A and 21B increase the control voltage $V_{CTRL}$ in proportion to the duration of the supply of the up signal UP. When the supply of the up signal UP is stopped, the loop filter according to some embodiments of the present invention of FIGS. 21A and 21B activate the timing control clock signal DCCLK and reduce the control voltage $V_{CTRL}$.

Figure 29:
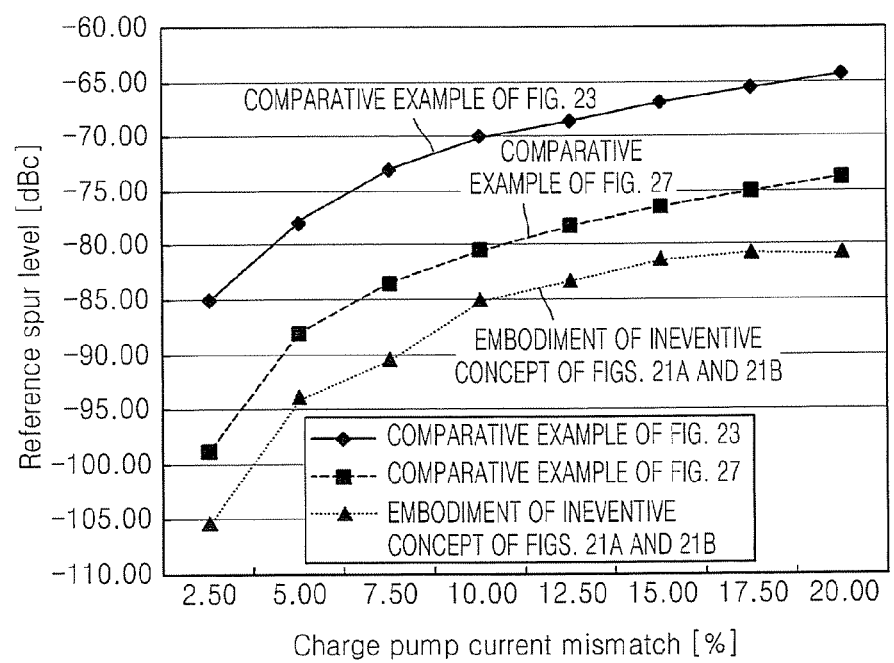
FIG. 29 is a graph illustrating a reference spur level of the loop filter according to some embodiments of the present invention illustrated in FIGS. 21A and 21B and reference spur levels of the loop filters according to the three comparative examples illustrated in FIGS. 23, 25A-25C, and 27.

FIG. 29 is a graph illustrating a reference spur level of the loop filter according to some embodiments of the present invention illustrated in FIGS. 21A and 21B and reference spur levels of the loop filters according to some embodiments of the present inventions illustrated in FIGS. 23 and 27.

Referring to FIG. 29, the reference spur level of the loop filter according to some embodiments of the present invention illustrated in FIGS. 21A and 21B is lower than the reference spur levels of the loop filters according to some embodiments of the present inventions illustrated in FIGS. 23 and 27.

Methods of operating the loop filter according to some embodiments of the present invention illustrated in FIGS. 21A and 21B is methods of operating a loop filter including a first capacitor and a second capacitor.

Methods of operating the loop filter according to some embodiments of the present invention illustrated in FIGS. 21A and 21B includes the operations of randomly determining whether the timing control clock signal DCCLK has only a first logic state or only a second logic state, every cycle of the timing control clock signal DCCLK; charging only the second capacitor $C_P$ according to the charge pump current $I_{CP}$ in a section where the timing control clock signal DCCLK is in the first logic state; and charging both the first capacitor $C_I$ and the second capacitor $C_P$ according to the charge pump current $I_{CP}$ in a section where the timing control clock signal DCCLK is in the second logic state.

Since it is randomly determined whether the timing control clock signal DCCLK is in the first or second logic state, it is randomly determined whether the control voltage $V_{CTRL}$ is to fast or slowly increase. In other words, in a situation where the same charge pump current $I_{CP}$ flows in or out, it is randomly determined whether the amplitude of the control voltage $V_{CTRL}$ is high or low. Accordingly, reference spur may be distributed to several frequency bands of a frequency domain. As a result, the reference spur level of the loop filter according to some embodiments of the present invention of FIGS. 21A and 21B can be reduced.

Figure 30A:
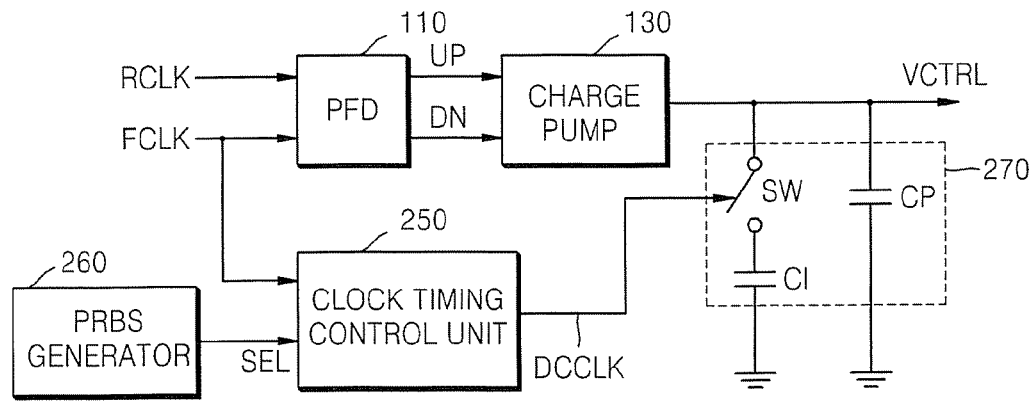
FIG. 30A illustrates a loop filter according to some embodiments of the present invention.

FIG. 30A illustrates a loop filter according to some embodiments of the present invention.

Although it will be hereinafter illustrated that the loop filter of FIG. 30A is as the loop filter 200 included in the PLL of FIG. 1, the loop filter of FIG. 30A may not only be used as the loop filter 200 of FIG. 1 but also used as loop filters included in other circuits.

Referring to FIG. 30A, the loop filter according to some embodiments of the present invention includes a clock timing control circuit 250 and a variable capacitor circuit 270. For convenience of explanation, the PFD 110 and the charge pump 130 are also shown in FIG. 30A.

The variable capacitor circuit 270 is charged or discharged by the charge pump current $I_{CP}$. When the up signal UP is received and the charge pump current $I_{CP}$ flows from the charge pump 130 to the variable capacitor circuit 270, the variable capacitor circuit 270 is charged, and thus the amount of charge of the variable capacitor circuit 270 increases. When the down signal DN is received and the charge pump current $I_{CP}$ flows from the variable capacitor circuit 270 to the charge pump 130, the variable capacitor circuit 270 is discharged, and thus the amount of charge of the variable capacitor circuit 270 decreases.

The amount of charge filled in the variable capacitor circuit 270 during a unit time and the amount of charge released from the variable capacitor circuit 270 during the unit time are determined according to the magnitude of the charge pump current $I_{CP}$. When the magnitude of the charge pump current $I_{CP}$ increases, the amounts of charge filled in and released from the variable capacitor circuit 270 during the unit time increase. When the magnitude of the charge pump current $I_{CP}$ decreases, the amounts of charge filled in and released from the variable capacitor circuit 270 during the unit time decrease. The amounts of charge filled in and released from the variable capacitor circuit 270 during the unit time may also be determined according to the time during which the charge pump current $I_{CP}$ flows in or out of the variable capacitor circuit 270. As the time during which the charge pump current $I_{CP}$ flows in or out of the variable capacitor circuit 270 increases, the amounts of charge filled in and released from the variable capacitor circuit 270 during the unit time increase. As the time during which the charge pump current $I_{CP}$ flows in or out of the variable capacitor circuit 270 decreases, the amounts of charge filled in and released from the variable capacitor circuit 270 during the unit time decrease.

In FIG. 30A, it is illustrated that the loop filter is included in a PLL and that the variable capacitor circuit 270 receives and transmits the charge pump current $I_{CP}$ from and to the charge pump 130. However, the loop filter according to some embodiments of the present invention of FIG. 30A may be included in devices other than a PLL. In this case, the variable capacitor circuit 270 may receive and transmit current to a component other than the charge pump 130.

The control voltage $V_{CTRL}$ is determined according to the amount of charge of the variable capacitor circuit 270. When the amount of charge of the variable capacitor circuit 270 increases, the control voltage $V_{CTRL}$ increases. When the amount of charge of the variable capacitor circuit 270 decreases, the control voltage $V_{CTRL}$ decreases. As described above, the amount of charge of the variable capacitor circuit 270 varies according to whether the charge pump current $I_{CP}$ flows in or out of the variable capacitor circuit 270, the magnitude of the charge pump current $I_{CP}$, and the time during which the charge pump current $I_{CP}$ flows in or out of the variable capacitor circuit 270. Thus, the control voltage $V_{CTRL}$ also varies according to these factors. For example, when the up signal UP is received and the charge pump current $I_{CP}$ flows into the variable capacitor circuit 270, the control voltage $V_{CTRL}$ increases. When the down signal DN is received and the charge pump current $I_{CP}$ flows out of the variable capacitor circuit 270, the control voltage $V_{CTRL}$ decreases. In this way, the loop filter may control the magnitude of the control voltage $V_{CTRL}$ by controlling the amount of charge of the variable capacitor circuit 270.

In the loop filter according to some embodiments of the present invention of FIG. 30A, the capacitance of the variable capacitor circuit 270 may vary. When the capacitance of the variable capacitor circuit 270 varies, the magnitude of a voltage applied to the variable capacitor circuit 270 varies regardless of inflow or outflow of the charge pump current $I_{CP}$ (that is, even without a variation in the amount of charge of the variable capacitor circuit 270). Since the voltage applied to the variable capacitor circuit 270 is the control voltage $V_{CTRL}$, when the capacitance of the variable capacitor circuit 270 is changed, the magnitude of the control voltage $V_{CTRL}$ is also changed. For example, when the charge pump current $I_{CP}$ neither flows in nor out of the variable capacitor circuit 270, if the capacitance of the variable capacitor circuit 270 transitions from a low level to a high level, the control voltage $V_{CTRL}$ is decreased. If the capacitance of the variable capacitor circuit 270 transitions from the high level to the low level, the control voltage $V_{CTRL}$ is increased. If the capacitance of the variable capacitor circuit 270 keeps the low level for a predetermined period of time and then transitions from the low level to the high level, the control voltage $V_{CTRL}$ keeps a high level while the capacitance of the variable capacitor circuit 270 is being in the low level. However, when the capacitance of the variable capacitor circuit 270 transitions from the low level to the high level, the high level of the control voltage $V_{CTRL}$ is decreased. This logic is also applied to a case where the capacitance of the variable capacitor circuit 270 keeps a high level and transitions from the high level to a low level. In this case, the control voltage $V_{CTRL}$ keeps a low level and is then changed from the low level to a high level.

In the loop filter of FIG. 30A, a timing when the capacitance of the variable capacitor circuit 270 is changed is randomly determined. For example, a timing when the capacitance of the variable capacitor circuit 270 transitions from in a low level to a high level may be randomly determined. In other words, a period of time during which the capacitance of the variable capacitor circuit 270 is maintained at the low level may be randomly determined. If the timing when the capacitance of the variable capacitor circuit 270 transitions from the low level to the high level is randomized (that is, if the period of time during which the capacitance of the variable capacitor circuit 270 is maintained at the low level is randomized), a timing when the level of the control voltage $V_{CTRL}$ is decreased is randomized. In other words, a period of time during which the level of the control voltage $V_{CTRL}$ is maintained high is increased. Accordingly, a reference spur level of the loop filter of FIG. 30A may be decreased.

If it is assumed that the timing when the capacitance of the variable capacitor circuit 270 is changed is fixed, the timing when the level of the control voltage $V_{CTRL}$ is changed is also fixed. Accordingly, a constant level of reference spur is generated.

In the loop filter of FIG. 30A, the timing when the capacitance of the variable capacitor circuit 270 is changed may be randomly determined within a time range that allows the capacitance of the variable capacitor circuit 270 to be changed after inflow or outflow of the charge pump current $I_{CP}$ is stopped. While the charge pump current $I_{CP}$ is flowing in or flowing out of the variable capacitor circuit 270, the variable capacitor circuit 270 is charged or discharged, and thus the level of the control voltage $V_{CTRL}$ changes. When the capacitance of the variable capacitor circuit 270 is changed, the level of the control voltage $V_{CTRL}$ is changed. If the capacitance of the variable capacitor circuit 270 is changed before inflow or outflow of the charge pump current $I_{CP}$ is stopped, while the variable capacitor circuit 270 is being charged or discharged, that is, while the level of the control voltage $V_{CTRL}$ is changing, the level of the control voltage $V_{CTRL}$ is affected by the change of the capacitance of the variable capacitor circuit 270. In this case, the change in the level of the control voltage $V_{CTRL}$ due to the inflow or outflow of the charge pump current $I_{CP}$ concurs with the change in the level of the control voltage $V_{CTRL}$ due to the change of the capacitance of the variable capacitor circuit 270. Thus, the inflow or outflow of the charge pump current $I_{CP}$ cannot be accurately reflected in the control voltage $V_{CTRL}$. However, in the loop filter of FIG. 30A, since the capacitance of the variable capacitor circuit 270 may be changed after the inflow or outflow of the charge pump current $I_{CP}$ is stopped, the inflow or outflow of the charge pump current $I_{CP}$ may be accurately reflected in the control voltage $V_{CTRL}$.

A duration of inflow or outflow of the charge pump current $I_{CP}$ is typically short. Thus, in the loop filter of FIG. 30A, the timing when the capacitance of the variable capacitor circuit 270 is changed may be randomly determined so that a period of time during which the charge pump current $I_{CP}$ is flowing in or flowing out of the variable capacitor circuit 270 is slightly longer than the typical duration of inflow or outflow of the charge pump current $I_{CP}$.

The clock timing control circuit 250 generates the timing control clock signal DCCLK of which logic state transition timing is randomly determined. The clock timing control circuit 250 may generate the timing control clock signal DCCLK using the feedback clock signal FCLK or the reference clock signal RCLK. In other words, the clock timing control circuit 250 may generate the timing control clock signal DCCLK by randomly controlling a timing when the logic state of the feedback clock signal FCLK transitions, or by randomly controlling a timing when the logic state of the reference clock signal RCLK transitions. In this case, a cycle of the timing control clock signal DCCLK may be the same as that of the feedback clock signal FCLK (or a cycle of the reference clock signal RCLK). In other words, the timing control clock signal DCCLK may be generated by maintaining the cycle of the feedback clock signal FCLK (or the cycle of the reference clock signal RCLK) and randomizing a timing when the logic state of the feedback clock signal FCLK (or the reference clock signal RCLK) transitions.

The clock timing control circuit 250 may randomly select one of a plurality of clock signals having different timings in order to generate the timing control clock signal DCCLK having a random logic state transition timing. To generate the plurality of clock signals having different timings, the clock timing control circuit 250 may delay the feedback clock signal FCLK or the reference clock signal RCLK by different time periods. Of course, the plurality of clock signals having different timings may be generated using an external clock signal.

The capacitance of the variable capacitor circuit 270 may vary according to a logic state of the timing control clock signal DCCLK. The capacitance of the variable capacitor circuit 270 may be high in an active section (for example, a logic HIGH section) of the timing control clock signal DCCLK. The capacitance of the variable capacitor circuit 270 may be low in an inactive section (for example, a logic LOW section) of the timing control clock signal DCCLK. In this case, even when neither inflow nor outflow of the charge pump current $I_{CP}$ occurs, the control voltage $V_{CTRL}$ may be decreased in the active section (for example, a logic HIGH section) of the timing control clock signal DCCLK and increased in the inactive section (for example, a logic HIGH section) of the timing control clock signal DCCLK.

By randomly determining the timing when the logic state of the timing control clock signal DCCLK transitions, the timing when the capacitance of the variable capacitor circuit 270 is changed may be randomized, and the duration when the capacitance of the variable capacitor circuit 270 is maintained may be randomized. For example, the duration when the capacitance of the variable capacitor circuit 270 is maintained at the low level may be randomized. In this case, by randomly determining the timing when the logic state of the timing control clock signal DCCLK transitions, the duration when the level of the control voltage $V_{CTRL}$ is maintained high may be randomized, and thus reference spur can be reduced.

Although it has been described above that the capacitance of the variable capacitor circuit 270 is high in the active section of the timing control clock signal DCCLK, the capacitance of the variable capacitor circuit 270 may be low in the active section of the timing control clock signal DCCLK. Although it has been described above that the capacitance of the variable capacitor circuit 270 varies by the transition of a logic state of the timing control clock signal DCCLK, the capacitance of the variable capacitor circuit 270 may be changed according to other factors, and the timing when the capacitance of the variable capacitor circuit 270 is changed may be controlled. For example, according to an external control signal, the capacitance of the variable capacitor circuit 270 may be changed, and the timing when the capacitance of the variable capacitor circuit 270 is changed may be randomized. Thus, the loop filter according to some embodiments of the present invention of FIG. 30A may not include the clock timing control circuit 250.

The variable capacitor circuit 270 may include a switch SW, a first capacitor $C_I$, and a second capacitor $C_P$.

The switch SW is turned on or off according to the timing control clock signal DCCLK. For example, the switch SW may be turned on in the active section of the timing control clock signal DCCLK and turned off in the inactive section of the timing control clock signal DCCLK. Of course, the switch SW may be turned off in the active section of the timing control clock signal DCCLK and turned on in the inactive section of the timing control clock signal DCCLK.

According to whether the switch SW is turned on or off, an overall capacitance of the variable capacitor circuit 270 is changed. More specifically, when the switch SW is turned on, the first capacitor $C_I$ and the second capacitor $C_P$ are connected to each other in parallel. Accordingly, the overall capacitance of the variable capacitor circuit 270 is a sum of the capacitances of the first capacitor $C_I$ and the second capacitor $C_P$. When the switch SW is turned off, the first capacitor $C_I$ is connected to neither the charge pump 130 nor a node where the control voltage $V_{CTRL}$ is generated. In other words, when the switch SW is turned off, an effect where the variable capacitor circuit 270 only includes the second capacitor $C_P$ is generated. Thus, the overall capacitance of the variable capacitor circuit 270 is the same as the capacitance of the second capacitor $C_P$. In other words, when the switch SW is turned on, the overall capacitance of the variable capacitor circuit 270 is increased. When the switch SW is turned off, the overall capacitance of the variable capacitor circuit 270 is decreased.

Figure 31:
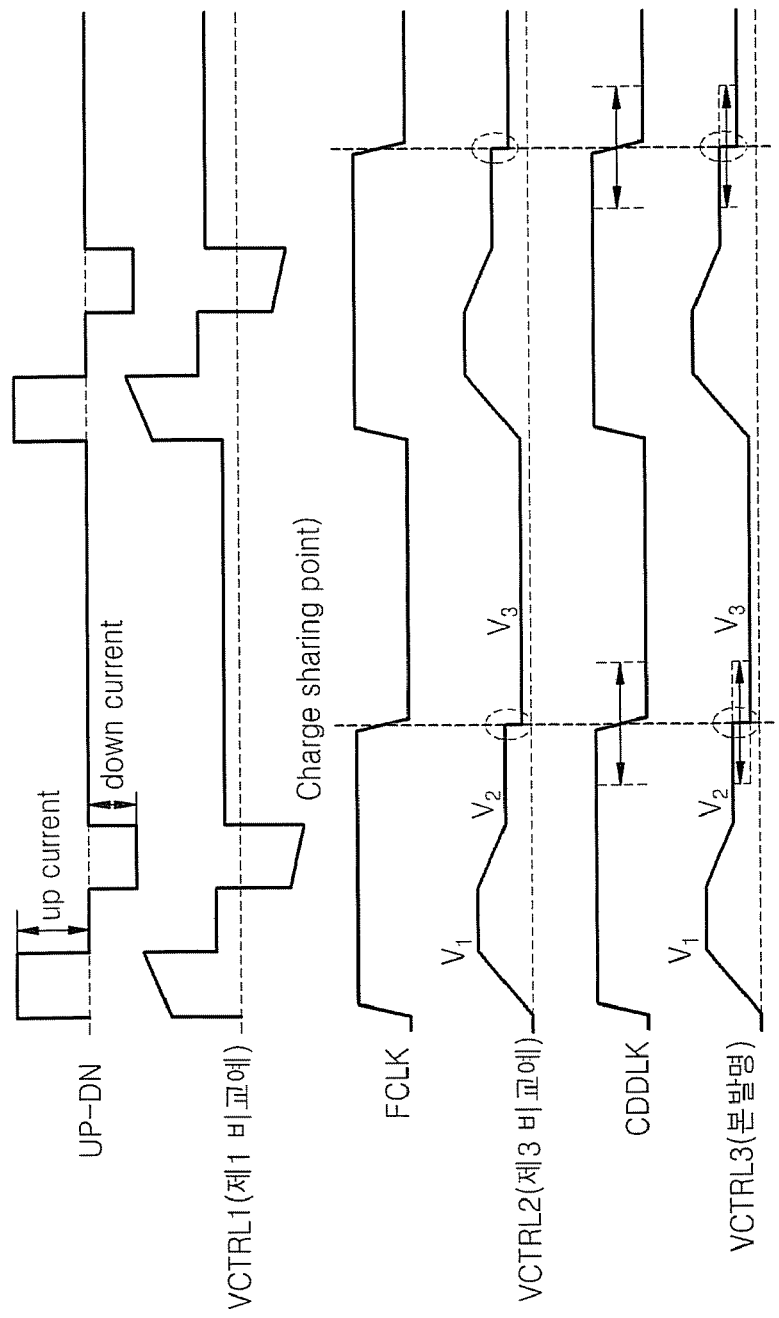
FIG. 31 is a timing diagram illustrating operations of the loop filter illustrated in FIGS. 30A and 30B.

FIG. 31 is a timing diagram illustrating operations of the loop filter illustrated in FIG. 30A.

A section (hereinafter, referred to as a first section) from when the up signal UP is received to when the down signal DN is received will now be described with reference to FIG.

31. In the first section, while the up signal UP is being received, the charge pump current $I_{CP}$ flows from the charge pump 130 to the loop filter. While neither the up signal UP nor the down signal DN is being received, the charge pump current $I_{CP}$ is not supplied from the charge pump 130 to the loop filter. Thereafter, while the down signal DN is being received, the charge pump current $I_{CP}$ flows out of the loop filter and enters the charge pump 130. In the first section, when the level of the timing control clock signal DCCLK transitions to logic LOW (for example, when the timing control clock signal DCCLK is inactivated), the switch SW is turned off. Thus, the second capacitor $C_P$ is charged by the charge pump current $I_{CP}$ while the up signal UP is being received, and then the charging of the second capacitor $C_P$ is stopped when reception of the up signal UP is stopped. Thereafter, while the down signal DN is being received, the second capacitor $C_P$ is discharged. Since the switch SW is turned off in the first section, the first capacitor $C_I$ is neither charged nor discharged. As the second capacitor $C_P$ is charged, the level of the control voltage $V_{CTRL}$ increases to level V1. Then, when the charging of the second capacitor $C_P$ is stopped, the level of the control voltage $V_{CTRL}$ is maintained at level V1. Thereafter, as the second capacitor $C_P$ is discharged, the level of the control voltage $V_{CTRL}$ decreases to level V2.

It is illustrated in FIG. 31 that the amplitude of the up signal UP is greater than that of the down signal DN. Accordingly, the charges filled in the second capacitor $C_P$ in response to the up signal UP are not all released from the second capacitor $C_P$ in response to the down signal DN. In other words, even after both the up signal UP and the down signal DN are received, the second capacitor $C_P$ stores some charges. However, this operation may be changed according to changes in the amplitudes of the up signal UP and the down signal DN and periods of time during which the up signal UP and the down signal DN are applied. Although a case where the loop filter of FIG. 30A receives both the up signal UP and the down signal DN has been described above, some embodiments of the present invention may be applied to a case where the loop filter of FIG. 30A receives only the up signal UP and a case where the loop filter of FIG. 30A receives only the down signal DN.

A timing when the timing control clock signal DCCLK transitions from the logic LOW level to the logic HIGH level will now be described. When the logic state of the timing control clock signal DCCLK transitions, the switch is turned on. Thus, the first capacitor $C_I$ and the second capacitor $C_P$ are connected in parallel to a node where the control voltage $V_{CTRL}$ is generated. As such, when the charge pump current $I_{CP}$ is not supplied and the first capacitor $C_I$ and the second capacitor $C_P$ are connected in parallel, some of the charges of the second capacitor $C_P$ are distributed to the first capacitor $C_I$. In other words, at a starting point of section C, charge sharing occurs between the first capacitor $C_I$ and the second capacitor $C_P$. In this case, the control voltage $V_{CTRL}$ is decreased. FIG. 31 illustrates a case where the level of the control voltage $V_{CTRL}$ decreases from level v2 to level V3.

In the loop filter of FIG. 30A, the timing when the logic state of the timing control clock signal DCCLK transitions is randomly determined. Accordingly, a timing when charges are shared between the first capacitor $C_I$ and the second capacitor $C_P$ is randomly determined. Thus, the duration when the level of the control voltage $V_{CTRL}$ is maintained high may be randomized, and thus the reference spur of the loop filter of FIG. 30A can be reduced. To achieve this process, the loop filter of FIG. 30A may only have to include a variable capacitor circuit. Thus, the variable capacitor circuit of FIG. 30A can effectively reduce reference spur even without including a complicate circuit structure.

Although the variable capacitor circuit 270 includes the switch SW, the first capacitor $C_I$, and the second capacitor $C_P$ in FIG. 30A, the variable capacitor circuit 270 may have other structures. In other words, the variable capacitor circuit 270 may be configured in other ways so long as the capacitance of the variable capacitor circuit 270 can vary according to the logic state of the timing control clock signal DCCLK.

In this case, in a section where the up signal UP is received, the variable capacitor circuit 270 is charged, and thus the control voltage $V_{CTRL}$ increases. In a section where the up signal UP is not received, the charging of the variable capacitor circuit 270 is stopped, and thus the level of the control voltage $V_{CTRL}$ is maintained without changes. When the timing control clock signal DCCLK transitions from logic LOW to logic HIGH, the capacitance of the variable capacitor circuit 270 is greater than the capacitance of the variable capacitor circuit 270 when the timing control clock signal DCCLK is logic LOW. Thus, even when the charge pump current $I_{CP}$ does not flow in the variable capacitor circuit 270, that is, the amount of charge of the variable capacitor circuit 270 does not change, the control voltage $V_{CTRL}$ is decreased.

Figure 30B:
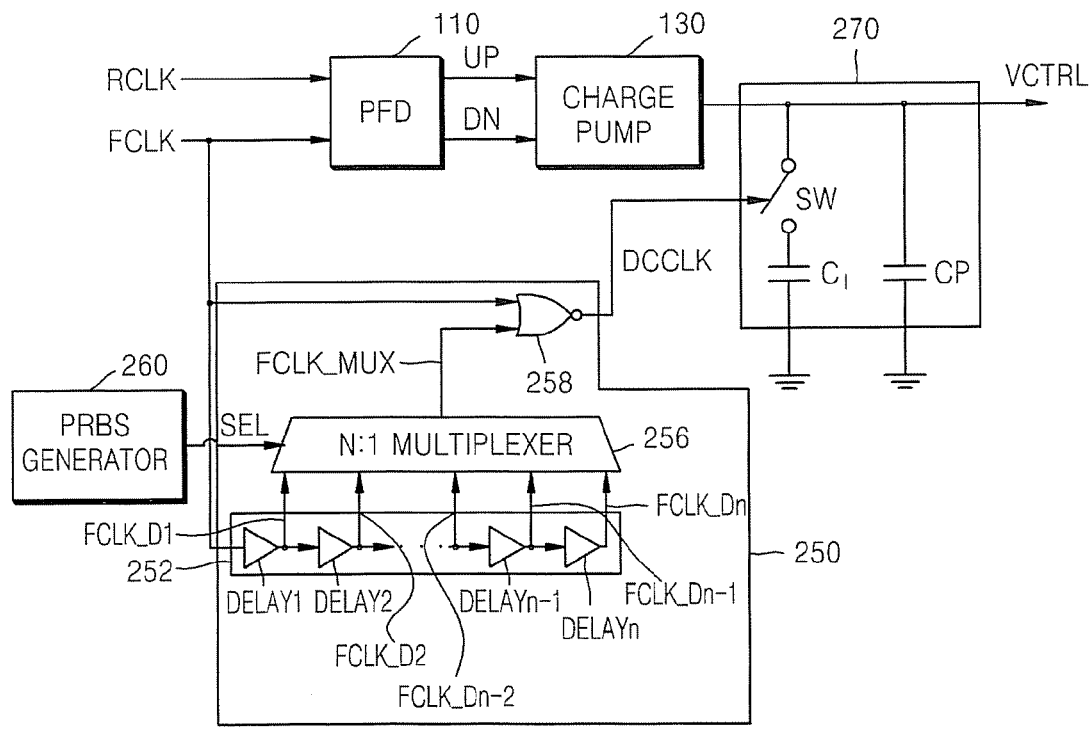
FIG. 30B illustrates, in greater detail, a clock timing control circuit of the loop filter illustrated in FIG. 30A.

FIG. 30B illustrates, in greater detail, the clock timing control circuit 250 of the loop filter illustrated in FIG. 30A.

Referring to FIG. 30B, the clock timing control circuit 250 includes a selection circuit 256. The selection circuit 256 randomly selects one of a plurality of clock signals FCLK_D1 through FCLK_Dn having different logic state transition timings and outputs the selected clock signal as the timing control clock signal DCCLK. The selection circuit 256 may be a N:1 multiplexer. In this case, the selection circuit 256 randomly selects one of n clock signals FCLK_D1 through FCLK_Dn. The clock signals FCLK_D1 through FCLK_Dn may be received from the delay circuit 252 as illustrated in FIG. 30B or from an external source.

The loop filter of FIGS. 30A and 30B may further include a random number generation circuit 260. In this case, the selection circuit 256 may randomly select one clock signal from the n clock signals FCLK_D1 through FCLK_Dn according to a selection signal randomly generated by the random number generation circuit 260. The random number generation circuit 260 may be a PRBS generator 260.

The clock timing control circuit 250 may further include a delay circuit 252. The delay circuit 252 generates the n clock signals FCLK_D1 through FCLK_Dn having different logic state transition timings. The delay circuit 252 may generate the n clock signals FCLK_D1 through FCLK_Dn having different logic state transition timings by delaying an input clock signal, namely, the feedback clock signal FCLK, by different delay time periods. The n clock signals FCLK_D1 through FCLK_Dn are transmitted to the selection circuit 256. Although the use of the feedback clock signal FCLK as the input clock signal is illustrated in FIG. 30B, the reference clock signal RCLK may be used as the input clock signal. Thus, although only an operation of using the feedback clock signal FCLK as the input clock signal will now be described, embodiments of the present invention is not limited thereto.

The delay circuit 252 may include a plurality of delayers DELAY1 through DELAYn which are serially connected to one another. The delayers DELAY1 through DELAYn generate the clock signals FCLK_D1 through FCLK_Dn by sequentially delaying the input clock signal FCLK. Accordingly, the clock signals FCLK_D1 through FCLK_Dn may have different logic state transition timings. For example, the first delayer DELAY1 generates a first delay clock signal FCLK_D1 by delaying the input clock signal FCLK by a first delay time period and transmits the first delay clock signal FCLK_D1 to the selection circuit 256 and the second delayer DELAY2. Delay time periods of the delayers DELAY1 through DELAYn may be the same or different.

The clock timing control circuit 250 may further include a logic operation circuit 258. The logic operation circuit 258 may perform a logic operation on the input clock signal FCLK and a randomly selected clock signal FCLK_MUX to generate the timing control clock signal DCCLK. For example, the logic operation circuit 258 may perform a NOR operation on the input clock signal FCLK and the randomly selected clock signal FCLK_MUX to generate the timing control clock signal DCCLK shown in FIG. 3. Of course, it will be understood by one of ordinary skill in the art that the NOR logic operation is just an example and the timing control clock signal DCCLK may be generated by other logic operations.

Although it has been described above that the selection circuit 256 of the clock timing control circuit 250 randomly selects one out of the clock signals FCLK_D1 through FCLK_Dn, the clock timing control circuit 250 may randomly determine a timing when the logic state of a received clock signal transitions and output a result of the determination as the timing control clock signal DCCLK. For example, the clock timing control circuit 250 may randomly advance or postpone the timing when the logic state of the input clock signal FCLK transitions, according to a value randomly generated by the PRBS generator 260.

Figure 32:
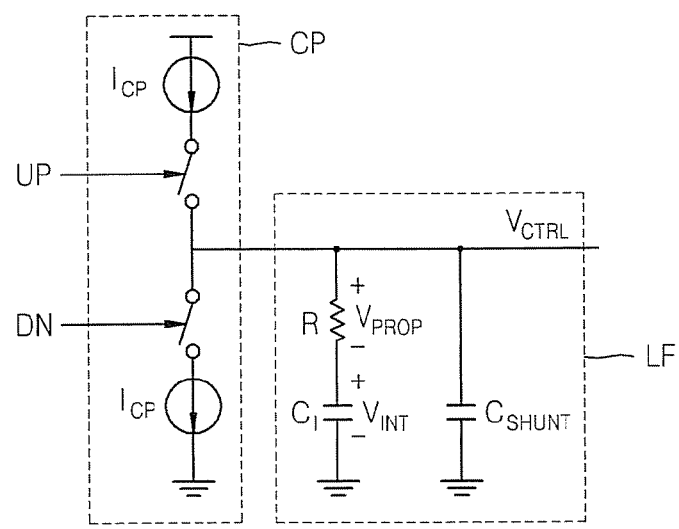
FIG. 32 is a circuit diagram of a loop filter according to some embodiments of the present invention.

FIG. 32 is a circuit diagram of a loop filter according to some embodiments of the present invention. For convenience of explanation, the charge pump 130 is also illustrated in FIG. 32.

Referring to FIG. 32, the loop filter 400 according to some embodiments of the present invention includes a resistor R and two capacitors $C_I$ and $C_{SHUNT}$. Compared with the loop filter of FIGS. 30A and 30B, the loop filter 400 according to some embodiments of the present invention of FIG. 23 includes the resistor R instead of the switch SW, and capacitance does not vary.

Figure 33A:
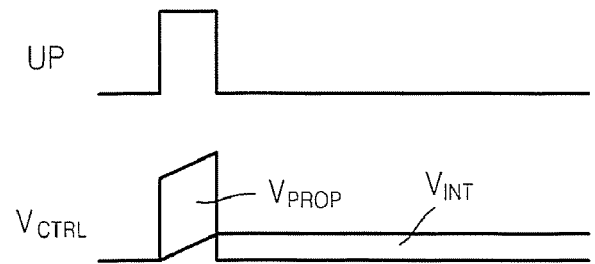
FIG. 33A is a timing diagram illustrating operations of the loop filter illustrated in FIG. 32.

FIG. 33A is a timing diagram illustrating operations of the loop filter 400 according to some embodiments of the present invention of FIG. 32.

Referring to FIG. 33A, while the up signal UP is being received, the charge pump current $I_{CP}$ flows into the loop filter 400. The charge pump current $I_{CP}$ allows a voltage $V_{PROP}$ to be applied to the resistor R and allows the capacitor $C_I$ to be charged. Thus, while the up signal UP is being received, the level of the control voltage $V_{CTRL}$ is a sum of the voltage $V_{PROP}$ applied to the resistor R and a voltage $V_{INT}$ of the capacitor $C_I$. While the up signal UP is being received, the voltage of the capacitor $C_I$ increases in proportion to the capacitance of the capacitor $C_I$. Next, when the reception of the up signal UP is stopped, no more voltage is applied to the resistor R, and the charge of the capacitor $C_I$ is maintained without any increase or decrease. Thus, the control voltage $V_{CTRL}$ is the voltage $V_{INT}$ of the capacitor $C_I$.

As described above, in the loop filter 400 according to some embodiments of the present invention of FIG. 32, while the up signal UP is being received, a high voltage, namely, the voltage $V_{PROP}$, is applied to the resistor R. This phenomenon is referred to as reference spur. However, in the loop filter according to some embodiments of the present invention of FIGS. 30A and 30B, charges provided by the charge pump current $I_{CP}$ are spread over the inactive section of the timing control clock signal DCCLK. Thus, a voltage applied to the loop filter according to some embodiments of the present invention of FIGS. 30A and 30B is less than a voltage applied to the loop filter 400 according to some embodiments of the present invention of FIG. 32. As a result, the loop filter according to some embodiments of the present invention of FIGS. 30A and 30B can reduce reference spur.

Figure 33B:
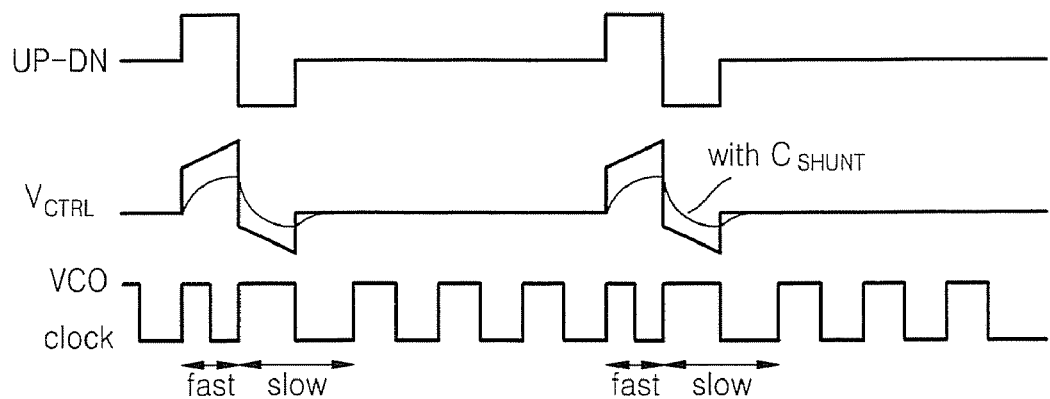
FIG. 33B is another timing diagram illustrating operations of the loop filter illustrated in FIG. 32.
Figure 33C:
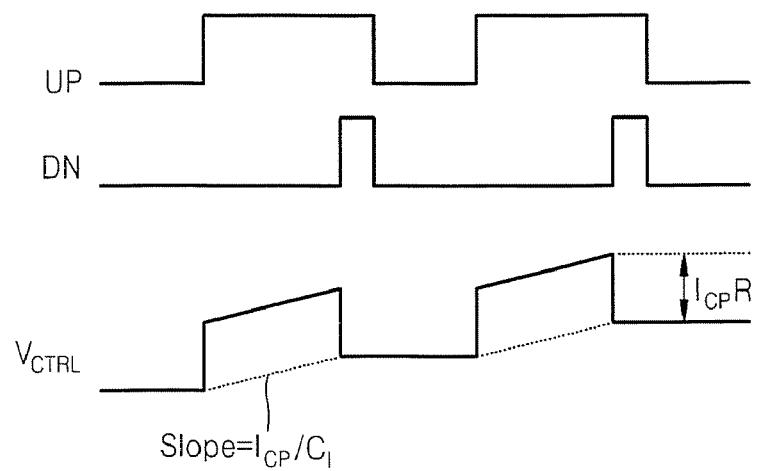
FIG. 33C is another timing diagram illustrating operations of the loop filter illustrated in FIG. 32.

FIG. 33B is another timing diagram illustrating operations of the loop filter 400 according to some embodiments of the present invention of FIG. 32.

Referring to FIG. 33B, when the loop filter 400 receives both the up signal UP and the down signal DN, the loop filter 400 according to some embodiments of the present invention of FIG. 32 repeats an operation in which the control voltage $V_{CTRL}$ increases and then decreases. A straight line of a second waveform of FIG. 33B indicates a variation in the control voltage $V_{CTRL}$ when the loop filter 400 of FIG. 32 includes only the first capacitor $C_I$, and a curved line of the second waveform indicates a variation in the control voltage $V_{CTRL}$ when the loop filter 400 of FIG. 32 includes both the first capacitor $C_I$ and the second capacitor $C_{SHUNT}$. If the loop filter 400 of FIG. 32 includes the second capacitor $C_{SHUNT}$, the number of ripples of the control voltage $V_{CTRL}$ decreases. However, in this case, reference spur in which a relatively high voltage is applied to the resistor R still exists.

Figure 34A:
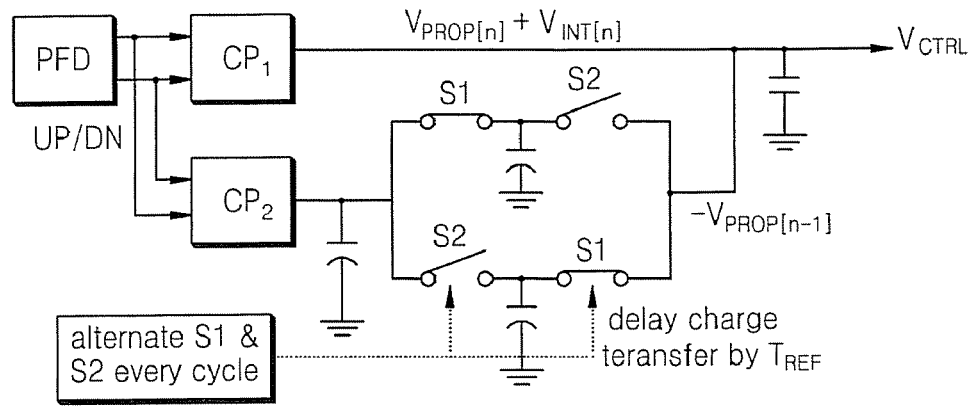
FIGS. 34A through 34C are circuit diagrams of a loop filter according to further embodiments of the present invention.
Figure 34B:
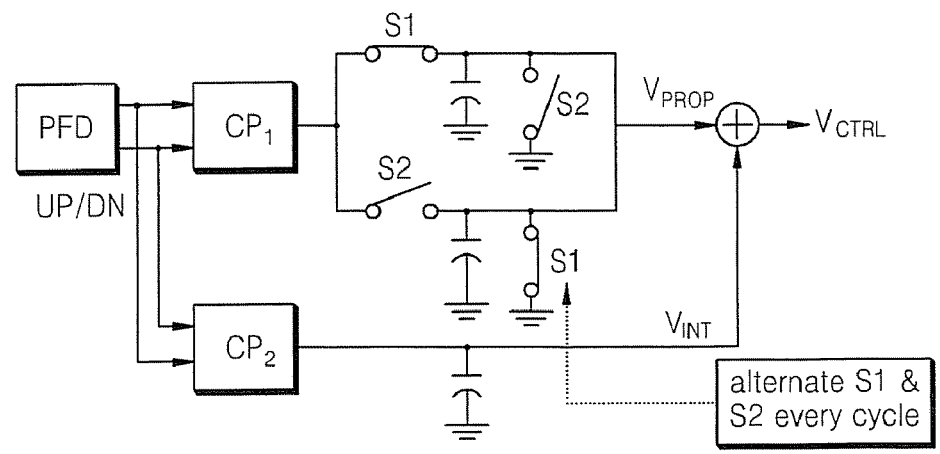
Figure 34C:
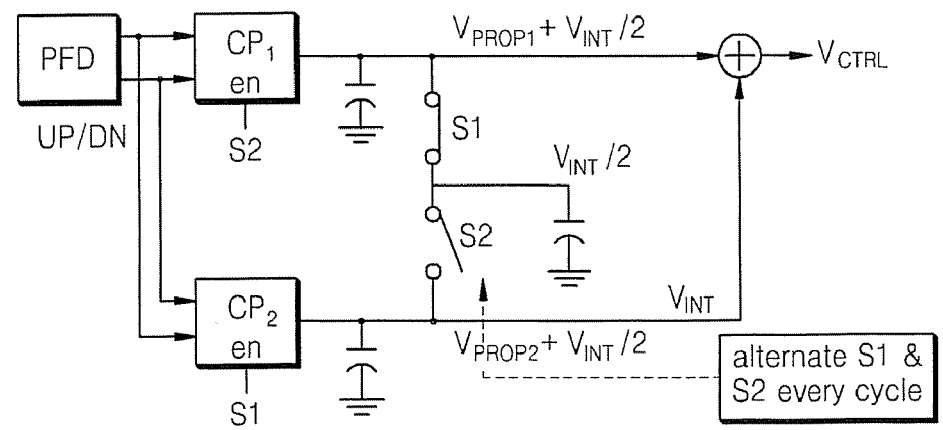

FIGS. 34A through 34C are circuit diagrams of a loop filter according to further embodiments of the present. For convenience of explanation, a PFD and charge pumps $CP_1$ and $CP_2$ are shown in FIGS. 34A through 34C.

Figure 35:
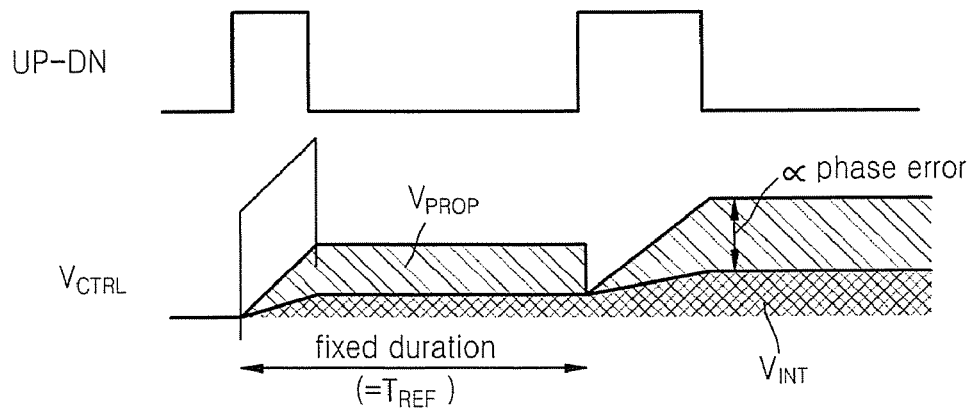
FIG. 35 is a timing diagram illustrating operations of the loop filter illustrated in FIGS. 34A through 34C.

FIG. 35 is a timing diagram illustrating operations of the loop filter illustrated in FIGS. 34A through 34C.

Referring to FIG. 35, in the loop filter of FIGS. 34A through 34C, charges provided by the charge pump current $I_{CP}$ flowing in according to the up signal UP are divided in a section where the up signal UP is not received. Thus, similar to the loop filter according to some embodiments of the present invention of FIGS. 30A and 30B, the loop filter according to some embodiments of the present invention of FIGS. 34A through 34C may reduce reference spur. However, to reduce the reference spur, as illustrated in FIGS. 34A through 34C, the loop filter according to the current comparative example need to include complicate circuits. However, the loop filter according to some embodiments of the present invention of FIGS. 30A and 30B may reduce reference spur while including only a variable capacitor circuit. Thus, compared with the loop filter according to some embodiments of the present invention of FIGS. 34A through 34C, the loop filter according to some embodiments of the present invention of FIGS. 30A and 30B may effectively reduce reference spur even without including a complicate circuit structure.

Figure 36:
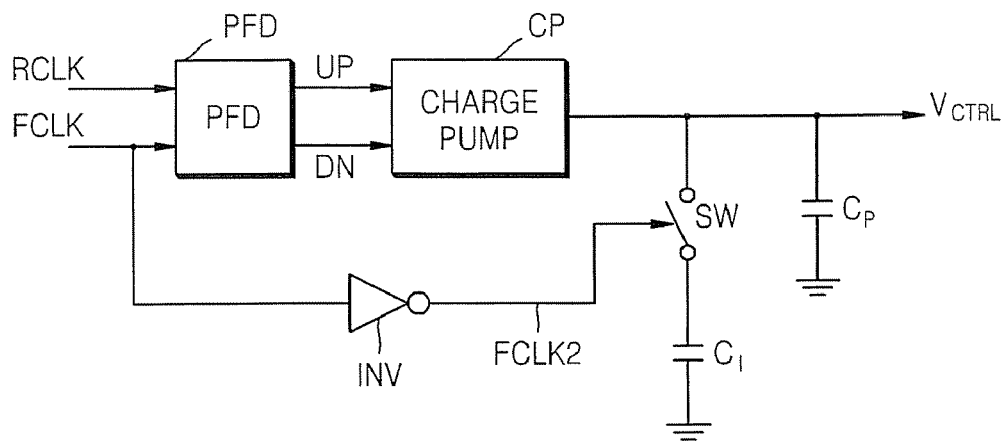
FIG. 36 is a circuit diagram of a loop filter according to further embodiments of the present invention.

FIG. 36 is a circuit diagram of a loop filter according to further embodiments of the present invention. For convenience of explanation, the PFD 110 and the charge pump 130 are also shown in FIG. 36.

Referring to FIG. 36, the loop filter according to further embodiments of the present invention inverts the feedback clock signal FCLK to generate a delayed clock signal FCLK2 for controlling a turn on-off moment of the switch SW. Thus, a duty cycle of the delayed clock signal FCLK2 is the same as a duty cycle of the feedback clock signal FCLK.

Figure 37A:
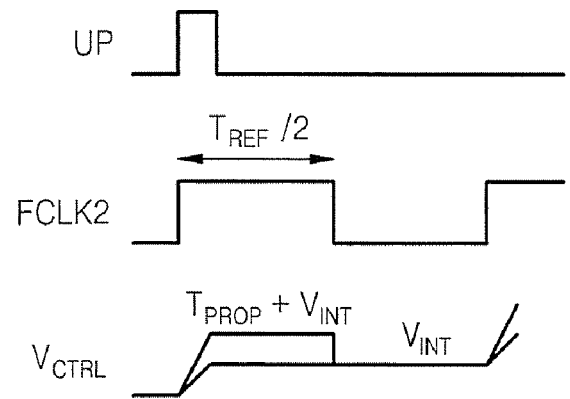
FIG. 37A is a timing diagram illustrating operations of the loop filter illustrated in FIG. 36.

FIG. 37A is a timing diagram illustrating operations of the loop filter according to some embodiments of the present invention illustrated in FIG. 36.

Referring to FIG. 37A, each of an inactive section and an active section of the delayed clock signal FCLK2 is half the cycle of the delayed clock signal FCLK2. In other words, the inactive section and the active section of the delayed clock signal FCLK2 has the same length. Thus, in the loop filter according to some embodiments of the present invention of FIG. 36, the amount of charge provided by the charge pump current flowing in according to the up signal UP is distributed to the first capacitor $C_I$ and the second capacitor $C_P$ during a half of the cycle of the delayed clock signal FCLK2. However, in the loop filter according to some embodiments of the present invention of FIGS. 30A and 30B, charges provided by the charge pump current are distributed to and stored in the first and second capacitors $C_I$ and $C_P$ over the inactive section of the timing control clock signal DCCLK. Here, the inactive section of the timing control clock signal DCCLK is controlled to be longer than the active section thereof.

Thus, the time during which charges provided by the charge pump current in the loop filter according to some embodiments of the present invention of FIG. 36 are distributed and stored is longer than the time during which charges provided by the charge pump current in the loop filter according to some embodiments of the present invention of FIGS. 30A and 30B are distributed and stored. Accordingly, the loop filter according to some embodiments of the present invention of FIGS. 30A and 30B may reduce reference spur as compared with the loop filter according to some embodiments of the present invention of FIG. 36.

Figure 37B:
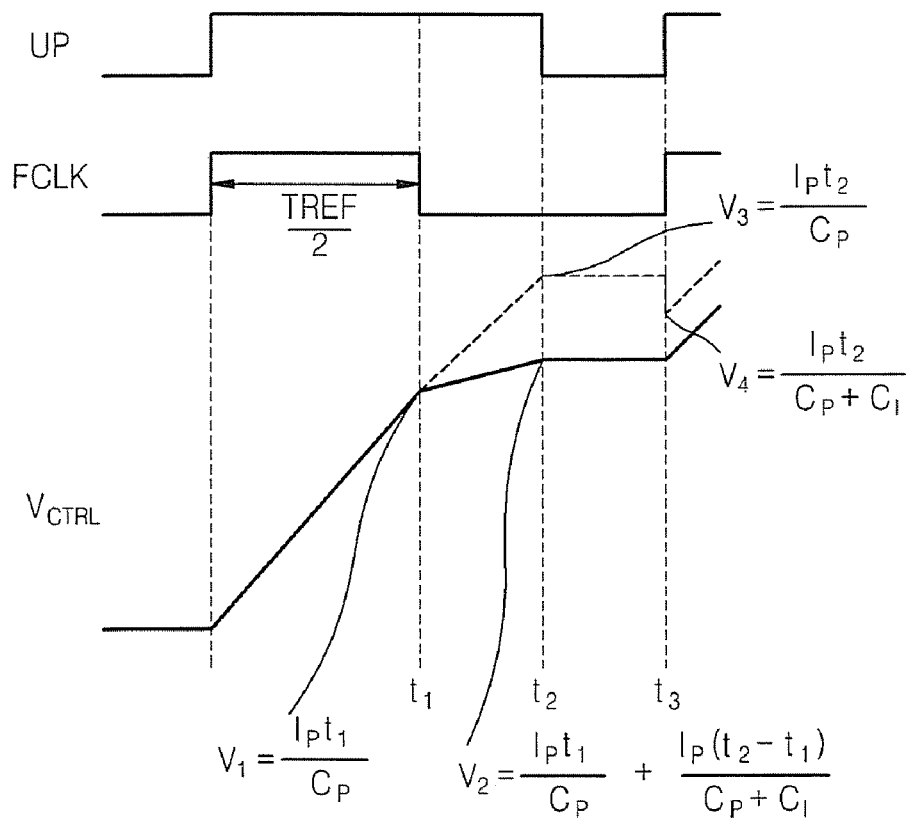
FIG. 37B is another timing diagram illustrating operations of the loop filter illustrated in FIG. 36.

FIG. 37B is another timing diagram illustrating operations of the loop filter according to some embodiments of the present invention illustrated in FIG. 36.

FIG. 37B illustrates a situation where the up signal UP is supplied for a period of time longer than half the cycle of the feedback clock signal FCLK. In this case, even after the feedback clock signal FCLK is inactivated, the up signal UP is continuously supplied. In a section between time points t1 and t2, charges provided by the charge pump current are distributed to and stored in the first and second capacitors $C_I$ and $C_P$, and thus an increasing rate of the control voltage $V_{CTRL}$ slows down. A dotted line of FIG. 37B indicates a case where charges provided by the charge pump current are filled in only the second capacitor $C_P$, and a solid line of FIG. 37B indicates a case where charges provided by the charge pump current are distributed to and stored in the first and second capacitors $C_I$ and $C_P$. As illustrated in the dotted line of FIG. 37B, when the increasing rate of the control voltage $V_{CTRL}$ slows down, the control voltage $V_{CTRL}$ is proportional to a period of time during which the up signal UP is supplied, and thus the control voltage $V_{CTRL}$ fails to properly express the up signal UP. However, the loop filter according to some embodiments of the present invention of FIGS. 30A and 30B may delay a point in time when the timing control clock signal DCCLK is activated to a point in time after the supply of the up signal UP is stopped. In the loop filter according to some embodiments of the present invention of FIGS. 30A and 30B, charges are filled in only the second capacitor $C_P$ before the timing control clock signal DCCLK is activated, and charges filled in the second capacitor $C_P$ are shared by the first and second capacitors $C_I$ and $C_P$ after the timing control clock signal DCCLK is activated. Thus, while the up signal UP is being supplied, the loop filter according to some embodiments of the present invention of FIGS. 30A and 30B increase the control voltage $V_{CTRL}$ in proportion to the duration of the supply of the up signal UP. When the supply of the up signal UP is stopped, the loop filter according to some embodiments of the present invention of FIGS. 30A and 30B activates the timing control clock signal DCCLK and reduces the control voltage $V_{CTRL}$.

Figure 38:
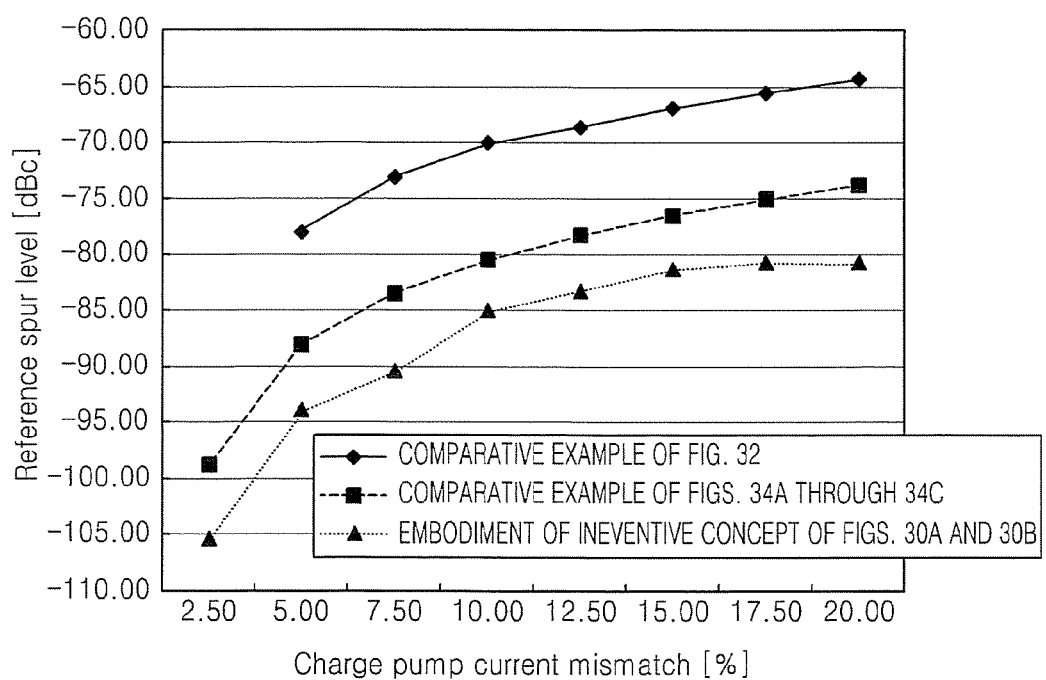
FIG. 38 is a graph illustrating a reference spur level of the loop filter according to some embodiments of the present invention illustrated in FIGS. 30A and 30B and reference spur levels of the loop filters according to the three comparative examples illustrated in FIGS. 32, 34A-34C, and 36.

FIG. 38 is a graph illustrating a reference spur level of the loop filter according to some embodiments of the present invention illustrated in FIGS. 30A and 30B and reference spur levels of the loop filters according to some embodiments of the present inventions illustrated in FIGS. 32 and 36.

Referring to FIG. 38, the reference spur level of the loop filter according to some embodiments of the present invention illustrated in FIGS. 30A and 30B is lower than the reference spur levels of the loop filters according to some embodiments of the present inventions illustrated in FIGS. 32 and 36.

Methods of operating the loop filter according to some embodiments of the present invention illustrated in FIGS. 30A and 30B is methods of operating a loop filter including a first capacitor and a second capacitor.

Methods of operating the loop filter according to some embodiments of the present invention illustrated in FIGS. 30A and 30B includes the operations of: charging the second capacitor $C_P$ with charges provided by the charge pump current $I_{CP}$; and distributing some of the charges of the second capacitor $C_P$ to the first capacitor $C_I$. The timing when the first capacitor $C_I$ and the second capacitor $C_P$ share charges is randomly determined. Thus, in methods of operating the loop filter according to some embodiments of the present invention illustrated in FIGS. 30A and 30B, a timing when the level of the control voltage $V_{CTRL}$ is lowered may be randomly determined. In this case, since the duration when the level of the control voltage $V_{CTRL}$ is maintained high is randomly determined, reference spur may be reduced.

The operation of distributing some of the charges of the second capacitor $C_P$ to the first capacitor $C_I$ may be performed after inflow of the charge pump current $I_{CP}$ is stopped.

Methods of operating the loop filter according to some embodiments of the present invention illustrated in FIGS. 30A and 30B may further include an operation of generating the timing control clock signal DCCLK of which logic state transition timing is randomly determined. In this case, in the operation of charging the second capacitor $C_P$, the second capacitor $C_P$ may be charged by the input current $I_{CP}$ supplied in the inactive section of the timing control clock signal DCCLK. In the operation of distributing some of the charges of the second capacitor $C_P$, charge sharing between the first and second capacitors $C_I$ and $C_P$ occurs when the timing control clock signal DCCLK is activated. In other words, the timing when charge sharing occurs between the first and second capacitors $C_I$ and $C_P$ may be randomly determined by using the timing control clock signal DCCLK of which logic state transition timing is randomly determined.

While the present invention has been particularly shown and described with reference to exemplary embodiments thereof, it will be understood that various changes in form and details may be made therein without departing from the spirit and scope of the following claims.

What is claimed is:

1. A loop filter comprising:
    a duty control circuit configured to generate a duty control clock signal with an asymmetric duty cycle, wherein the duty control circuit comprises:
        a delay circuit configured to receive an input clock signal and to generate a delayed clock signal therefrom; and
        a logic circuit configured to generate the duty control clock signal from a logical combination of the input clock signal and the delayed clock signal;
    a switch configured to operate responsive to the duty control clock signal;
    a first capacitor connected to an output of a charge pump and in series with the switch; and
    a second capacitor connected in parallel with the switch and the first capacitor that are connected in series.

2. The loop filter of claim 1, wherein the switch is configured to be turned off during an inactive section of a period of the duty control clock signal, and wherein the inactive section is longer than half of the period of the duty control clock signal and shorter than the period of the duty control clock signal.

3. The loop filter of claim 1, wherein the switch is configured to turn on responsive to an active section of a period of the duty control clock signal and to turn off responsive to an inactive section of the period of the duty control clock signal.

4. The loop filter of claim 1, further comprising a random number generator circuit, and wherein the delay circuit is configured to vary a delay of the delayed clock signal responsive to random values generated by the random number generator.

5. The loop filter of claim 1, wherein the delay circuit is configured to provide a fixed delay.

6. A loop filter comprising:
   a duty control circuit configured to generate a duty control clock signal with an asymmetric duty cycle;
   a switch configured to operate responsive to the duty control clock signal;
   a first capacitor connected to an output of a charge pump and in series with the switch;
   a second capacitor connected in parallel with the switch and the first capacitor that are connected in series; and
   a random number generator circuit, wherein the a duty control circuit is further configured to vary the duty cycle of the duty control clock signal responsive to random values generated by the random number generator circuit.

7. A loop filter comprising:
   a duty control circuit configured receive an input clock signal and to generate a duty control clock signal responsive thereto, wherein an active section of a period of the duty control clock signal is shorter than an inactive section of the period of the duty control clock signal;
   a switch configured to operate responsive to the duty control clock signal;
   a first capacitor connected in series with the switch and configured to be charged by an input current from a charge pump when the switch is on; and
   a second capacitor configured to be charged by the input current and connected in parallel with the switch and the first capacitor that are connected in series; and
   a random number generator circuit, and wherein the duty control circuit is further configured to vary the durations of the inactive section and the active section responsive to random values generated by the random number generator.

8. The loop filter of claim 7, wherein the duty control circuit is configured to vary durations of the inactive section and the active section responsive to a frequency of the input clock signal.

9. A phase locked loop comprising:
   a phase-frequency detector configured to compare a phase and/or a frequency of a reference clock signal with a phase and/or a frequency of a feedback clock signal;
   a charge pump configured to generate a charge pump current responsive to the comparison;
   a loop filter configured to generate a control voltage responsive to the charge pump current;
   a voltage-controlled oscillator (VCO) configured to generate the feedback clock signal responsive to the control voltage; and
   a random number generator circuit,
   wherein the loop filter comprises:
      a duty control circuit generate a duty control signal responsive to the reference clock signal, a duty of the duty control signal varying responsive to a frequency of the reference clock signal and/or the feedback clock signal; and
      a variable capacitor circuit configured to receive the charge pump current and having a capacitance that varies responsive to the duty control clock signal, wherein the duty control circuit is further configured to vary the duty cycle of the duty control clock signal responsive to random values generated by the random number generator.

10. The phase locked loop of claim 9, wherein the variable capacitor circuit comprises:
    a switch configured to operate responsive to the duty control clock signal;
    a first capacitor connected in series with the switch and configured to be charged by the charge pump current when the switch is turned on; and
    a second capacitor connected in parallel with the switch and the first capacitor.

11. A method of operating loop filter that receives an input current from a charge pump, the method comprising:
    charging a first capacitor with the input current;
    intermittently connecting a second capacitor in parallel with the first capacitor at a rate that varies responsive to a duty cycle of duty control clock signal; and
    providing a voltage across the first capacitor to a voltage-controlled oscillator.

12. The method of claim 11, wherein intermittently connecting a second capacitor in parallel with the first capacitor at a rate that varies responsive to a duty cycle of duty control clock signal comprises:
    connecting the second capacitor in parallel with the first capacitor duty during an active section of a period of the duty control clock signal; and
    disconnecting the second capacitor from the first capacitor during an inactive section of the period of the duty control clock signal.

13. The method of claim 11, further comprising varying the duty cycle of the duty control clock signal responsive to a frequency of a clock signal.

14. The method of claim 11, further comprising:
    generating random values using a random number generator; and
    varying the duty cycle of the duty control clock signal responsive to the random values.

* * * * *